United States Patent
Yamazaki

(10) Patent No.: US 9,905,703 B2
(45) Date of Patent: Feb. 27, 2018

(54) METHOD FOR MANUFACTURING SEMICONDUCTOR DEVICE

(71) Applicant: Semiconductor Energy Laboratory Co., Ltd., Atsugi-shi, Kanagawa-ken (JP)

(72) Inventor: Shunpei Yamazaki, Tokyo (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 0 days.

(21) Appl. No.: 15/150,509

(22) Filed: May 10, 2016

(65) Prior Publication Data

US 2016/0254387 A1    Sep. 1, 2016

Related U.S. Application Data

(63) Continuation of application No. 14/094,293, filed on Dec. 2, 2013, now Pat. No. 9,349,593.

(30) Foreign Application Priority Data

Dec. 3, 2012 (JP) ................................ 2012-264592

(51) Int. Cl.
*H01L 29/786* (2006.01)
*H01L 21/02* (2006.01)

(52) U.S. Cl.
CPC .... *H01L 29/7869* (2013.01); *H01L 21/02488* (2013.01); *H01L 21/02554* (2013.01);
(Continued)

(58) Field of Classification Search
None
See application file for complete search history.

(56) References Cited

U.S. PATENT DOCUMENTS 5,731,856 A    3/1998 Kim et al.
5,744,864 A    4/1998 Cillessen et al.
(Continued)

FOREIGN PATENT DOCUMENTS

EP    1737044 A    12/2006
EP    2226847 A    9/2010
(Continued)

OTHER PUBLICATIONS

Park.J et al., "High-performance amorphous gallium indium zinc oxide thin-film transistors through N2O plasma passivation", Appl. Phys. Lett. (Applied Physics Letters) , Aug. 7, 2008, vol. 93, pp. 053505-1-053505-3.
(Continued)

*Primary Examiner* — Angel Roman
(74) *Attorney, Agent, or Firm* — Fish & Richardson P.C.

(57) ABSTRACT

To improve electric characteristics of a semiconductor device including an oxide semiconductor. Alternatively, to improve reliability of a semiconductor device including an oxide semiconductor. In a transistor including a first oxide film, an oxide semiconductor film, a pair of electrodes in contact with the oxide semiconductor film, and a second oxide film in contact with the oxide semiconductor film and the pair of electrodes, oxygen is added to the first oxide film and the second oxide film in contact with the oxide semiconductor film and the pair of electrodes, so that oxygen vacancies are reduced. The oxygen is diffused to the oxide semiconductor film by heat treatment or the like; thus, oxygen vacancies in the oxide semiconductor film are reduced.

16 Claims, 34 Drawing Sheets

(52) U.S. Cl.
  CPC .. *H01L 21/02565* (2013.01); *H01L 21/02658* (2013.01); *H01L 29/78618* (2013.01); *H01L 29/78696* (2013.01)

(56) References Cited

U.S. PATENT DOCUMENTS

| | | |
|---|---|---|
| 6,294,274 B1 | 9/2001 | Kawazoe et al. |
| 6,563,174 B2 | 5/2003 | Kawasaki et al. |
| 6,727,522 B1 | 4/2004 | Kawasaki et al. |
| 7,049,190 B2 | 5/2006 | Takeda et al. |
| 7,061,014 B2 | 6/2006 | Hosono et al. |
| 7,064,346 B2 | 6/2006 | Kawasaki et al. |
| 7,105,868 B2 | 9/2006 | Nause et al. |
| 7,211,825 B2 | 5/2007 | Shih et al |
| 7,282,782 B2 | 10/2007 | Hoffman et al. |
| 7,297,977 B2 | 11/2007 | Hoffman et al. |
| 7,323,356 B2 | 1/2008 | Hosono et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,674,650 B2 | 3/2010 | Akimoto et al. |
| 7,732,819 B2 | 6/2010 | Akimoto et al. |
| 7,767,505 B2 | 8/2010 | Son et al. |
| 8,502,221 B2 | 8/2013 | Yamazaki |
| 8,669,556 B2 | 3/2014 | Yamazaki et al. |
| 8,680,522 B2 | 3/2014 | Yamazaki et al. |
| 8,748,881 B2 | 6/2014 | Yamazaki |
| 8,779,420 B2 | 7/2014 | Yamazaki |
| 8,865,534 B2 | 10/2014 | Yamazaki |
| 8,865,555 B2 | 10/2014 | Yamazaki et al. |
| 8,878,173 B2 | 11/2014 | Yamazaki |
| 8,945,982 B2 | 2/2015 | Yamazaki |
| 8,994,021 B2 | 3/2015 | Yamazaki et al. |
| 9,059,295 B2 | 6/2015 | Yamazaki |
| 9,147,754 B2 * | 9/2015 | Yamazaki ......... H01L 21/02321 |
| 9,214,520 B2 | 12/2015 | Yamazaki |
| 9,318,613 B2 | 4/2016 | Yamazaki |
| 9,331,208 B2 | 5/2016 | Yamazaki et al. |
| 9,390,918 B2 | 7/2016 | Yamazaki |
| 9,449,991 B2 | 9/2016 | Yamazaki |
| 9,711,655 B2 | 7/2017 | Yamazaki et al. |
| 2001/0046027 A1 | 11/2001 | Tai et al. |
| 2002/0056838 A1 | 5/2002 | Ogawa |
| 2002/0132454 A1 | 9/2002 | Ohtsu et al. |
| 2003/0189401 A1 | 10/2003 | Kido et al. |
| 2003/0218222 A1 | 11/2003 | Wager, III et al. |
| 2004/0038446 A1 | 2/2004 | Takeda et al. |
| 2004/0127038 A1 | 7/2004 | Carcia et al. |
| 2005/0017302 A1 | 1/2005 | Hoffman |
| 2005/0199959 A1 | 9/2005 | Chiang et al. |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0142887 A1 | 6/2009 | Son et al. |
| 2009/0152506 A1 | 6/2009 | Umeda et al. |
| 2009/0152541 A1 | 6/2009 | Maekawa et al. |
| 2009/0278122 A1 | 11/2009 | Hosono et al. |
| 2009/0280600 A1 | 11/2009 | Hosono et al. |
| 2010/0025678 A1 | 2/2010 | Yamazaki et al. |
| 2010/0051940 A1 | 3/2010 | Yamazaki et al. |
| 2010/0065844 A1 | 3/2010 | Tokunaga |
| 2010/0092800 A1 | 4/2010 | Itagaki et al. |
| 2010/0109002 A1 | 5/2010 | Itagaki et al. |
| 2011/0127523 A1 | 6/2011 | Yamazaki |
| 2011/0240991 A1 | 10/2011 | Yamazaki |
| 2011/0263084 A1 | 10/2011 | Yamazaki |
| 2011/0263091 A1 * | 10/2011 | Yamazaki ........... H01L 27/1225 438/287 |
| 2012/0241736 A1 | 9/2012 | Imoto et al. |
| 2012/0241737 A1 | 9/2012 | Imoto et al. |
| 2012/0241738 A1 | 9/2012 | Imoto et al. |
| 2012/0244659 A1 | 9/2012 | Imoto et al. |
| 2012/0319114 A1 | 12/2012 | Yamazaki et al. |
| 2013/0009209 A1 | 1/2013 | Yamazaki |
| 2013/0087785 A1 * | 4/2013 | Akimoto ............. H01L 27/1225 257/43 |
| 2013/0092929 A1 | 4/2013 | Okazaki et al. |
| 2013/0270549 A1 | 10/2013 | Okazaki et al. |
| 2013/0270552 A1 | 10/2013 | Yamazaki et al. |
| 2013/0285046 A1 | 10/2013 | Yamazaki |
| 2013/0334533 A1 | 12/2013 | Yamazaki |
| 2014/0001467 A1 | 1/2014 | Yamazaki et al. |
| 2014/0008647 A1 | 1/2014 | Yamazaki |
| 2014/0034946 A1 | 2/2014 | Yamazaki et al. |
| 2014/0042433 A1 | 2/2014 | Yamazaki |
| 2014/0042438 A1 | 2/2014 | Yamazaki |
| 2014/0077205 A1 | 3/2014 | Yamazaki et al. |
| 2014/0103337 A1 | 4/2014 | Yamazaki et al. |
| 2014/0103346 A1 | 4/2014 | Yamazaki |
| 2014/0110706 A1 | 4/2014 | Yamazaki |
| 2014/0110707 A1 | 4/2014 | Koezuka et al. |
| 2014/0151688 A1 * | 6/2014 | Yamazaki ........... H01L 29/7869 257/43 |
| 2015/0008430 A1 | 1/2015 | Yamazaki et al. |
| 2015/0311347 A1 | 10/2015 | Yamazaki |

(56) References Cited

U.S. PATENT DOCUMENTS

| | | |
|---|---|---|
| 2016/0163871 A1 | 6/2016 | Yamazaki |
| 2016/0225908 A1 | 8/2016 | Yamazaki |
| 2016/0322506 A1 | 11/2016 | Yamazaki |
| 2017/0309754 A1 | 10/2017 | Yamazaki et al. |

FOREIGN PATENT DOCUMENTS

| | | |
|---|---|---|
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 08-264794 A | 10/1996 |
| JP | 11-505377 | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2007-096055 A | 4/2007 |
| JP | 2007-123861 A | 5/2007 |
| JP | 2011-135063 A | 7/2011 |
| JP | 2011-228689 A | 11/2011 |
| JP | 2011-228695 A | 11/2011 |
| JP | 2011-243971 A | 12/2011 |
| JP | 2011-243973 A | 12/2011 |
| JP | 2012-033908 A | 2/2012 |
| JP | 2012-134475 A | 7/2012 |
| JP | 2012-169606 A | 9/2012 |
| WO | WO-2004/114391 | 12/2004 |
| WO | WO-2011/065243 | 6/2011 |
| WO | WO-2011/122363 | 10/2011 |
| WO | WO-2011/122364 | 10/2011 |
| WO | WO-2011/132556 | 10/2011 |
| WO | WO-2011/132625 | 10/2011 |
| WO | WO-2011/002292 | 1/2012 |
| WO | WO-2012/073844 | 6/2012 |

OTHER PUBLICATIONS

Asakuma.N et al., "Crystallization and Reduction of Sol-Gel-Derived Zinc Oxide Films by Irradiation With Ultraviolet Lamp", Journal of Sol-Gel Science and Technology, 2003, vol. 26, pp. 181-184.

Asaoka.Y et al., "29.1:Polarizer-Free Reflective LCD Combined With Ultra Low-Power Driving Technology", SID Digest '09 : SID International Symposium Digest of Technical Papers, May 31, 2009, pp. 395-398.

Chern.H et al., "An Analytical Model for the Above-Threshold Characteristics of Polysilicon Thin-Film Transistors", IEEE Transactions on Electron Devices, Jul. 1, 1995, vol. 42, No. 7, pp. 1240-1246.

Cho.D et al., "21.2:Al and Sn-Doped Zinc Indium Oxide Thin Film Transistors for AMOLED Back Plane", SID Digest '09 : SID International Symposium Digest of Technical Papers, May 31, 2009, pp. 280-283.

Clark.S et al., "First Principles Methods Using CASTEP", Zeitschrift fur Kristallographie, 2005, vol. 220, pp. 567-270.

Coates.D et al., "Optical Studies of the Amorphous Liquid-Cholesteric Liquid Crystal Transition:The "Blue Phase"", Physics Letters, Sep. 10, 1973, vol. 45A, No. 2, pp. 115-116.

Costello.M et al., "Electron Microscopy of a Cholesteric Liquid Crystal and Its Blue Phase", Phys. Rev. A (Physical Review. A), May 1, 1984, vol. 29, No. 5, pp. 2957-2959.

Dembo.H et al., "RFCPUS on Glass and Plastic Substrates Fabricated by TFT Transfer Technology", IEDM 05: Technical Digest of International Electron Devices Meeting, Dec. 5, 2005, pp. 1067-1069.

Fortunato.E et al., "Wide-Bandgap High-Mobility ZnO Thin-Film Transistors Produced at Room Temperature", Appl. Phys. Lett. (Applied Physics Letters) , Sep. 27, 2004, vol. 85, No. 13, pp. 2541-2543.

Fung.T et al., "2-D Numerical Simulation of High Performance Amorphous In—Ga—Zn—O TFTs for Flat Panel Displays", AM-FPD '08 Digest of Technical Papers, Jul. 2, 2008, pp. 251-252, The Japan Society of Applied Physics.

Godo.H et al., "P-9:Numerical Analysis on Temperature Dependence of Characteristics of Amorphous In-Ga-Zn-Oxide TFT", SID Digest '09 : SID International Symposium Digest of Technical Papers, May 31, 2009, pp. 1110-1112.

Godo.H et al., "Temperature Dependence of Characteristics and Electronic Structure for Amorphous In-Ga-Zn-Oxide TFT", AM-FPD '09 Digest of Technical Papers, Jul. 1, 2009, pp. 41-44.

Hayashi.R et al., "42.1: Invited Paper: Improved Amorphous In—Ga—Zn—O TFTS", SID Digest '08 : SID International Symposium Digest of Technical Papers, May 20, 2008, vol. 39, pp. 621-624.

Hirao.T et al., "Novel Top-Gate Zinc Oxide Thin-Film Transistors (ZnO TFTS) for AMLCDS", J. Soc. Inf. Display (Journal of the Society for Information Display), 2007, vol. 15, No. 1, pp. 17-22.

Hosono.H et al., "Working hypothesis to explore novel wide band gap electrically conducting amorphous oxides and examples", J. Non-Cryst. Solids (Journal of Non-Crystalline Solids), 1996, vol. 198-200, pp. 165-169.

Hosono.H, "68.3:Invited Paper:Transparent Amorphous Oxide Semiconductors for High Performance TFT", SID Digest '07 : SID International Symposium Digest of Technical Papers, 2007, vol. 38, pp. 1830-1833.

Hsieh.H et al., "P-29:Modeling of Amorphous Oxide Semiconductor Thin Film Transistors and Subgap Density of States", SID Digest '08 : SID International Symposium Digest of Technical Papers, May 20, 2008, vol. 39, pp. 1277-1280.

Ikeda.T et al., "Full-Functional System Liquid Crystal Display Using CG-Silicon Technology", SID Digest '04 : SID International Symposium Digest of Technical Papers, 2004, vol. 35, pp. 860-863.

Janotti.A et al., "Native Point Defects in ZnO", Phys. Rev. B (Physical Review. B), Oct. 4, 2007, vol. 76, No. 16, pp. 165202-1-165202-22.

Janotti.A et al., "Oxygen Vacancies in ZnO", Appl. Phys. Lett. (Applied Physics Letters) , 2005, vol. 87, pp. 122102-1-122102-3.

Jeong.J et al., "3.1: Distinguished Paper: 12.1-Inch WXGA AMOLED Display Driven by Indium-Gallium-Zinc Oxide TFTs Array", SID Digest '08 : SID International Symposium Digest of Technical Papers, May 20, 2008, vol. 39, No. 1, pp. 1-4.

Jin.D et al., "65.2:Distinguished Paper:World-Largest (6.5") Flexible Full Color Top Emission AMOLED Display on Plastic Film and Its Bending Properties", SID Digest '09 : SID International Symposium Digest of Technical Papers, May 31, 2009, pp. 983-985.

Kanno.H et al., "White Stacked Electrophosphorecent Organic Light-Emitting Devices Employing MOO3 as a Charge-Generation Layer", Adv. Mater. (Advanced Materials), 2006, vol. 18, No. 3, pp. 339-342.

Kikuchi.H et al., "39.1:Invited Paper:Optically Isotropic Nano-Structured Liquid Crystal Composites for Display Applications", SID Digest '09 : SID International Symposium Digest of Technical Papers, May 31, 2009, pp. 578-581.

Kikuchi.H et al., "62.2:Invited Paper:Fast Electro-Optical Switching in Polymer-Stabilized Liquid Crystalline Blue Phases for Display Application", SID Digest '07 : SID International Symposium Digest of Technical Papers, 2007, vol. 38, pp. 1737-1740.

Kikuchi.H et al., "Polymer-Stabilized Liquid Crystal Blue Phases", Nature Materials, Sep. 2, 2002, vol. 1, pp. 64-68.

Kim.S et al., "High-Performance oxide thin film transistors passivated by various gas plasmas", 214th ECS Meeting, 2008, No. 2317, ECS.

Kimizuka.N et al., "Spinel,YbFe2O4, and Yb2Fe3O7 Types of Structures for Compounds in the In2O3 and Sc2O3—A2O3—BO

(56) References Cited

OTHER PUBLICATIONS

Systems [A; Fe, Ga, or Al; B: Mg, Mn, Fe, Ni, Cu,or Zn] at Temperatures Over 1000° C", Journal of Solid State Chemistry, 1985, vol. 60, pp. 382-384.

Kimizuka.N et al., "Syntheses and Single-Crystal Data of Homologous Compounds, In2O3(ZnO)m (m = 3, 4, and 5), InGaO3(ZnO)3, and Ga2O3(ZnO)m (m = 7, 8, 9, and 16) in the In2O3—ZnGa2O4—ZnO System", Journal of Solid State Chemistry, Apr. 1, 1995, vol. 116, No. 1, pp. 170-178.

Kitzerow.H et al., "Observation of Blue Phases in Chiral Networks", Liquid Crystals, 1993, vol. 14, No. 3, pp. 911-916.

Kurokawa.Y et al., "UHF RFCPUS on Flexible and Glass Substrates for Secure RFID Systems", Journal of Solid-State Circuits, 2008, vol. 43, No. 1, pp. 292-299.

Lany.S et al., "Dopability, Intrinsic Conductivity, and Nonstoichiometry of Transparent Conducting Oxides", Phys. Rev. Lett. (Physical Review Letters), Jan. 26, 2007, vol. 98, pp. 045501-1-045501-4.

Lee.H et al., "Current Status of, Challenges to, and Perspective View of AM-OLED", IDW '06 : Proceedings of the 13th International Display Workshops, Dec. 7, 2006, pp. 663-666.

Lee.J et al., "World's Largest (15-Inch) XGA AMLCD Panel Using IGZO Oxide TFT", SID Digest '08 : SID International Symposium Digest of Technical Papers, May 20, 2008, vol. 39, pp. 625-628.

Lee.M et al., "15.4:Excellent Performance of Indium-Oxide-Based Thin-Film Transistors by DC Sputtering", SID Digest '09 : SID International Symposium Digest of Technical Papers, May 31, 2009, pp. 191-193.

Li.C et al., "Modulated Structures of Homologous Compounds InMO3(ZnO)m (M=In,Ga; m=Integer) Described by Four-Dimensional Superspace Group", Journal of Solid State Chemistry, 1998, vol. 139, pp. 347-355.

Masuda.S et al., "Transparent thin film transistors using ZnO as an active channel layer and their electrical properties", J. Appl. Phys. (Journal of Applied Physics) , Feb. 1, 2003, vol. 93, No. 3, pp. 1624-1630.

Meiboom.S et al., "Theory of the Blue Phase of Cholesteric Liquid Crystals", Phys. Rev. Lett. (Physical Review Letters), May 4, 1981, vol. 46, No. 18, pp. 1216-1219.

Miyasaka.M, "Suftla Flexible Microelectronics on Their Way to Business", SID Digest '07 : SID International Symposium Digest of Technical Papers, 2007, vol. 38, pp. 1673-1676.

Mo.Y et al., "Amorphous Oxide TFT Backplanes for Large Size AMOLED Displays", IDW '08 : Proceedings of the 6th International Display Workshops, Dec. 3, 2008, pp. 581-584.

Nakamura.M et al., "The phase relations in the In2O3—Ga2ZnO4—ZnO system at 1350° C", Journal of Solid State Chemistry, Aug. 1, 1991, vol. 93, No. 2, pp. 298-315.

Nakamura.M, "Synthesis of Homologous Compound with New Long-Period Structure", Nirim Newsletter, Mar. 1, 1995, vol. 150, pp. 1-4.

Nomura.K et al., "Amorphous Oxide Semiconductors for High-Performance Flexible Thin-Film Transistors", Jpn. J. Appl. Phys. (Japanese Journal of Applied Physics) , 2006, vol. 45, No. 5B, pp. 4303-4308.

Nomura.K et al., "Carrier transport in transparent oxide semiconductor with intrinsic structural randomness probed using single-crystalline InGaO3(ZnO)5 films", Appl. Phys. Lett. (Applied Physics Letters) , Sep. 13, 2004, vol. 85, No. 11, pp. 1993-1995.

Nomura.K et al., "Room-Temperature Fabrication of Transparent Flexible Thin-Film Transistors Using Amorphous Oxide Semiconductors", Nature, Nov. 25, 2004, vol. 432, pp. 488-492.

Nomura.K et al., "Thin-Film Transistor Fabricated in Single-Crystalline Transparent Oxide Semiconductor", Science, May 23, 2003, vol. 300, No. 5623, pp. 1269-1272.

Nowatari.H et al., "60.2: Intermediate Connector With Suppressed Voltage Loss for White Tandem OLEDS", SID Digest '09 : SID International Symposium Digest of Technical Papers, May 31, 2009, vol. 40, pp. 899-902.

Oba.F et al., "Defect energetics in ZnO: A hybrid Hartree-Fock density functional study", Phys. Rev. B (Physical Review. B), 2008, vol. 77, pp. 245202-1-245202-6.

Oh.M et al., "Improving the Gate Stability of ZnO Thin-Film Transistors With Aluminum Oxide Dielectric Layers", J. Electrochem. Soc. (Journal of the Electrochemical Society), 2008, vol. 155, No. 12, pp. H1009-H1014.

Ohara.H et al., "21.3:4.0 IN. QVGA AMOLED Display Using In-Ga-Zn-Oxide TFTS With a Novel Passivation Layer", SID Digest '09 : SID International Symposium Digest of Technical Papers, May 31, 2009, pp. 284-287.

Ohara.H et al., "Amorphous In-Ga-Zn-Oxide TFTs with Suppressed Variation for 4.0 inch QVGA AMOLED Display", AM-FPD '09 Digest of Technical Papers, Jul. 1, 2009, pp. 227-230, The Japan Society of Applied Physics.

Orita.M et al., "Amorphous transparent conductive oxide InGaO3(ZnO)m (m<4):a Zn4s conductor", Philosophical Magazine, 2001, vol. 81, No. 5, pp. 501-515.

Orita.M et al., "Mechanism of Electrical Conductivity of Transparent InGaZnO4", Phys. Rev. B (Physical Review. B), Jan. 15, 2000, vol. 61, No. 3, pp. 1811-1816.

Osada.T et al., "15.2: Development of Driver-Integrated Panel using Amorphous In-Ga-Zn-Oxide TFT", SID Digest '09 : SID International Symposium Digest of Technical Papers, May 31, 2009, pp. 184-187.

Osada.T et al., "Development of Driver-Integrated Panel Using Amorphous In-Ga-Zn-Oxide TFT", AM-FPD '09 Digest of Technical Papers, Jul. 1, 2009, pp. 33-36.

Park.J et al., "Amorphous Indium-Gallium-Zinc Oxide TFTS and Their Application for Large Size AMOLED", AM-FPD '08 Digest of Technical Papers, Jul. 2, 2008, pp. 275-278.

Park.J et al., "Dry etching of ZnO films and plasma-induced damage to optical properties", J. Vac. Sci. Techol. B (Journal of Vacuum Science & Technology B), Mar. 1, 2003, vol. 21, No. 2, pp. 800-803.

Park.J et al., "Electronic Transport Properties of Amorphous Indium-Gallium-Zinc Oxide Semiconductor Upon Exposure to Water", Appl. Phys. Lett. (Applied Physics Letters) , 2008, vol. 92, pp. 07214-1-072104-3.

Park.J et al., "High performance amorphous oxide thin film transistors with self-aligned top-gate structure", IEDM 09: Technical Digest of International Electron Devices Meeting, Dec. 7, 2009, pp. 191-194.

Park.J et al., "Improvements in the Device Characteristics of Amorphous Indium Gallium Zinc Oxide Thin-Film Transistors by Ar Plasma Treatment", Appl. Phys. Lett. (Applied Physics Letters), Jun. 26, 2007, vol. 90, No. 26, pp. 262106-1-262106-3.

Park.S et al., "Challenge to Future Displays: Transparent AM-OLED Driven by PEALD Grown ZnO TFT", IMID '07 Digest, 2007, pp. 1249-1252.

Park.Sang-Hee et al., "42.3: Transparent ZnO Thin Film Transistor for the Application of High Aperture Ratio Bottom Emission AM-OLED Display", SID Digest '08 : SID International Symposium Digest of Technical Papers, May 20, 2008, vol. 39, pp. 629-632.

Prins.M et al., "A Ferroelectric Transparent Thin-Film Transistor", Appl. Phys. Lett. (Applied Physics Letters) , Jun. 17, 1996, vol. 68, No. 25, pp. 3650-3652.

Sakata.J et al., "Development of 4.0-IN. AMOLED Display With Driver Circuit Using Amorphous In-Ga-Zn-Oxide TFTS", IDW '09: Proceedings of the 16th International Display Workshops, 2009, pp. 689-692.

Son.K et al., "42.4L: Late-News Paper: 4 Inch QVGA AMOLED Driven by the Threshold Voltage Controlled Amorphous GIZO (Ga2O3—In2O3—ZnO) TFT", SID Digest '08 : SID International Symposium Digest of Technical Papers, May 20, 2008, vol. 39, pp. 633-636.

Takahashi.M et al., "Theoretical Analysis of IGZO Transparent Amorphous Oxide Semiconductor", IDW '08 : Proceedings of the 15th International Display Workshops, Dec. 3, 2008, pp. 1637-1640.

Tsuda.K et al., "Ultra Low Power Consumption Technologies for Mobile TFT-LCDs", IDW '02 : Proceedings of the 9th International Display Workshops, Dec. 4, 2002, pp. 295-298.

(56) References Cited

OTHER PUBLICATIONS

Ueno.K et al., "Field-Effect Transistor on SrTiO3 With Sputtered Al2O3 Gate Insulator", Appl. Phys. Lett. (Applied Physics Letters), Sep. 1, 2003, vol. 83, No. 9, pp. 1755-1757.
Van de Walle.C, "Hydrogen as a Cause of Doping in Zinc Oxide", Phys. Rev. Lett. (Physical Review Letters), Jul. 31, 2000, vol. 85, No. 5, pp. 1012-1015.

* cited by examiner 301 303    304a 304b    361

366

366  307

366  307

301 303    304a 304b    371

306

306  307

307

METHOD FOR MANUFACTURING SEMICONDUCTOR DEVICE

CROSS-REFERENCE TO RELATED APPLICATIONS

This application is a continuation of U.S. application Ser. No. 14/094,293, filed Dec. 2, 2013, now allowed, which claims the benefit of a foreign priority application filed in Japan as Serial No. 2012-264592 on Dec. 3, 2012, both of which are incorporated by reference.

BACKGROUND OF THE INVENTION

1. Field of the Invention

The present invention relates to an object, a process (including a method and a manufacturing method), a machine, a manufacture, or a composition of matter. In particular, the present invention relates to a semiconductor device, a display device, a light-emitting device, a driving method thereof, a manufacturing method thereof, or the like. In particular, the present invention relates to a semiconductor device, a display device, a light-emitting device, or the like including an oxide semiconductor.

In this specification, a semiconductor device includes a device which can function by utilizing electronic characteristics of a semiconductor in its category, and for example, an electro-optic device, a semiconductor circuit, and an electric appliance are included in the category of the semiconductor device.

2. Description of the Related Art

Transistors used for most flat panel displays typified by a liquid crystal display device and a light-emitting display device are formed using silicon semiconductors such as amorphous silicon, single crystal silicon, and polycrystalline silicon provided over glass substrates. Further, transistors formed using such silicon semiconductors are used in integrated circuits (ICs) and the like.

In recent years, attention has been drawn to a technique in which, instead of a silicon semiconductor, a metal oxide exhibiting semiconductor characteristics is used for transistors. Note that in this specification, a metal oxide exhibiting semiconductor characteristics is referred to as an oxide semiconductor.

For example, a technique in which a transistor is manufactured using zinc oxide or an In—Ga—Zn-based oxide as an oxide semiconductor and the transistor is used as a switching element or the like of a pixel of a display device, is disclosed (see Patent Documents 1 and 2).

REFERENCE

Patent Documents

[Patent Document 1] Japanese Published Patent Application No. 2007-123861
[Patent Document 2] Japanese Published Patent Application No. 2007-096055

SUMMARY OF THE INVENTION

In a transistor using an oxide semiconductor, oxygen vacancies (oxygen defects) which are one of causes of localized levels in an oxide semiconductor film cause defects of electric characteristics of the transistor.

In view of this, an object of one embodiment of the present invention is to improve electric characteristics of a semiconductor device using an oxide semiconductor. Another object of one embodiment of the present invention is to improve reliability of a semiconductor device using an oxide semiconductor. Another object of one embodiment of the present invention is to control oxygen in an oxide semiconductor. Another object of one embodiment of the present invention is to prevent a transistor from becoming normally-on. Another object of one embodiment of the present invention is to control change, variation, or decrease in threshold voltage of a transistor. Another object of one embodiment of the present invention is to provide a transistor having low off-state current.

Note that the descriptions of these objects do not disturb the existence of other objects. Note that there is no need to achieve all of these objects with one embodiment of the present invention. Other objects will be apparent from and can be derived from the description of the specification, the drawings, the claims, and the like.

One embodiment of the present invention is a transistor including a first oxide film, an oxide semiconductor film, a pair of electrodes in contact with the oxide semiconductor film, and a second oxide film in contact with the oxide semiconductor film and the pair of electrodes, in which oxygen is added to the first oxide film and the second oxide film in contact with the oxide semiconductor film and the pair of electrodes to reduce oxygen vacancies. Further, the oxygen is diffused to the oxide semiconductor film by heat treatment or the like, so that oxygen vacancies in the oxide semiconductor film are reduced.

One embodiment of the present invention is a method for manufacturing a semiconductor device including the following steps: forming a first oxide film over an insulating film over a substrate and adding oxygen to the first oxide film; forming an oxide semiconductor film over the first oxide film and performing heat treatment to transfer part of oxygen in the first oxide film to the oxide semiconductor film; etching part of the first oxide film to which oxygen is added and part of the oxide semiconductor film; forming a pair of electrodes over the oxide semiconductor film which is etched; forming a second oxide film over the oxide semiconductor film and the pair of electrodes, adding oxygen to the second oxide film, and performing heat treatment so that part of oxygen in the second oxide film is transferred to the oxide semiconductor film; forming a gate insulating film over the second oxide film to which oxygen is added; and forming a gate electrode over the gate insulating film.

One embodiment of the present invention is a method for manufacturing a semiconductor device including the following steps: forming a gate insulating film over a gate electrode over a substrate; forming a first oxide film over the gate insulating film and adding oxygen to the first oxide film; forming an oxide semiconductor film over the first oxide film and performing heat treatment so that part of oxygen in the first oxide film is transferred to the oxide semiconductor film; etching part of the first oxide film to which oxygen is added and part of the oxide semiconductor film; forming a pair of electrodes over the oxide semiconductor film which is etched; forming a second oxide film over the oxide semiconductor film which is etched and the pair of electrodes, adding oxygen to the second oxide film, and performing heat treatment so that part of oxygen in the second oxide film is transferred to the oxide semiconductor film; and forming an insulating film over the second oxide film to which oxygen is added.

Note that by adding oxygen to the first oxide film and the second oxide film and then performing heat treatment, oxygen vacancies in the first oxide film and the second oxide film can be reduced.

Note that the oxide semiconductor film is an oxide semiconductor film containing In or Ga, typically, an In—Ga oxide, an In—Zn oxide, or an In-M-Zn oxide (M is Al, Ti, Ga, Y, Zr, Sn, La, Ce, Nd, or Hf). Note that the element M indicates a metal element whose strength of bonding with oxygen is higher than that of In.

Further, each of the first oxide film and the second oxide film is typically an In—Ga oxide, an In—Zn oxide, or an In-M-Zn oxide (M is Al, Ti, Ga, Y, Zr, Sn, La, Ce, Nd, or Hf), and each of the above oxide films has the energy at the bottom of the conduction band closer to a vacuum level than the oxide semiconductor film. Typically, a difference between the energy at the bottom of the conduction band in each of the oxide film, the first oxide film containing In or Ga, and the second oxide film containing In or Ga and the energy at the bottom of the conduction band in the oxide semiconductor film is greater than or equal to 0.05 eV, greater than or equal to 0.07 eV, greater than or equal to 0.1 eV, or greater than or equal to 0.15 eV, and also less than or equal to 2 eV, less than or equal to 1 eV, less than or equal to 0.5 eV, or less than or equal to 0.4 eV. Note that the difference between the vacuum level and the energy at the bottom of the conduction band is referred to as electron affinity.

Further, in the case where the first oxide film, the second oxide film, and the oxide semiconductor film are each an In-M-Zn oxide (M is Al, Ti, Ga, Y, Zr, Sn, La, Ce, Nd, or Hf), the proportion of M atoms (M is Al, Ti, Ga, Y, Zr, Sn, La, Ce, Nd, or Hf) included in each of the first oxide film and the second oxide film is higher than that in the oxide semiconductor film. Typically, the proportion of M in each of the oxide films is higher than or equal to 1.5 times, preferably higher than or equal to twice, further preferably higher than or equal to three times as high as that in the oxide semiconductor film.

In the case where the first oxide film and the second oxide film are each an In-M-Zn oxide (M is Al, Ti, Ga, Y, Zr, Sn, La, Ce, Nd, or Hf, and In:M:Zn=$x_1$:$y_1$:$z_1$ [atomic ratio]) and the oxide semiconductor film is an In-M-Zn oxide (M is Al, Ti, Ga, Y, Zr, La, Ce, Nd, or Hf, and In:M:Zn=$x_2$:$y_2$:$z_2$ [atomic ratio]), the compositions of the films are selected so that $y_1/x_1$ is higher than $y_2/x_2$. It is preferable that $y_1/x_1$ be 1.5 times or more as high as $y_2/x_2$. It is further preferable that $y_1/x_1$ be twice or more as high as $y_2/x_2$. It is still further preferable that $y_1/x_1$ be three times or more as high as $y_2/x_2$. In this case, it is preferable that in a transistor including the oxide semiconductor film, $y_1$ be higher than or equal to $x_1$ because the transistor can have stable electric characteristics. However, when $y_1$ is larger than or equal to three times $x_1$, the field-effect mobility of the transistor is reduced. Thus, it is preferable that $y_1$ be lower than three times $x_1$.

Furthermore, in the multilayer film including the first oxide film, the oxide semiconductor film, and the second oxide film, the absorption coefficient calculated by a constant photocurrent method is less than $1 \times 10^{-3}/cm^3$.

As a method for adding oxygen to the first oxide film and the second oxide film, an ion implantation method, an ion doping method, plasma treatment, or the like can be given.

In accordance with one embodiment of the present invention, the electric characteristics of a semiconductor device using an oxide semiconductor can be improved. In accordance with one embodiment of the present invention, reliability of a semiconductor device using an oxide semiconductor can be improved.

DETAILED DESCRIPTION OF THE INVENTION

Figure 1A:
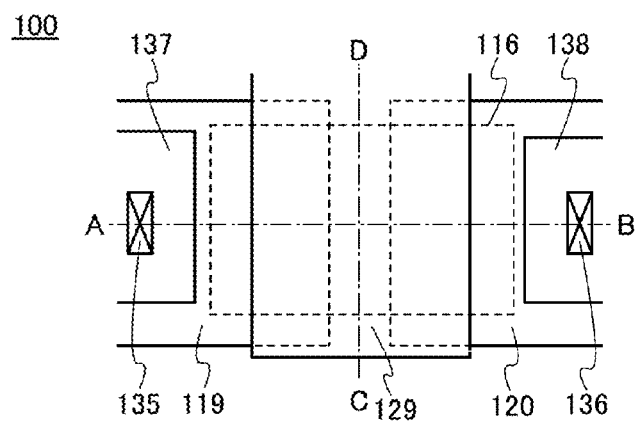
FIGS. 1A to 1D are a top view and cross-sectional views illustrating one embodiment of a semiconductor device.

Hereinafter, embodiments of the present invention will be described in detail with reference to the accompanying drawings. However, the present invention is not limited to the following description and it is easily understood by those skilled in the art that the mode and details can be variously changed without departing from the scope and spirit of the present invention. Therefore, the present invention should not be interpreted as being limited to the description of the embodiments. In addition, in the following embodiments and examples, the same portions or portions having similar functions are denoted by the same reference numerals or the same hatching patterns in different drawings, and description thereof will not be repeated.

Note that in each drawing described in this specification, the size, the film thickness, or the region of each component is exaggerated for clarity in some cases. Therefore, embodiments of the present invention are not limited to such scales.

Note that terms such as "first", "second", and "third" in this specification are used in order to avoid confusion among components, and the terms do not limit the components numerically. Therefore, for example, the term "first" can be replaced with the term "second", "third", or the like as appropriate.

Functions of a "source" and a "drain" are sometimes replaced with each other when the direction of current flowing is changed in circuit operation, for example. Therefore, the terms "source" and "drain" can be used to denote the drain and the source, respectively, in this specification.

(Embodiment 1)

The threshold voltage of a transistor using an oxide semiconductor film with oxygen vacancies easily shifts negatively, and such a transistor tends to be normally-on. This is because electric charges are generated owing to oxygen vacancies in the oxide semiconductor, and the resistance is reduced. In addition, a transistor using an oxide semiconductor film with oxygen vacancies has such a problem that the electric characteristics, typically, the threshold voltage, are changed with time or changed by a stress test (typically, a gate bias-temperature (BT) stress test under light irradiation). In this embodiment, a highly reliable semiconductor device in which a change in threshold voltage is small and a manufacturing method thereof will be described. Further, a semiconductor device with excellent electric characteristics and a manufacturing method thereof will be described.

<Structural Example of Semiconductor Device>

In this embodiment, a method for manufacturing a top-gate transistor is described.

Figure 1C:
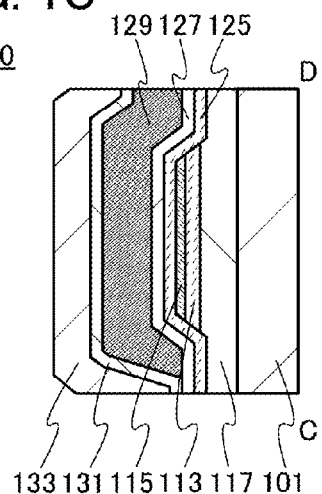
Figure 1B:
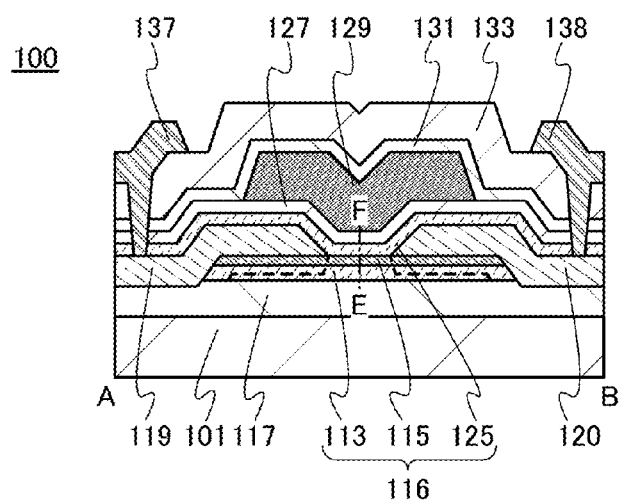
Figure 1D:
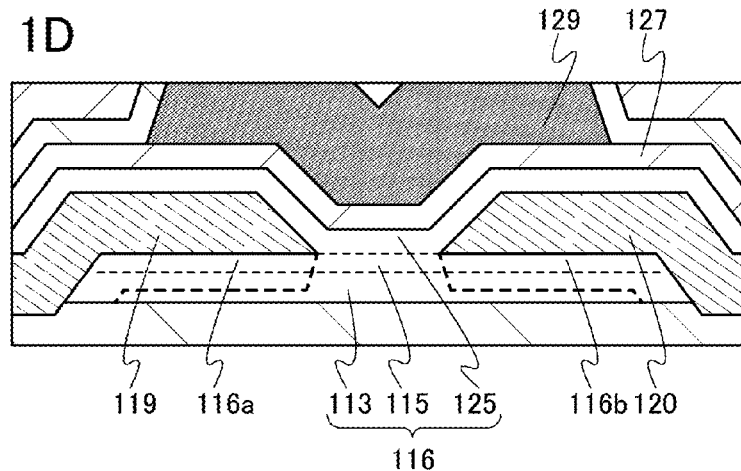

FIGS. 1A to 1D are a top view and cross-sectional views of a transistor 100 included in a semiconductor device. FIG. 1A is a top view of the transistor 100, FIG. 1B is a cross-sectional view taken along dashed-dotted line A-B in FIG. 1A, FIG. 1C is a cross-sectional view taken along dashed-dotted line C-D in FIG. 1A, and FIG. 1D is an enlarged view of the vicinity of a multilayer film in FIG. 1B. Note that in FIG. 1A, a substrate 101, an oxide insulating film 117, an oxide film 125, a gate insulating film 127, an insulating film 131, an insulating film 133, and the like are not illustrated for simplicity.

The transistor 100 in FIGS. 1A to 1D is provided over the oxide insulating film 117 over the substrate 101. The transistor 100 includes an oxide film 113 over the oxide insulating film 117, an oxide semiconductor film 115 over the oxide film 113, a pair of electrodes 119 and 120 in contact with the oxide semiconductor film 115, the oxide film 125 in contact with the oxide insulating film 117, the oxide semiconductor film 115, and the pair of electrodes 119 and 120, the gate insulating film 127 in contact with the oxide film 125, and a gate overlapping with the oxide semiconductor film 115 with the gate insulating film 127 provided therebetween. Note that the oxide film 113, the oxide semiconductor film 115, and the oxide film 125 are collectively referred to as a multilayer film 116. The insulating film 131 covering the gate insulating film 127 and the gate electrode 129 and the insulating film 133 covering the insulating film 131 may be provided. In openings 135 and 136 in the gate insulating film 127, the insulating film 131, and the insulating film 133, wirings 137 and 138 in contact with the pair of electrodes 119 and 120 may be provided.

Components of the transistor 100 are described below.

Although there is no particular limitation on a material and the like of the substrate 101, it is necessary that the substrate have heat resistance high enough to withstand at least heat treatment performed later. For example, a glass substrate, a ceramic substrate, a quartz substrate, a sapphire substrate, or the like may be used as the substrate 101. Alternatively, a single crystal semiconductor substrate or a polycrystalline semiconductor substrate made of silicon, silicon carbide, or the like, a compound semiconductor substrate made of silicon germanium or the like, an SOI substrate, or the like may be used as the substrate 101. Furthermore, any of these substrates further provided with a semiconductor element may be used as the substrate 101. A flexible substrate may be used as the substrate 101.

Examples of the oxide insulating film 117 functioning as a base insulating film containing one or more kinds of silicon oxide, silicon oxynitride, silicon nitride, silicon nitride oxide, gallium oxide, hafnium oxide, yttrium oxide, aluminum oxide, and aluminum oxynitride. Note that when silicon nitride, gallium oxide, hafnium oxide, yttrium oxide, aluminum oxide, or the like is used as a material of the oxide insulating film 117 functioning as a base insulating film, it is possible to suppress diffusion of impurities, typically, an alkali metal, water, hydrogen, and the like, into the oxide semiconductor film from the substrate 101.

Note that the oxide insulating film 117 is not necessarily provided if not necessary.

The oxide semiconductor film 115 is an oxide semiconductor film containing In or Ga and typically includes an In—Ga oxide, an In—Zn oxide, and an In-M-Zn oxide (M is Al, Ti, Ga, Y, Zr, Sn, La, Ce, Nd, or Hf).

Note that when the oxide semiconductor film 115 is an In-M-Zn oxide, the atomic ratio of In to M is preferably as follows: the proportion of In atoms be higher than or equal to 25 atomic % and the proportion of M atoms be lower than 75 atomic %, and it is further preferably as follows: the proportion of In atoms be higher than or equal to 34 atomic % and the proportion of M atoms be lower than 66 atomic %.

The indium and gallium contents in the oxide semiconductor film 115 can be compared with each other by time-of-flight secondary ion mass spectrometry (also referred to as TOF-SIMS) or X-ray photoelectron spectrometry (also referred to as XPS).

Note that since the oxide semiconductor film 115 has an energy gap of 2 eV or more, preferably 2.5 eV or more, more preferably 3 eV or more, the off-state current of the transistor that is formed later can be low.

The thickness of the oxide semiconductor film 115 is greater than or equal to 3 nm and less than or equal to 200 nm, preferably greater than or equal to 3 nm and less than or equal to 100 nm, more preferably greater than or equal to 3 nm and less than or equal to 50 nm.

The oxide film 113 and the oxide film 125 are typically each an In—Ga oxide, an In—Zn oxide, or an In-M-Zn oxide (M is Al, Ti, Ga, Y, Zr, Sn, La, Ce, Nd, or Hf), and has the energy at the bottom of the conduction band closer to a vacuum level than that of the oxide semiconductor film 115. Typically, a difference between the energy at the bottom of the conduction band of the oxide semiconductor film 115 and the energy at the bottom of the conduction band of each of the oxide film 113 and the oxide film 125 is greater than or equal to 0.05 eV, greater than or equal to 0.07 eV, greater than or equal to 0.1 eV, or greater than or equal to 0.15 eV and also less than or equal to 2 eV, less than or equal to 1 eV, less than or equal to 0.5 eV, or less than or equal to 0.4 eV.

When the oxide film 113 and the oxide film 125 are each an In-M-Zn oxide, the atomic ratio of In to M is preferably as follows: the proportion of In atoms be lower than 50 atomic % and the proportion of M atoms be higher than or equal to 50 atomic %, and it is further preferably as follows: the proportion of In atoms be lower than 25 atomic % and the proportion of M atoms be higher than or equal to 75 atomic %.

Further, in the case where the oxide films 113 and 125 and the oxide semiconductor film 115 are each an In-M-Zn oxide (M is Al, Ti, Ga, Y, Zr, Sn, La, Ce, Nd, or Hf), the proportion of M atoms (M is Al, Ti, Ga, Y, Zr, Sn, La, Ce, Nd, or Hf) in each of the oxide film 113 and the oxide film 125 is higher than that in the oxide semiconductor film 115. Typically, the proportion of M in each of the oxide film 113 and the oxide film 125 is higher than or equal to 1.5 times, preferably higher than or equal to twice, further preferably higher than or equal to three times as high as that in the oxide semiconductor film 115. Any of the above elements represented by M is more strongly bonded to oxygen than indium is, and thus has a function of suppressing generation of oxygen vacancies in the oxide film. That is, oxygen vacancies are less likely to be generated in the oxide film 113 than in the oxide semiconductor film 115.

In the case where the oxide films 113 and 125 and the oxide semiconductor film 115 are each an In-M-Zn oxide (M is Al, Ti, Ga, Y, Zr, Sn, La, Ce, Nd, or Hf, and In:M:Zn=$x_1$:$y_1$:$z_1$ [atomic ratio]) and the oxide semiconductor film 115 is an In-M-Zn oxide (M is Al, Ti, Ga, Y, Zr, Sn, La, Ce, Nd, or Hf, and In:M:Zn=$x_2$:$y_2$:$z_2$ [atomic ratio]), $y_1/x_1$ is higher than $y_2/x_2$. It is preferable that $y_1/x_1$ be 1.5 times or more as high as $y_2/x_2$. It is further preferable that $y_1/x_1$ be twice or more as high as $y_2/x_2$. It is still further preferable that $y_1/x_1$ be three times or more as high as $y_2/x_2$. In this case, it is preferable that in the oxide film 113 and the oxide film 125, $y_1$ be higher than or equal to $x_1$ because a transistor using the oxide semiconductor film 115 can have stable electric characteristics. On the other hand, when $y_1$ is three times or more as high as $x_1$, the field-effect mobility of the transistor using the oxide semiconductor film 115 is reduced. Thus, it is preferable that $y_1$ be lower than three times $x_1$.

For example, for each of the oxide film 113 and the oxide film 125, an In—Ga—Zn oxide material having an atomic ratio of In to Ga and Zn that is 1:3:2, 1:6:4, or 1:9:6 can be used, and for the oxide semiconductor film 115, an In—Ga—Zn oxide material having an atomic ratio of In to Ga and Zn that is 1:1:1 or 3:1:2 can be used. Note that in each of the oxide film 113, the oxide film 125, and the oxide semiconductor film 115, the proportions of atoms in the atomic ratio varies within a range of ±20% as a margin.

The atomic ratio is not limited to the above, and the atomic ratio may be appropriately set in accordance with needed semiconductor characteristics.

The oxide film 113 and the oxide film 125 may have the same composition. For example, as each of the oxide film 113 and the oxide film 125, an In—Ga—Zn oxide film having an atomic ratio of In to Ga and Zn that is 1:3:2, 1:6:4, or 1:9:6 may be used.

Alternatively, the oxide film 113 and the oxide film 125 may have different compositions. For example, as the oxide film 113, an In—Ga—Zn oxide film having an atomic ratio of In to Ga and Zn that is 1:3:2 may be used, and as the oxide film 125, an In—Ga—Zn oxide film having an atomic ratio of In to Ga and Zn that is 1:6:4 or 1:9:6 may be used.

The oxide film 113 and the oxide film 125 each have a thickness of 3 nm to 100 nm, preferably 3 nm to 50 nm.

The interfaces of the oxide film 113, the oxide semiconductor film 115, and the oxide film 125 can be observed by scanning transmission electron microscopy (STEM).

The oxide films and the oxide semiconductor film may have a non-single crystal structure, for example. The non-single crystal structure includes a c-axis aligned crystalline oxide semiconductor (CAAC-OS) which is described later, a polycrystalline structure, a microcrystalline structure, or an amorphous structure, for example. Among the non-single crystal structure, the amorphous structure has the highest density of defect levels, whereas CAAC-OS has the lowest density of defect levels.

The oxide films and the oxide semiconductor film may have a microcrystalline structure, for example. The oxide films and the oxide semiconductor film which have the microcrystalline structure each include a microcrystal with a size greater than or equal to 1 nm and less than 10 nm, for example. Alternatively, the oxide films and the oxide semiconductor film which have the microcrystalline structure have a mixed phase structure where crystal parts (each of which is greater than or equal to 1 nm and less than 10 nm) are distributed in an amorphous phase.

The oxide films and the oxide semiconductor film may have an amorphous structure, for example. The oxide films and the oxide semiconductor film which have the amorphous structure each have disordered atomic arrangement and no crystalline component, for example. Alternatively, the oxide films having an amorphous structure have, for example, an absolutely amorphous structure and no crystal part.

Note that the oxide films and the oxide semiconductor film each may be a mixed film including regions having two or more of the following structures: a CAAC-OS, a microcrystalline structure, and an amorphous structure. The mixed film, for example, includes a region having an amorphous structure, a region having a microcrystalline structure, and a region of a CAAC-OS. Further, the mixed film may have a stacked-layer structure including a region having an amorphous structure, a region having a microcrystalline structure, and a region of a CAAC-OS, for example.

Note that the oxide films and the oxide semiconductor film may be in a single-crystal state, for example.

In the multilayer film 116, an oxide film in which oxygen vacancies are less likely to be generated than in the oxide semiconductor film 115 is provided over and under and in contact with the oxide semiconductor film 115; thus, oxygen vacancies in the oxide semiconductor film 115 can be reduced. Further, since the oxide semiconductor film 115 is in contact with the oxide films 113 and 125 containing one or more metal elements forming the oxide semiconductor film 115, the densities of interface levels at the interface between the oxide film 113 and the oxide semiconductor film 115 and at the interface between the oxide semiconductor film 115 and the oxide film 125 are extremely low. Thus, after oxygen is added to the oxide films 113 and 125, the oxygen is transferred from the oxide films 113 and 125 to the oxide semiconductor film 115 by heat treatment; however, the oxygen is hardly trapped by the interface levels at this time, and the oxygen in the oxide films 113 and 125 can be efficiently transferred to the oxide semiconductor film 115. Accordingly, oxygen vacancies in the oxide semiconductor film 115 can be reduced. Since oxygen is added to the oxide films 113 and 125, oxygen vacancies in the oxide films 113 and 125 can be reduced. In other words, the density of localized levels in the multilayer film including the oxide semiconductor film 115 can be reduced.

Note that of the multilayer film including the oxide semiconductor film 115 with a reduced density of localized levels, the absorption coefficient calculated by a constant photocurrent method (CPM) is lower than $1 \times 10^{-3}$/cm, preferably lower than $1 \times 10^{-4}$/cm, more preferably lower than $5 \times 10^{-5}$/cm. The absorption coefficient has a positive correlation with an energy corresponding to the localized levels due to oxygen vacancies and entry of impurities (the energy calculated from the wavelength); thus, the density of localized levels in the multilayer film is extremely low.

The absorption coefficient which is called an Urbach tail due to the band tail is removed from a curve of the absorption coefficient obtained by the CPM measurement, whereby the absorption coefficient due to the localized levels can be calculated from the following formula. Note that the Urbach tail indicates a constant gradient region on a curve of the absorption coefficient obtained by the CPM measurement, and the gradient is called Urbach energy.

$$\int \frac{\alpha(E) - \alpha_u}{E} dE$$ [FORMULA 1]

Here, α(E) indicates the absorption coefficient at each energy level and au indicates the absorption coefficient due to the Urbach tail.

In addition, when the oxide semiconductor film 115 is in contact with an insulating film including a different constituent element (e.g., a base insulating film including a silicon oxide film), an interface level is sometimes formed at the interface of the two layers and the interface level forms a channel. At this time, a second transistor having a different threshold voltage appears, so that an apparent threshold voltage of the transistor is varied. However, since the oxide film 113 containing one or more kinds of metal elements forming the oxide semiconductor film 115 is in contact with the oxide semiconductor film 115 in the multilayer film 116, an interface level is not easily formed at an interface between the oxide film 113 and the oxide semiconductor film 115. Thus, providing the oxide film 113 makes it possible to reduce fluctuation in the electric characteristics of the transistor, such as a threshold voltage.

In addition to the oxide semiconductor film 115, oxygen is added to each of the oxide films 113 and 125 in contact with the oxide semiconductor film 115, so that oxygen vacancies in the oxide films 113 and 125 can be reduced. By reducing the oxygen vacancies in the oxide film 113, a change in the threshold voltage due to a stress test, typically, a positive BT stress test in which a higher potential is applied to the gate electrode than the pair of electrodes, can be reduced. In addition, by reducing the oxygen vacancies in the oxide film 125, a change in the threshold voltage due to a stress test, typically, a negative BT stress test in which a lower potential is applied to the gate electrode than the pair of electrodes, can be reduced.

In the case where a channel is formed at an interface between the gate insulating film 127 and the oxide semiconductor film 115, interface scattering occurs at the interface and the field-effect mobility of the transistor is decreased. However, since the oxide film 125 containing one or more kinds of metal elements forming the oxide semiconductor film 115 is provided in the multilayer film 116, scattering of carriers does not easily occur at an interface between the oxide semiconductor film 115 and the oxide film 125, and thus the field-effect mobility of the transistor can be increased.

Further, the oxide film 113 and the oxide film 125 each also serve as a barrier film which suppresses formation of an impurity level due to the entry of the constituent elements of the insulating films which are in contact with the multilayer film 116 (the oxide insulating film 117 and the gate insulating film 127) into the oxide semiconductor film 115.

For example, in the case of using a silicon-containing insulating film as the oxide insulating film 117 or the gate insulating film 127 which is in contact with the multilayer film 116, silicon in the insulating film or carbon which might be contained in the insulating film enters the oxide film 113 or the oxide film 125 at a depth of several nanometers from the interface in some cases. An impurity such as silicon or carbon entering the oxide semiconductor film forms impurity levels. The impurity levels serve as a donor and generate an electron, so that the oxide semiconductor film may become n-type.

However, when the thicknesses of the oxide film 113 and the oxide film 125 are each larger than several nanometers, the impurity such as silicon or carbon does not reach the oxide semiconductor film 115, so that the influence of impurity levels is suppressed.

Here, the concentration of silicon in the oxide semiconductor film is lower than or equal to $3 \times 10^{18}$ atoms/cm$^3$, preferably lower than or equal to $3 \times 10^{17}$ atoms/cm$^3$. In addition, the concentration of carbon in the oxide semiconductor film is lower than or equal to $3 \times 10^{18}$ atoms/cm$^3$, preferably lower than or equal to $3 \times 10^{17}$ atoms/cm$^3$. It is particularly preferable to sandwich or surround the oxide semiconductor film 115 serving as a carrier path by the oxide film 113 and the oxide film 125 in order to prevent entry of much silicon or carbon, which is a Group 14 element, to the oxide semiconductor film 115. That is, the concentration of silicon and carbon in the oxide semiconductor film 115 is preferably lower than that in the oxide film 113 and the oxide film 125.

Note that the impurity concentration of the oxide semiconductor film can be measured by secondary ion mass spectrometry (SIMS).

In this embodiment, the number of oxygen vacancies in the oxide semiconductor film 115, and further the number of oxygen vacancies in the oxide films in contact with the oxide semiconductor film can be reduced; thus, the density of localized levels of the multilayer film including the oxide semiconductor film 115 can be reduced. As a result, the transistor 100 in this embodiment has a small change in the threshold voltage and high reliability. Further, the transistor 100 in this embodiment has excellent electric characteristics.

The pair of electrodes 119 and 120 is formed to have a single-layer structure or a stacked-layer structure including, as a conductive material, any of metals such as aluminum, titanium, chromium, nickel, copper, yttrium, zirconium, molybdenum, silver, tantalum, and tungsten or an alloy containing any of these metals as a main component. For example, a single-layer structure of an aluminum film containing silicon, a two-layer structure in which a titanium film is stacked over an aluminum film, a two-layer structure in which a titanium film is stacked over a tungsten film, a two-layer structure in which a copper film is stacked over a copper-magnesium-aluminum alloy film, a three-layer structure in which a titanium film or a titanium nitride film, an aluminum film or a copper film, and a titanium film or a titanium nitride film are stacked in this order, a three-layer structure in which a molybdenum film or a molybdenum nitride film, an aluminum film or a copper film, and a molybdenum film or a molybdenum nitride film are stacked in this order, and the like can be given. Note that a transparent conductive material containing indium oxide, tin oxide, or zinc oxide may be used.

Note that a channel formation region refers to a region, which overlaps with the gate electrode 129 and is positioned between the pair of electrodes 119 and 120, in the multilayer film 116. Further, a channel region refers to a region through which current mainly flows in the channel formation region. Here, a channel region is part of the oxide semiconductor film 115, which is positioned between the pair of electrodes 119 and 120. A channel length refers to a distance between the pair of electrodes 119 and 120.

As for the pair of electrodes 119 and 120, it is preferable to use a conductive material which is easily bonded to oxygen, such as tungsten, titanium, aluminum, copper, molybdenum, chromium, or tantalum, or an alloy thereof. Tungsten or titanium with a relatively high melting point is preferably used, which allows subsequent process temperatures to be relatively high. Note that a conductive material which is easily bonded to oxygen includes a material to which oxygen is easily diffused. In this case, oxygen in the oxide semiconductor film 115 and the conductive material contained in the pair of electrodes 119 and 120 are bonded, and accordingly, an oxygen vacancy region is formed in the oxide semiconductor film 115. Further, in some cases, part of constituent elements of the conductive material forming the pair of electrodes 119 and 120 is mixed into the oxide semiconductor film 115. In this case, n-type regions (low resistance regions) are formed in regions in contact with the pair of electrodes 119 and 120 at least in the oxide semiconductor film 115. The n-type regions (low resistance regions) function as a source region and a drain region.

A region having high oxygen concentration may be formed in part of the pair of electrodes 119 and 120 in contact with the low-resistance regions. Constituent elements of the oxide semiconductor film 115 enter the pair of electrodes 119 and 120 in contact with the low-resistance regions in some cases. In other words, in the vicinities of the interfaces between the oxide semiconductor film 115 and the pair of electrodes 119 and 120, regions which can be called mixed regions or mixed layers of these two layers are formed in some cases.

Here, the details of the multilayer film 116 in the case where a conductive material which is easily bonded to oxygen, such as tungsten, titanium, aluminum, copper, molybdenum, chromium, or tantalum, or an alloy thereof is used for the pair of electrodes 119 and 120 are described with reference to FIG. 1D. In FIG. 1D, the hatch patterns of the oxide film 113, the oxide semiconductor film 115, and the oxide film 125 are not illustrated. In the multilayer film 116, source and drain regions 116a and 116b are formed in the regions in contact with the pair of electrodes 119 and 120. Here, a region positioned between a bold broken line and the electrode 119 and a region positioned between the bold broken line and the electrode 120 are referred to as the source and drain regions 116a and 116b, respectively. In addition, thin broken lines indicate interfaces of the oxide film 113, the oxide semiconductor film 115, and the oxide film 125.

As illustrated in FIG. 1D, in the case where the source and drain regions 116a and 116b are formed in the multilayer film 116, a channel formation region refers to a region which overlaps with the gate electrode 129 and is positioned between the pair of electrodes 119 and 120. A channel region refers to a region through which carriers mainly flow in the channel formation region, that is, a region which is positioned between the source and drain regions 116a and 116b and through which carriers mainly flow.

Since the source and drain regions 116a and 116b have high conductivity, the contact resistance between the multilayer film 116 and the pair of electrodes 119 and 120 can be reduced, and thus, the on-state current of the transistor can be increased.

The gate insulating film 127 can be formed to have a single-layer structure or a stacked-layer structure using, for example, one or more of silicon oxide, silicon oxynitride, silicon nitride oxide, silicon nitride, aluminum oxide, hafnium oxide, gallium oxide, and a Ga—Zn-based metal oxide. The gate insulating film 127 may be formed using an oxide insulator from which oxygen is released by heating. With use of a film from which oxygen is released by heating as the gate insulating film 127, the number of interface levels at the interface between the oxide semiconductor film 125 and the gate insulating film 127 can be reduced; accordingly, a transistor with less deterioration in electric characteristics can be obtained. It is possible to prevent outward diffusion of oxygen from the oxide semiconductor film 115 and entry of hydrogen, water, and the like into the oxide semiconductor film 115 from the outside by providing an insulating film having a blocking effect against oxygen, hydrogen, water, and the like for the gate insulating film 127. As the insulating film that can block oxygen, hydrogen, water, and the like, an aluminum oxide film, an aluminum oxynitride film, a gallium oxide film, a gallium oxynitride film, an yttrium oxide film, an yttrium oxynitride film, a hafnium oxide film, a hafnium oxynitride film, and the like can be given.

The gate insulating film 127 may be formed using a high-k material such as hafnium silicate ($HfSiO_x$), hafnium silicate to which nitrogen is added ($HfSi_xO_yN_z$), hafnium aluminate to which nitrogen is added (HfAl$_x$O$_y$N$_z$), hafnium oxide, or yttrium oxide, so that gate leakage current of the transistor can be reduced.

The thickness of the gate insulating film 127 is greater than or equal to 5 nm and less than or equal to 400 nm, preferably greater than or equal to 10 nm and less than or equal to 300 nm, further preferably greater than or equal to 50 nm and less than or equal to 250 nm.

The gate electrode 129 can be formed using a metal element selected from aluminum, chromium, copper, tantalum, titanium, molybdenum, and tungsten; an alloy containing any of these metal elements as a component; an alloy containing any of these metals in combination; or the like. Further, one or more metal elements selected from manganese and zirconium may be used. Further, the gate electrode 129 may have a single-layer structure or a stacked-layer structure of two or more layers. For example, a single-layer structure of an aluminum film containing silicon, a two-layer structure in which a titanium film is stacked over an aluminum film, a two-layer structure in which a titanium film is stacked over a titanium nitride film, a two-layer structure in which a tungsten film is stacked over a titanium nitride film, a two-layer structure in which a tungsten film is stacked over a tantalum nitride film or a tungsten nitride film, a three-layer structure in which a titanium film, an aluminum film, and a titanium film are stacked in this order, and the like can be given. Alternatively, an alloy film or a nitride film which contains aluminum and one or more elements selected from titanium, tantalum, tungsten, molybdenum, chromium, neodymium, and scandium may be used.

The gate electrode 129 can also be formed using a light-transmitting conductive material such as an indium tin oxide, an indium oxide containing tungsten oxide, an indium zinc oxide containing tungsten oxide, an indium oxide containing titanium oxide, an indium tin oxide containing titanium oxide, an indium zinc oxide, or an indium tin oxide to which silicon oxide is added. It is also possible to have a stacked-layer structure formed using the above light-transmitting conductive material and the above metal element.

Further, an In—Ga—Zn-based oxynitride film, an In—Sn-based oxynitride film, an In—Ga-based oxynitride film, an In—Zn-based oxynitride film, a Sn-based oxynitride film, an In-based oxynitride film, a film of a metal nitride (such as InN or ZnN), or the like may be provided between the gate electrode 129 and the gate insulating film 127. These films each have a work function of 5 eV or higher, preferably 5.5 eV or higher and the electron affinity of each of these films is larger than that of an oxide semiconductor; thus, the threshold voltage of the transistor including an oxide semiconductor can be shifted in a positive direction. Accordingly, what is called a normally-off switching element can be obtained. For example, in the case of using an In—Ga—Zn-based oxynitride film, an In—Ga—Zn-based oxynitride film whose nitrogen concentration is higher than at least the nitrogen concentration of the oxide semiconductor film 115, specifically, an In—Ga—Zn-based oxynitride film whose nitrogen concentration is higher than or equal to 7 at. % is used.

The insulating films 131 and 133 can be formed using a material and a formation method which can be applied to the gate insulating film 127, as appropriate. Although a stacked-layer structure of the insulating films 131 and 133 is used here, a single-layer structure may be used.

The wirings 137 and 138 can be formed using a material similar to that of the pair of electrodes 119 and 120, as appropriate.

<Method for Manufacturing Semiconductor Device>

A method for manufacturing a semiconductor device is described with reference to FIGS. 2A to 2E and FIGS. 3A and 3B.

Figure 2A:
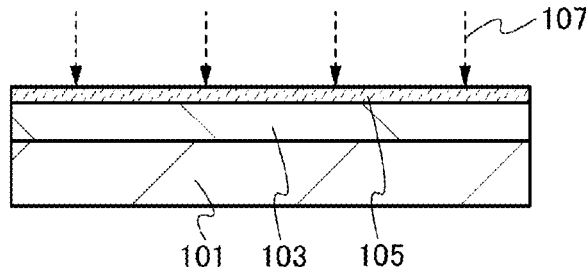
FIGS. 2A to 2E are cross-sectional views illustrating one embodiment of a method for manufacturing a semiconductor device.

As illustrated in FIG. 2A, over the substrate 101, an oxide insulating film 103 functioning as a base insulating film is formed, and an oxide film 105 is formed over the oxide insulating film 103. Next, oxygen 107 is added to the oxide film 105.

Here, a glass substrate is used as the substrate 101.

The oxide insulating film 103 can be formed by a sputtering method or a CVD (chemical vapor deposition) method.

In this embodiment, a 300-nm-thick silicon oxide film formed by a sputtering method is used as the oxide insulating film 103.

The oxide film 105 can be formed by a sputtering method, a coating method, a pulsed laser deposition method, a laser ablation method, or the like.

In the case where the oxide film 105 is formed by a sputtering method, as a power supply device for generating plasma, an RF power supply device, an AC power supply device, a DC power supply device, or the like can be used as appropriate.

As a sputtering gas, a rare gas (typically argon), an oxygen gas, or a mixed gas of a rare gas and oxygen is used as appropriate. In the case of using the mixed gas of a rare gas and oxygen, the proportion of oxygen is preferably higher than that of a rare gas.

Further, a target may be appropriately selected in accordance with the composition of the oxide film 105 to be formed.

Note that when a c-axis aligned crystalline oxide semiconductor (CAAC-OS) is formed as the oxide semiconductor film 111 which is described later, it is preferable that the oxide film 105 be formed without being heated. The oxide film 105 is likely to have a polycrystalline structure when being heated. In the case where the oxide semiconductor film 111 is formed over the polycrystalline oxide film 105, the crystal orientation of the oxide semiconductor film 111 becomes random. On the other hand, when the oxide film 105 has an amorphous structure, it is preferable that the oxide film 105 be formed without being heated or that the oxide film 105 be heated at a temperature such that an amorphous structure is obtained to form an oxide film having an amorphous structure because the oxide semiconductor film 111 to be formed later is likely to be a CAAC-OS film.

Here, as the oxide film 105, a 20-nm-thick In—Ga—Zn oxide film (In:Ga:Zn=1:☐:☐) is formed by a sputtering method.

The oxygen 107 that is added to the oxide film 105 includes at least one of an oxygen radical, an oxygen atom, an oxygen ion, and the like. As a method for adding the oxygen 107 to the oxide film 105, an ion doping method, an ion implantation method, and the like can be given.

The amount (dose) of oxygen added to the oxide film 105 by an ion implantation method is typically preferably greater than or equal to $5 \times 10^{14}/\text{cm}^2$ and less than or equal to $1 \times 10^{17}/\text{cm}^2$. The amount of oxygen which enables oxygen vacancies generated in an oxide semiconductor film in a later step to be reduced, is preferably added, and the amount is typically greater than or equal to $5 \times 10^{14}/\text{cm}^2$ and less than or equal to $1 \times 10^{15}/\text{cm}^2$. However, as the amount of added oxygen is larger, the treatment time becomes longer, and the mass productivity is lowered. Thus, the amount is preferably less than or equal to $1\times10^{17}/cm^2$, more preferably less than or equal to $2\times10^{16}/cm^2$.

Plasma treatment in which the oxide film 105 is exposed to plasma generated in an atmosphere containing oxygen may be performed, so that oxygen is added to the oxide film 105. As the atmosphere containing oxygen, an atmosphere containing an oxidation gas such as oxygen, ozone, dinitrogen monoxide, or nitrogen dioxide can be given. Note that it is preferable that the oxide film 105 be exposed to plasma generated in a state where bias is applied on the substrate 101 side, because the amount of oxygen added to the oxide film 105 can be increased. As an example of an apparatus with which such plasma treatment is performed, an ashing apparatus is given.

Note that in the case where oxygen is added to the oxide film 105, it is preferable that oxygen be added to the oxide film 105 so that a peak of the concentration profile of oxygen ions can be positioned in the oxide film 105. Alternatively, oxygen may be added to the oxide film 105 and the oxide insulating film 103 functioning as a base insulating film so that a peak of the concentration profile of oxygen ions can be positioned in the oxide insulating film 103 functioning as a base insulating film.

Here, oxygen ions are added with a dose of $2\times10^{16}/cm^2$ to the oxide film 105 by an ion implantation method at an accelerating voltage of 5 keV.

Figure 2B:
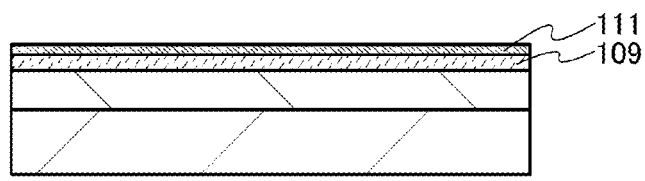

Through the above steps, the oxide film 109 to which oxygen is added in FIG. 2B can be formed. As a result, the number of oxygen vacancies in the oxide film 109 can be reduced by heat treatment in a later step. In the oxide film 109 to which oxygen is added, oxygen whose amount is larger than that of oxygen satisfying the stoichiometric composition is preferably contained. Further, the oxide film 109 to which oxygen is added has a low film density compared with the oxide film 105 to which oxygen has not been added yet.

After the oxide semiconductor film 111 is formed over the oxide film 109 to which oxygen is added as illustrated in FIG. 2B, heat treatment is performed to transfer part of oxygen in the oxide film 109 to the oxide semiconductor film 111, so that oxygen vacancies in the oxide semiconductor film 111 can be reduced. Further, oxygen vacancies in the oxide film 109 can be reduced.

The oxide semiconductor film 111 can be formed by a sputtering method, a coating method, a pulsed laser deposition method, a laser ablation method, or the like.

When the oxide semiconductor film 111 is formed, as a power supply device for generating plasma, an RF power supply device, an AC power supply device, a DC power supply device, or the like can be used as appropriate.

As a sputtering gas, a rare gas (typically argon), an oxygen gas, or a mixed gas of a rare gas and oxygen is used as appropriate. In the case of using the mixed gas of a rare gas and oxygen, the proportion of oxygen is preferably higher than that of a rare gas.

Further, a target may be appropriately selected in accordance with the composition of the oxide semiconductor film 111.

Note that in the case where the oxide film 111 is formed by, for example, a sputtering method, the substrate temperature may be set to higher than or equal to 100° C. and lower than or equal to 450° C., preferably higher than or equal to 170° C. and lower than or equal to 350° C., and the oxide film 111 may be formed while being heated.

Here, as the oxide semiconductor film 111, a 15-nm-thick In—Ga—Zn oxide film (In:Ga:Zn=1:1:1) is formed by a sputtering method.

The temperature of heat treatment performed after formation of the oxide semiconductor film 111 is preferably within the range of temperatures at which oxygen is transferred from the oxide film 109 to which oxygen is added to the oxide semiconductor film 111. The temperature is typically higher than or equal to 250° C. and lower than the strain point of the substrate, preferably higher than or equal to 300° C. and lower than or equal to 550° C., further preferably higher than or equal to 350° C. and lower than or equal to 510° C.

The heat treatment is performed in an inert gas atmosphere containing nitrogen or a rare gas such as helium, neon, argon, xenon, or krypton. Further, after heat treatment performed in an inert gas atmosphere, heat treatment may be additionally performed in an oxygen atmosphere or a dry air atmosphere (air whose dew point is lower than or equal to −80° C., preferably lower than or equal to −100° C.). Note that it is preferable that hydrogen, water, and the like be not contained in an inert gas and oxygen, like the dry air, and the dew point is preferably lower than or equal to −80° C., further preferably lower than or equal to −100° C. The treatment time is 3 minutes to 24 hours.

In the heat treatment, instead of an electric furnace, any device for heating an object by heat conduction or heat radiation from a heating element such as a resistance heating element may be used. For example, a rapid thermal anneal (RTA) apparatus such as a gas rapid thermal anneal (GRTA) apparatus or a lamp rapid thermal anneal (LRTA) apparatus can be used. An LRTA apparatus is an apparatus for heating an object by radiation of light (an electromagnetic wave) emitted from a lamp such as a halogen lamp, a metal halide lamp, a xenon arc lamp, a carbon arc lamp, a high pressure sodium lamp, or a high pressure mercury lamp. A GRTA apparatus is an apparatus for heat treatment using a high-temperature gas. As the high-temperature gas, an inert gas such as nitrogen or a rare gas like argon is used.

Here, after heat treatment is performed at 450° C. for 1 hour in a nitrogen atmosphere, heat treatment is performed at 450° C. for 1 hour in an oxygen atmosphere.

By the heat treatment, part of oxygen in the oxide film 109 to which oxygen is added is transferred to the oxide semiconductor film 111, so that the number of oxygen vacancies in the oxide semiconductor film 111 is reduced. Alternatively, by the heat treatment, part of oxygen in the oxide insulating film 103 functioning as a base insulating film and the oxide film 109 to which oxygen is added is transferred to the oxide semiconductor film 111, so that the number of oxygen vacancies in the oxide semiconductor film 111 is reduced. Further, in the oxide film 109 to which oxygen is added, the oxygen content is reduced by the heat treatment.

Through the above steps, the number of oxygen vacancies in the oxide semiconductor film can be reduced. Thus, the multilayer film including the oxide semiconductor film with a reduced density of localized levels can be formed.

Note that the heat treatment may be performed in a later step, not this step. In other words, in another heating step performed later, part of oxygen in the oxide film 109 to which oxygen is added may be transferred to the oxide semiconductor film 111. In this case, the number of heating steps can be reduced.

Figure 2C:
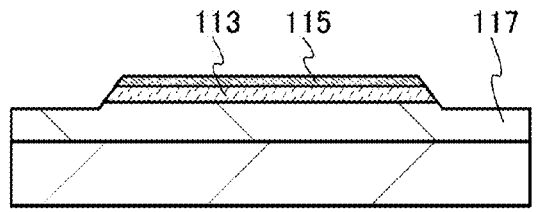

Then, after a mask is formed over the oxide semiconductor film 111 by a photolithography process, the oxide film 109 and the oxide semiconductor film 111 are each partly etched using the mask. Accordingly, the oxide film 113 and the oxide semiconductor film 115 are formed as illustrated in FIG. 2C. After that, the mask is removed. Note that in the etching step, the oxide insulating film 103 is partly etched in some cases. Here, the oxide insulating film 103 which is partly etched is referred to as the oxide insulating film 117.

Figure 2D:
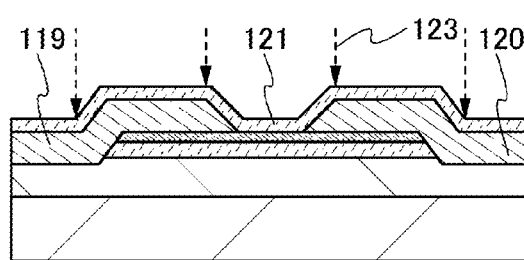
Figure 2E:
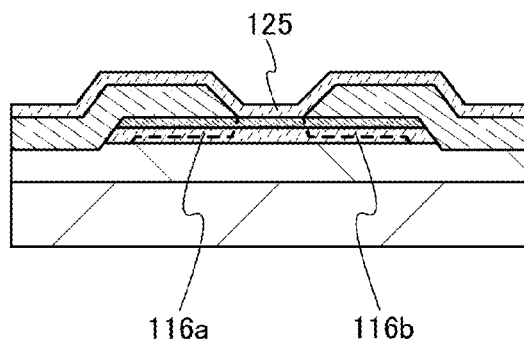

Next, as illustrated in FIG. 2D, the pair of electrodes 119 and 120 is formed over the oxide semiconductor film 115. After an oxide film 121 is formed over the oxide semiconductor film 115 and the pair of electrodes 119 and 120, oxygen 123 is added to the oxide film 121. Consequently, the oxide film 125 to which oxygen is added can be formed as illustrated in FIG. 2E. Further, by heat treatment in a later step, the number of oxygen vacancies in the oxide film 125 can be reduced.

Next, heat treatment is performed to make part of oxygen in the oxide film 125 transfer to the oxide semiconductor film 115, so that oxygen vacancies in the oxide semiconductor film 115 can be further reduced. Further, oxygen vacancies in the oxide film 125 can be reduced.

A method for forming the pair of electrodes 119 and 120 is described below. First, a conductive film is formed by a sputtering method, a CVD method, an evaporation method, or the like. Then, a mask is formed over the conductive film by a photolithography process. Next, the conductive film is etched with use of the mask to form the pair of electrodes 119 and 120. After that, the mask is removed.

Here, a 50-nm-thick titanium film, a 400-nm-thick aluminum film, and a 100-nm-thick titanium film are sequentially stacked by a sputtering method. Next, a mask is formed over the titanium film by a photolithography process and the titanium film, the aluminum film, and the titanium film are subjected to dry etching with use of the mask to form the pair of electrodes 119 and 120.

After the pair of electrodes 119 and 120 is formed, cleaning treatment is preferably performed to remove an etching residue. A short circuit of the pair of electrodes 119 and 120 can be suppressed by this cleaning treatment. The cleaning treatment can be performed using an alkaline solution such as a tetramethylammonium hydroxide (TMAH) solution, or an acidic solution such as diluted hydrofluoric acid, an oxalic acid solution, or a phosphorus acid solution.

The oxide film 121 can be formed in a manner similar to that of the oxide film 105. Further, a method for adding the oxygen 123 to the oxide film 121 can be similar to the method for adding the oxygen 107 to the oxide film 105.

Here, as the oxide film 121, a 5-nm-thick In—Ga—Zn oxide film (In:Ga:Zn=1:□:□) is formed by a sputtering method.

In the transistor 100, by providing the oxide film 125 in which oxygen vacancies are less likely to occur, release of oxygen from side surfaces of the oxide semiconductor film 115 is suppressed, so that generation of oxygen vacancies can be suppressed. Accordingly, the transistor can have improved electric characteristics and high reliability.

The temperature of heat treatment performed after oxygen is added to the oxide film 105 is preferably within the range of temperatures at which oxygen is transferred from the oxide film 125 to which oxygen is added to the oxide semiconductor film 115. The heat treatment can be performed in a manner similar to that of the heat treatment by which oxygen is transferred from the oxide film 109 to which oxygen is added to the oxide semiconductor film 111 in FIG. 2B.

Here, after heat treatment is performed at 450° C. for 1 hour in a nitrogen atmosphere, heat treatment is performed at 450° C. for 1 hour in a dry-air atmosphere.

By the heat treatment, part of oxygen in the oxide film 125 can be transferred to the oxide semiconductor film 115, so that the number of oxygen vacancies in the oxide semiconductor film 115 can be reduced. Further, oxygen vacancies in the oxide film 125 can be reduced. Note that since the oxide semiconductor film 115 in contact with the oxide film 125 between the pair of electrodes 119 and 120 serves as a channel region here, by reducing oxygen vacancies with use of oxygen transferred from the oxide film 125 to the oxide semiconductor film 115, reliability of electric characteristics of the transistor is further increased.

By the heat treatment, the source and drain regions 116a and 116b are formed in the oxide semiconductor film 115 because a tungsten film is used as the pair of electrodes 119 and 120 in this embodiment.

Note that the heat treatment may be performed in a later step, not this step. In other words, in another heating step performed later, part of oxygen in the oxide film 125 to which oxygen is added may be transferred to the oxide semiconductor film 115. In this case, the number of heating steps can be reduced.

Figure 3A:
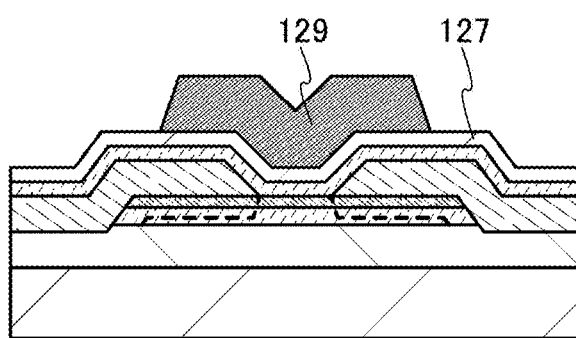
FIGS. 3A and 3B are cross-sectional views illustrating one embodiment of a method for manufacturing a semiconductor device.

Next, as illustrated in FIG. 3A, the gate insulating film 127 is formed over the oxide film 125. Then, the gate electrode 129 is formed in a region which is over the gate insulating film 127 and overlaps with the oxide semiconductor film 115.

The gate insulating film 127 can be formed by any of a variety of deposition methods such as a CVD method and a sputtering method.

Here, as the gate insulating film 127, a 20-nm-thick silicon oxynitride film is formed by a CVD method.

A method for forming the gate electrode 129 is described below. First, a conductive film is formed by a sputtering method, a CVD method, an evaporation method, or the like. Then, a mask is formed over the conductive film by a photolithography process. Then, part of the conductive film is etched using the mask to form the gate electrode 129. After that, the mask is removed.

Note that the gate electrode 129 may be formed by an electrolytic plating method, a printing method, an inkjet method, or the like, instead of the above formation method.

Here, a 15-nm-thick tantalum nitride film and a 135-nm-thick tungsten film are formed in this order by a sputtering method. Next, a mask is formed by a photolithography process, and the tantalum nitride film and the tungsten film are subjected to dry etching with use of the mask to form the gate electrode 129.

Figure 3B:
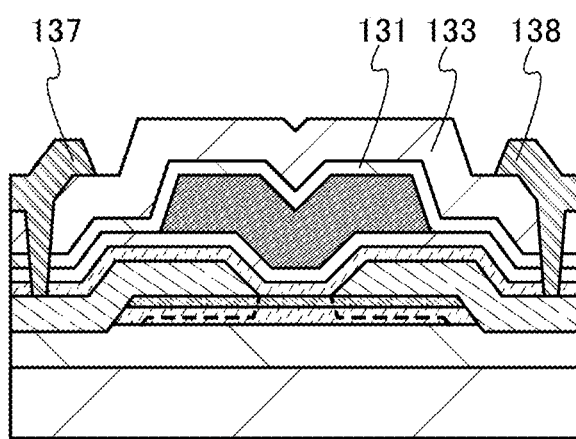

After heat treatment is performed, the insulating film 131 and the insulating film 133 are stacked in this order over the gate insulating film 127 and the gate electrode 129 as illustrated in FIG. 3B. After openings are formed in the insulating film 131 and the insulating film 133, the wirings 137 and 138 are formed.

The insulating film 131 and the insulating film 133 can be formed by a sputtering method, a CVD method, or the like as appropriate.

The heat treatment is performed typically at a temperature higher than or equal to 150° C. and lower than the strain point of the substrate, preferably higher than or equal to 250° C. and lower than or equal to 500° C., more preferably higher than or equal to 300° C. and lower than or equal to 450° C.

In this embodiment, a 300-nm-thick silicon oxynitride film is formed by a plasma CVD method as the insulating film 131, and a 50-nm-thick silicon nitride film is formed by a sputtering method as the insulating film 133. Further, heat treatment is performed at 350° C. for 1 hour in an atmosphere of nitrogen and oxygen.

The wirings 137 and 138 can be formed in a manner similar to that of the pair of electrodes 119 and 120. Alternatively, the wirings 137 and 138 can be formed by a damascene method.

Through the above steps, the density of localized levels of the multilayer film including the oxide semiconductor film is reduced, and a transistor with excellent electric characteristics can be manufactured. In addition, a highly reliable transistor in which a change in electric characteristics with time or a variation in electric characteristics due to a stress test is small can be manufactured.

<Band Structure>

Here, the band structure along dashed-dotted line E-F in the vicinity of the multilayer film 116 in FIG. 1B is described with reference to FIG. 4A, and the flow of carrier in the transistor 100 is described with reference to FIG. 4B.

Figure 4A:
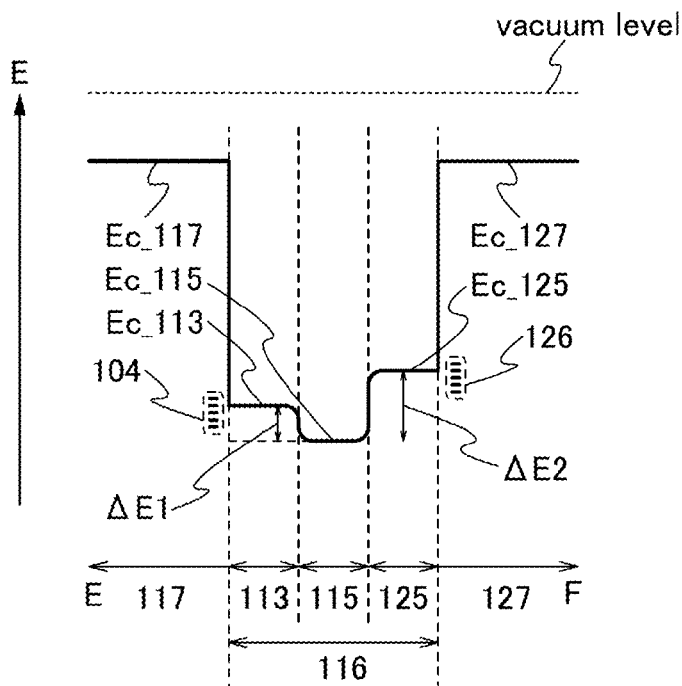
FIGS. 4A and 4B are diagrams illustrating a band structure of a transistor.
Figure 4B:
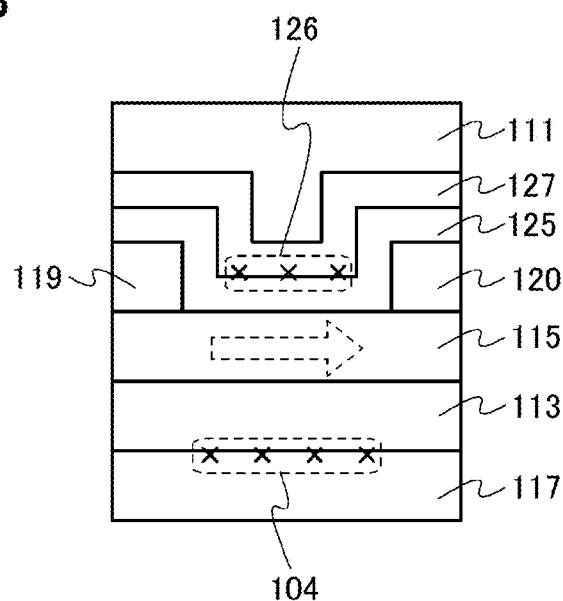

In the band structure shown in FIG. 4A, for example, In—Ga—Zn oxides with energy gaps of 3.5 eV, 3.2 eV, and 3.8 eV are used as the oxide film 113, the oxide semiconductor film 115, and the oxide film 125, respectively. Note that the energy gap can be measured using a spectroscopic ellipsometer.

The energy difference between the vacuum level and the valence band top (also referred to as ionization potential) of the oxide film 113, the energy difference therebetween of the oxide semiconductor film 115, and the energy difference therebetween of the oxide film 125 are 8.0 eV, 7.9 eV, and 8.0 eV, respectively. Note that the energy difference between the vacuum level and the valence band top can be measured using an ultraviolet photoelectron spectroscopy (UPS) device (VersaProbe manufactured by ULVAC-PHI, Inc.).

Further, the bottom of the conduction band of the oxide film 113 is denoted by Ec_113, the bottom of the conduction band of the oxide semiconductor film 115 is denoted by Ec_115, and the bottom of the conduction band of the oxide film 125 is denoted by Ec_125. The bottom of the conduction band of the oxide insulating film 117 is denoted by Ec_117 and the bottom of the conduction band of the gate insulating film 127 is denoted by Ec_127.

The energy difference between the vacuum level and the bottom of the conduction band (also referred to as electron affinity) of the oxide film 113, the energy difference therebetween of the oxide semiconductor film 115, and the energy difference therebetween of the oxide film 125 are 4.5 eV, 4.7 eV, and 4.2 eV, respectively. Note that an energy difference between the vacuum level and the bottom of the conduction band (also referred to as electron affinity) corresponds to a value obtained by subtracting an energy gap from an energy difference between the vacuum level and the top of the valence band (also referred to as ionization potential).

As shown in FIG. 4A, in the multilayer film 116, the bottom of the conduction band in the vicinity of the interface between the oxide film 113 and the oxide semiconductor film 115 and the bottom of the conduction band in the vicinity of the interface between the oxide semiconductor film 115 and the oxide film 125 vary continuously. That is, there is no barrier in the vicinity of the interface between the oxide film 113 and the oxide semiconductor film 115 and in the vicinity of the interface between the oxide semiconductor film 115 and the oxide film 125, and the bottom of the conduction band smoothly varies. A structure having such a bottom of the conduction band can also be referred to as a U-shaped well (U-shape well) structure. Such a shape is caused by mutual transfer of oxygen between the oxide film 113 and the oxide semiconductor film 115 and between the oxide film 125 and the oxide semiconductor film 115. Further, in the multilayer film 116, an energy of the bottom of the conduction band of the oxide semiconductor film 115 is lowest, and this region functions as a channel region.

Since the oxide film 113 is an oxide film containing one or more kinds of metal elements forming the oxide semiconductor film 115, the multilayer film 116 can also be referred to as a multilayer film in which films containing the same main components are stacked. The layers of the multilayer film, which contain the same main components and are stacked, are not simply stacked but formed to have continuous junction (here, particularly a U-shaped well structure where the energy of the bottom of the conduction band is continuously changed between the layers). This is because when impurities which form a defect level such as a trapping center or a recombination center are mixed at each interface, the continuity of the energy band is lost, and thus carriers are trapped or disappear by recombination at the interface.

In order to form a continuous junction, the layers need to be stacked successively without exposure to the air with the use of a multi-chamber deposition apparatus (e.g., a sputtering apparatus) including a load lock chamber.

Now, a state where electrons serving as carrier flow is described with reference to FIG. 4B. Note that in FIG. 4B, the number of electrons flowing in the oxide semiconductor film 115 is represented by a dotted arrow.

In the vicinity of the interface between the oxide insulating film 117 and the oxide film 113, trap levels 104 are formed by an impurity and defects. In addition, in the vicinity of the interface between the oxide film 125 and the gate insulating film 127, trap levels 126 are formed by an impurity and defects. In the multilayer film 116 in this embodiment, the oxide film 113 is provided between the oxide semiconductor film 115 and the oxide insulating film 117; thus, there is a distance between the oxide semiconductor film 115 and the trap levels 104. In addition, the oxide film 125 is provided between the oxide semiconductor film 115 and the gate insulating film 127; thus, there is a distance between the oxide semiconductor film 115 and the trap levels 126. As a result, electrons flowing in the oxide semiconductor film 115 are less likely to be captured by the trap levels 104 and 126. Accordingly, the amount of on-state current of the transistor can be increased, and the field-effect mobility can be increased. When the electrons are captured by the trap levels 104 and 126, the electrons become negative fixed charges. As a result, a threshold voltage of the transistor fluctuates. However, by the distance between the oxide semiconductor film 115 and the trap levels 104 and 126, capture of the electrons by the trap levels 104 and 126 can be reduced, and accordingly a fluctuation of the threshold voltage can be reduced.

Note that when the energy difference $\Delta E1$ of the bottom of the conduction band in the vicinity of the interface between the oxide film 113 and the oxide semiconductor film 115 and the energy difference $\Delta E2$ of the bottom of the conduction band in the vicinity of the interface between the oxide semiconductor film 115 and the oxide film 115 are each small, carrier flowing in the oxide semiconductor film 115 transcends the bottom of the conduction band of each of the oxide film 113 and the oxide film 125, and is captured by the trap levels 104 and 126. Thus, each of the energy difference $\Delta E1$ of the bottom of the conduction band between the oxide film 113 and the oxide semiconductor film 115 and the energy difference $\Delta E2$ of the bottom of the conduction band between the oxide semiconductor film 115 and the oxide film 125 is greater than or equal to 0.1 eV, preferably greater than or equal to 0.15 eV.

Note that when an oxide film is provided between the oxide semiconductor film 115 serving as a channel region and the pair of electrodes 119 and 120, the oxide film serves as resistance, so that the on-state current and the field-effect mobility of the transistor are decreased. However, since in the transistor 100 in this embodiment, the oxide semiconductor film 115 serving as a channel region is directly in contact with the pair of electrodes 119 and 120 and the oxide film 125 is provided between the oxide semiconductor film 115 and the gate insulating film 127, contact resistance between the oxide semiconductor film 115 and the pair of electrodes 119 and 120 can be reduced and there is a distance between the oxide semiconductor film 115 and the trap levels 126; thus, the on-state current, the field-effect mobility, and the reliability of the transistor can be increased.

Although the energy difference ΔE1 is smaller than the energy difference ΔE2, the energy difference ΔE1 and the energy difference ΔE2 can be same or the energy difference ΔE1 can be larger than the energy difference ΔE2 by selecting, as appropriate, constituent elements and compositions of the oxide film 113, the oxide semiconductor film 115, and the oxide film 125 in accordance with the electric characteristics of the transistor.

<Modification Example 1>

As described above, in this embodiment, after the oxide semiconductor film 111 is formed as illustrated in FIG. 2B, part of oxygen in the oxide film 109 to which oxygen is added is transferred to the oxide semiconductor film 111 by performing heat treatment. Instead of this, by setting the film formation temperature of the oxide semiconductor film 111 to higher than or equal to 170° C. and lower than the strain point of the substrate, part of oxygen in the oxide film 109 to which oxygen is added can be transferred to the oxide semiconductor film 111 while the oxide semiconductor film 111 being formed. Thus, the number of steps can be reduced.

<Modification Example 2>

A transistor having a shape of the oxide film 125, which is provided between the pair of electrodes 119 and 120 and the gate insulating film 127, different from that of the transistor 100 in FIGS. 1A to 1D is described with reference to FIGS. 5A to 5C. Note that description of components that are the same as those in FIGS. 1A to 1D is omitted.

Figure 5A:
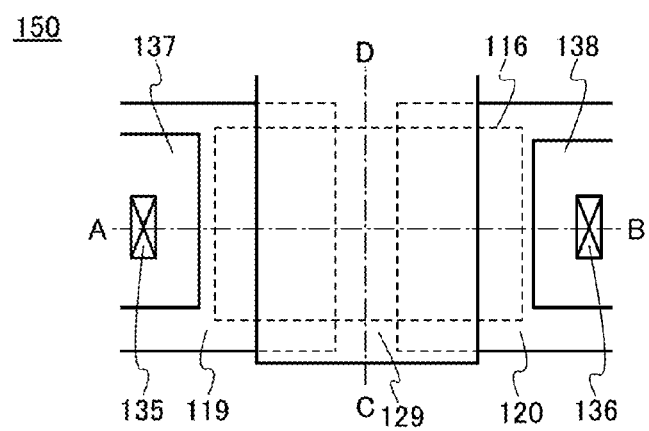
FIGS. 5A to 5C are a top view and cross-sectional views illustrating one embodiment of a semiconductor device.
Figure 5C:
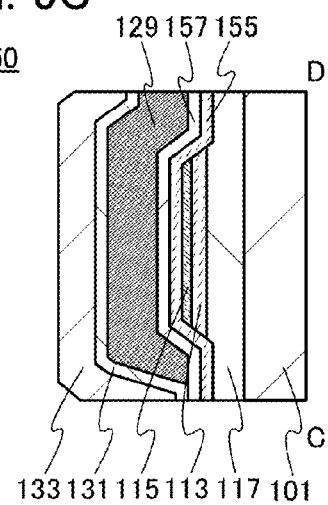
Figure 5B:
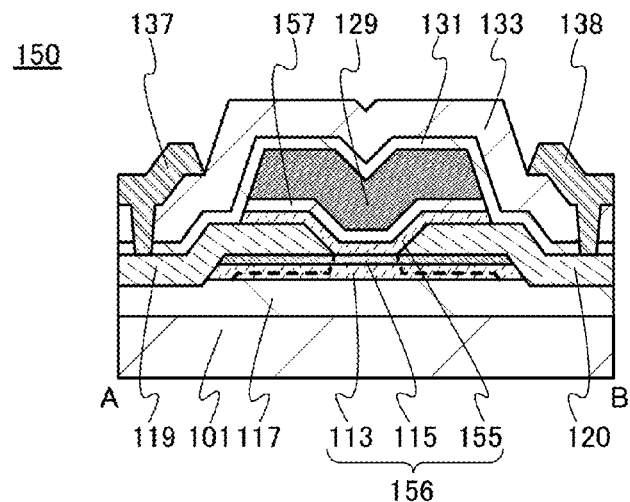

FIGS. 5A to 5C are a top view and cross-sectional views of a transistor 150 included in a semiconductor device. FIG. 5A is a top view of the transistor 150, FIG. 5B is a cross-sectional view taken along dashed-dotted line A-B in FIG. 5A, and FIG. 5C is a cross-sectional view taken along dashed-dotted line C-D in FIG. 5A. Note that in FIG. 5A, the substrate 101, an oxide film 155, a gate insulating film 157, the insulating film 131, the insulating film 133, and the like are not illustrated for simplicity.

The transistor 150 in FIGS. 5A to 5C is provided over the oxide insulating film 117 over the substrate 101. The transistor 150 includes the oxide film 113 over the oxide insulating film 117, the oxide semiconductor film 115 over the oxide film 113, the pair of electrodes 119 and 120 in contact with the oxide semiconductor film 115, the oxide film 155 in contact with the oxide insulating film 117, the oxide semiconductor film 115, and the pair of electrodes 119 and 120, the gate insulating film 157 in contact with the oxide film 155, and the gate electrode 129 overlapping with a multilayer film 156 with the gate insulating film 157 provided therebetween. Note that the oxide film 113, the oxide semiconductor film 115, and the oxide film 155 are collectively referred to as the multilayer film 156. The insulating film 131 covering the gate insulating film 157 and the gate electrode 129 and the insulating film 133 covering the insulating film 131 may be provided. In the openings 135 and 136 in the insulating film 131, and the insulating film 133, the wirings 137 and 138 in contact with the pair of electrodes 119 and 120 may be provided.

For the oxide film 155 and the gate insulating film 157, materials of the oxide film 125 and the gate insulating film 127 in the transistor 100 can be used as appropriate.

In the transistor in this embodiment, an edge portion of the oxide film 155 and an edge portion of the gate insulating film 157 are substantially aligned with an edge portion of the gate electrode 129. The oxide film 155 and the gate insulating film 157 having such shapes can be formed by forming the gate electrode 129 in FIG. 3A and etching the oxide film 125 and the gate insulating film 127 without an increase in the number of photomasks.

In the transistor 150, an etching residue generated at the time of forming the gate electrode 129 can be removed when the oxide film 155 and the gate insulating film 157 are formed; thus, leakage current generated between the gate electrode 129 and the wirings 137 and 138 can be reduced.

<Modification Example 3>

A transistor having the shape of the oxide film 125, which is provided between the pair of electrodes 119 and 120 and the gate insulating film 127, different from that of the transistor 100 in FIGS. 1A to 1D is described with reference to FIGS. 6A to 6C. Note that description of components that are the same as those in FIGS. 1A to 1D is omitted.

Figure 6A:
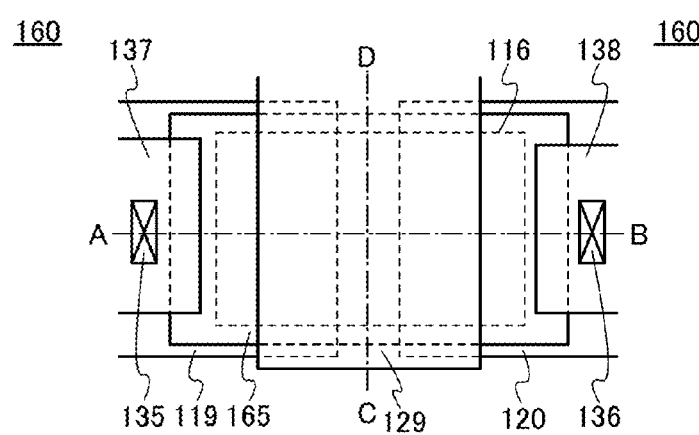
FIGS. 6A to 6C are a top view and cross-sectional views illustrating one embodiment of a semiconductor device.
Figure 6C:
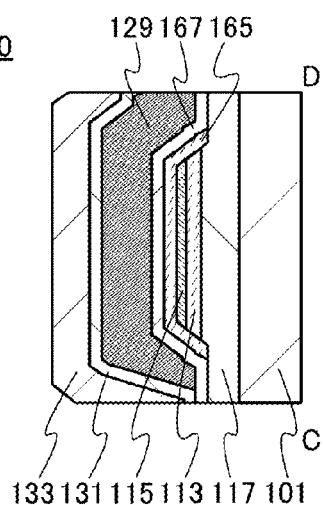
Figure 6B:
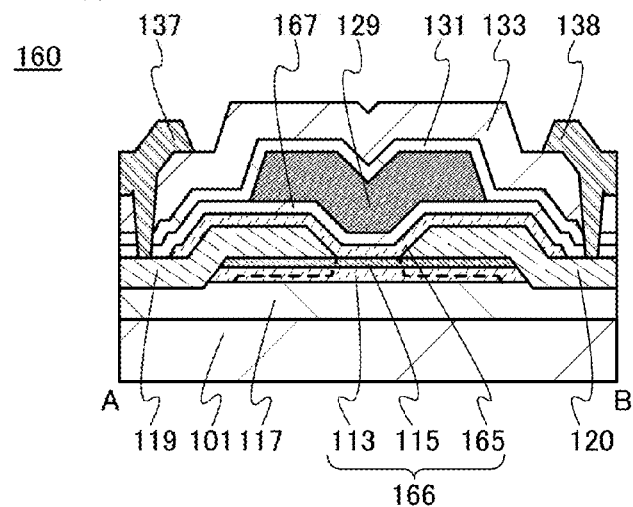

FIGS. 6A to 6C are a top view and cross-sectional views of a transistor 160 included in a semiconductor device. FIG. 6A is a top view of the transistor 160, FIG. 6B is a cross-sectional view taken along dashed-dotted line A-B in FIG. 6A, and FIG. 6C is a cross-sectional view taken along dashed-dotted line C-D in FIG. 6A. Note that in FIG. 6A, the substrate 101, a gate insulating film 167, the insulating film 131, the insulating film 133, and the like are not illustrated for simplicity.

The transistor 160 in FIGS. 6A to 6C is provided over the oxide insulating film 117 over the substrate 101. The transistor 160 includes the oxide film 113 over the oxide insulating film 117, the oxide semiconductor film 115 over the oxide film 113, the pair of electrodes 119 and 120 in contact with the oxide semiconductor film 115, an oxide film 165 in contact with the oxide insulating film 117, the oxide semiconductor film 115, and the pair of electrodes 119 and 120, the gate insulating film 167 in contact with the oxide film 165, and the gate electrode 129 overlapping with a multilayer film 166 with the gate insulating film 167 provided therebetween. Note that the oxide film 113, the oxide semiconductor film 115, and the oxide film 165 are collectively referred to as the multilayer film 166. The insulating film 131 covering the gate insulating film 167 and the gate electrode 129 and the insulating film 133 covering the insulating film 131 may be provided. In the openings 135 and 136 in the gate insulating film 167, the insulating film 131, and the insulating film 133, the wirings 137 and 138 in contact with the pair of electrodes 119 and 120 may be provided.

For the oxide film 165 and the gate insulating film 167, materials of the oxide film 125 and the gate insulating film 127 in the transistor 100 can be used as appropriate.

In the transistor in this embodiment, edge portions of the oxide film 165 are located over the pair of electrodes 119 and 120. The oxide film 165 can be formed in the following manner: a mask is formed over the oxide film 125 by a photolithography process in FIG. 3A before the gate insulating film 127 is etched, and then, the oxide film 125 is etched using the mask.

In the transistor 160, by providing the oxide film 165 in which oxygen vacancies are less likely to occur, release of oxygen from a side surface of the oxide semiconductor film 115 is suppressed, so that generation of oxygen vacancies can be suppressed. Accordingly, the transistor can have improved electric characteristics and high reliability.

<Modification Example 4>

A transistor having the multilayer film 116 different from that of the transistor 100 in FIGS. 1A to 1D is described with reference to FIGS. 7A to 7C. Note that description of components that are the same as those in FIGS. 1A to 1D is omitted.

Figure 7A:
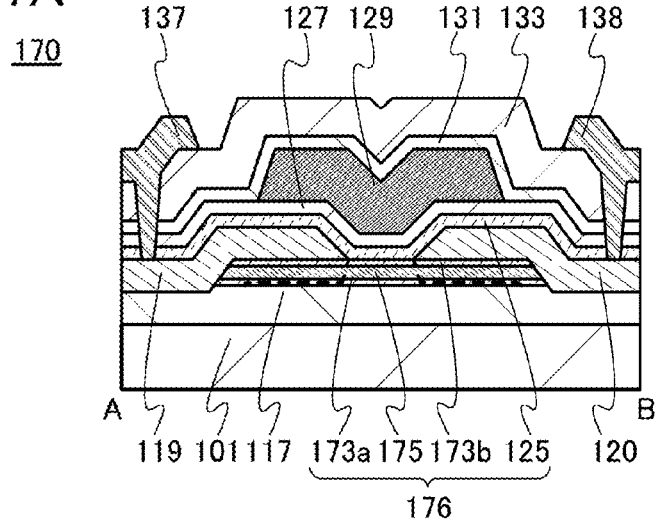
FIGS. 7A to 7C are cross-sectional views illustrating one embodiment of a semiconductor device.

A transistor 170 in FIG. 7A is provided over the oxide insulating film 117 over the substrate 101. The transistor 170 includes an oxide film 173a over the oxide insulating film 117, an oxide semiconductor film 175 over the oxide film 173a, an oxide film 173b over the oxide semiconductor film 175, the pair of electrodes 119 and 120 in contact with the oxide film 173b, the oxide film 125 in contact with the oxide insulating film 117, the oxide film 173b, and the pair of electrodes 119 and 120, the gate insulating film 127 in contact with the oxide film 125, and the gate electrode 129 overlapping with a multilayer film 176 with the gate insulating film 127 provided therebetween. Note that the oxide film 173a, the oxide semiconductor film 175, the oxide film 173b, and the oxide film 125 are collectively referred to as the multilayer film 176. The insulating film 131 covering the gate insulating film 127 and the gate electrode 129 and the insulating film 133 covering the insulating film 131 may be provided. In openings in the oxide film 125, the gate insulating film 127, the insulating film 131, and the insulating film 133, the wirings 137 and 138 in contact with the pair of electrodes 119 and 120 may be provided.

As each of the oxide film 173a and the oxide film 173b, an oxide film similar to the oxide film 113 in FIGS. 1A to 1D can be used as appropriate. Note that the oxide film 173a and the oxide film 173b may have the same constituent elements and the same composition or may have different constituent elements and different compositions.

Figure 7B:
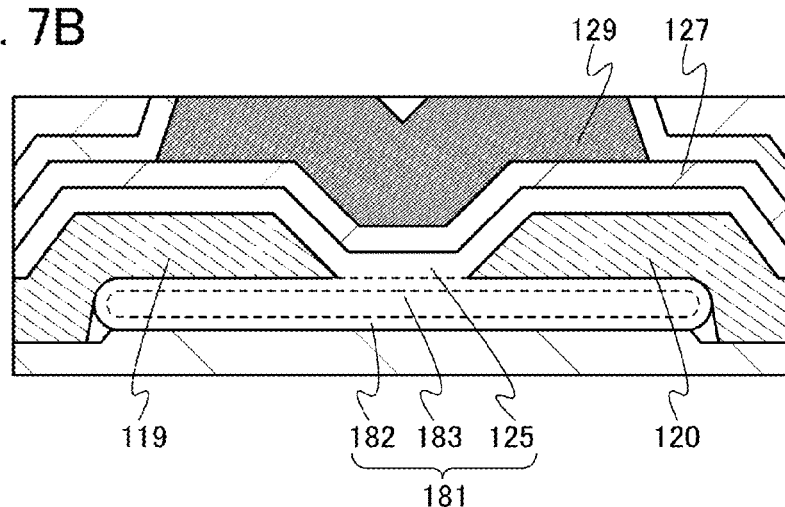
Figure 7C:
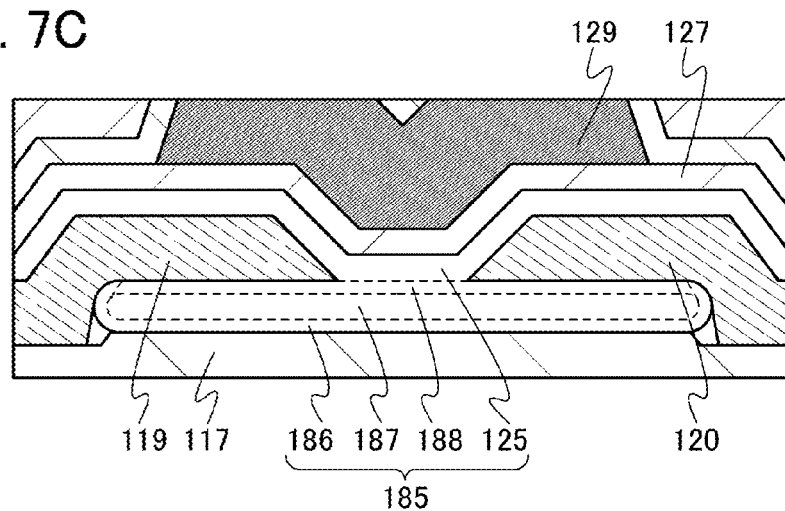

Although side surfaces of the oxide film 173a, the oxide semiconductor film 175, and the oxide film 173b are tapered as illustrated in FIG. 7A, they may be curved as illustrated in FIGS. 7B and 7C. FIGS. 7B and 7C are each an enlarged view of the vicinity of a multilayer film of a transistor.

In FIG. 7B, a multilayer film 181 includes an oxide semiconductor film 183, and an oxide film 182 and the oxide film 125 which have the same composition as that of the oxide semiconductor film 183. The side surfaces of the oxide semiconductor film 183 and the oxide film 182 are curved. As the oxide film 182, an oxide film similar to the oxide film 113 in FIGS. 1A to 1D can be used as appropriate. As the oxide semiconductor film 183, an oxide film similar to the oxide semiconductor film 115 in FIGS. 1A to 1D can be used as appropriate.

Regions of the oxide film 182, which cover the side surfaces of the oxide semiconductor film 183, are formed in such a manner that a reaction product of the oxide film generated in a dry etching step for forming the oxide semiconductor film 183 is attached to the side surfaces of the oxide semiconductor film 183. Note that the reaction product is attached by a sputtering phenomenon or through plasma at the time of the dry etching. The dry etching may be performed under conditions in which, for example, a boron trichloride gas and a chlorine gas are used as etching gases and inductively coupled plasma (ICP) power and substrate bias power are applied.

By providing the oxide film 182 in which oxygen vacancies are less likely to occur so as to be in contact with the side surfaces of the oxide semiconductor film 183, release of oxygen from the side surfaces of the oxide semiconductor film 183 is suppressed, so that generation of oxygen vacancies can be suppressed. Accordingly, the transistor can have improved electric characteristics and high reliability.

The multilayer film 185 illustrated in FIG. 7C includes an oxide film 186 provided between the oxide insulating film 117 and an oxide semiconductor film 187 and on the side surfaces of the oxide semiconductor film 187, the oxide semiconductor film 187, an oxide film 188 provided between the oxide semiconductor film 187 and the pair of electrodes 119 and 120 and between the oxide semiconductor film 187 and the oxide film 125, and the oxide film 125. The oxide film 186 is formed to be in contact with the side surfaces of the oxide semiconductor film 187, and side surfaces of regions provided on the side surfaces of the oxide semiconductor film 187 are curved. As each of the oxide film 186 and the oxide film 188, an oxide film similar to the oxide film 113 in FIGS. 1A to 1D can be used as appropriate. Note that the oxide film 186 and the oxide film 188 have different constituent elements or different compositions. As the oxide semiconductor film 187, an oxide film similar to the oxide semiconductor film 115 in FIGS. 1A to 1D can be used as appropriate.

Regions of the oxide film 186, which cover the side surfaces of the oxide semiconductor film 187, are formed in such a manner that an etching residue generated in a dry etching step for forming the oxide semiconductor film 187 is attached to the side surfaces of the oxide semiconductor film 187.

By providing the oxide film 186 in which oxygen vacancies are less likely to occur so as to be in contact with the side surfaces of the oxide semiconductor film 187, release of oxygen from the side surface of the oxide semiconductor film 187 is suppressed, so that generation of oxygen vacancies can be suppressed. Accordingly, the transistor can have improved electric characteristics and high reliability.

<Modification Example 5>

It is preferable that the oxide semiconductor film 115 of the transistor in this embodiment be highly purified by reducing the amount of impurities, which enables a transistor with excellent electric characteristics to be manufactured. Examples of the impurities include hydrogen, nitrogen, an alkali metal, and an alkaline earth metal.

Hydrogen contained in the oxide semiconductor reacts with oxygen bonded to a metal atom to be water, and also causes oxygen vacancies in a lattice from which oxygen is released (or a portion from which oxygen is released). In addition, the reaction of part of hydrogen and oxygen causes generation of electrons serving as carrier. Thus, a transistor including an oxide semiconductor which contains hydrogen is likely to be normally-on.

Accordingly, it is preferable that hydrogen be reduced as much as possible in the oxide semiconductor film 115. Specifically, the hydrogen concentration of the oxide semiconductor film 115, which is measured by secondary ion mass spectrometry (SIMS), is lower than $5\times10^{18}$ atoms/cm$^3$, preferably lower than or equal to $1\times10^{18}$ atoms/cm$^3$, further preferably lower than or equal to $5\times10^{17}$ atoms/cm$^3$, still further preferably lower than or equal to $1\times10^{16}$ atoms/cm$^3$.

As a method for reducing the hydrogen concentration of the oxide semiconductor film 115, in the case where an oxide semiconductor film is formed by a sputtering method, each chamber in the sputtering apparatus is preferably evacuated to be a high vacuum state (to the degree of about $5\times10^{-7}$ Pa to $1\times10^{-4}$ Pa) with an adsorption vacuum evacuation pump such as a cryopump in order to remove hydrogen or the like, which serves as an impurity against the oxide semiconductor film, as much as possible. Alternatively, a turbo molecular pump and a cold trap are preferably combined so as to prevent a backflow of a gas, especially a gas containing carbon or hydrogen from an exhaust system to the inside of the chamber.

In order to reduce the hydrogen concentration in the oxide semiconductor film 115, besides the high vacuum evacuation of the chamber, a highly purification of a sputtering gas is also needed. As an oxygen gas or an argon gas used as the sputtering gas, a gas that is highly purified to have a dew point of $-40°$ C. or lower, preferably $-80°$ C. or lower, more preferably $-100°$ C. or lower is used, so that entry of moisture or the like into the oxide semiconductor film can be prevented as much as possible.

As a method for reducing the hydrogen concentration in the oxide semiconductor film 115, heat treatment is performed to make oxygen transfer from the oxide film 109 to which oxygen is added to the oxide semiconductor film 111 in FIG. 2B, whereby the hydrogen concentration in each of the oxide semiconductor film 111 and the oxide semiconductor film 115 to be formed later can be reduced. In other words, in this embodiment, one heat treatment enables the number of the oxide vacancies in the oxide semiconductor film to be reduced and also enables the hydrogen concentration to be reduced.

Further, the concentration of alkali metals or alkaline earth metals in the oxide semiconductor film 115, which is measured by SIMS, is lower than or equal to $1\times10^{18}$ atoms/cm$^3$, preferably lower than or equal to $2\times10^{16}$ atoms/cm$^3$. When each of an alkali metal and an alkaline earth metal is bonded to an oxide semiconductor, a carrier might be generated, which might cause an increase in the off-state current of the transistor. Thus, it is preferable to reduce the concentration of alkali metals or alkaline earth metals in the oxide semiconductor film 115.

When a nitride insulating film is provided between the substrate 101 and the oxide insulating film 117, the concentration of alkali metals or alkaline earth metals in the oxide semiconductor film 115 can be reduced.

Further, when nitrogen is contained in the semiconductor film 115, electrons serving as carrier are generated and the carrier density increases, so that the oxide semiconductor film easily becomes n-type. Thus, a transistor including an oxide semiconductor which contains nitrogen is likely to be normally-on. For this reason, nitrogen in the oxide semiconductor film is preferably reduced as much as possible; the concentration of nitrogen is preferably set to, for example, lower than or equal to $5\times10^{18}$ atoms/cm$^3$.

When such an oxide semiconductor film highly purified by reducing impurities (such as hydrogen, nitrogen, an alkali metal, and an alkaline earth metal) as much as possible is used as the semiconductor film 115, the transistor can be prevented from being normally-on, so that the off-state current of the transistor can be significantly reduced. Accordingly, a semiconductor device having favorable electric characteristics can be manufactured. Further, a semiconductor device with improved reliability can be manufactured.

Various experiments can prove the low off-state current of a transistor including a highly purified oxide semiconductor film. For example, even when an element has a channel width (W) of $1\times10^6$ μm and a channel length (L) of 10 μm, the off-state current can be less than or equal to the measurement limit of a semiconductor parameter analyzer, i.e., less than or equal to $1\times10^{-13}$ A, at a voltage (drain voltage) between the source electrode and the drain electrode of 1 V to 10 V. In that case, it can be found that a value obtained by dividing the off-state current by the channel width of the transistor is less than or equal to 100 zA/μm. Further, the off-state current is measured with use of a circuit in which a capacitor and a transistor are connected to each other and charge that flows in or out from the capacitor is controlled by the transistor. In the measurement, a highly purified oxide semiconductor film is used for a channel region of the transistor, and the off-state current of the transistor is measured from a change in the amount of charge of the capacitor per unit time. As a result, it is found that in the case where the voltage between the source electrode and the drain electrode of the transistor is 3 V, a lower off-state current of several tens of yoctoamperes per micrometer (yA/μm) can be obtained. Thus, the transistor including the highly purified oxide semiconductor film has a significantly low off-state current.

<Modification Example 6>

In the transistor in this embodiment, the pair of electrodes 119 and 120 is provided between the oxide semiconductor film 115 and the oxide film 125; however, the pair of electrodes 119 and 120 may be provided between the oxide insulating film 117 and the oxide film 113.

<Modification Example 7>

An insulating film that can be used as the oxide insulating film 117 functioning as a base insulating film in this embodiment is described below.

The oxide insulating film 117 can be formed using an oxide insulating film whose oxygen content is in excess of that in the stoichiometric composition. In other words, an oxide insulating film from which part of contained oxygen is released by heating can be formed. With use of such a film, the oxygen in the oxide insulating film 117 is transferred to the oxide semiconductor film 115; thus, the density of defect levels at the interface between the oxide insulating film 117 and the oxide film 113 can be reduced, and oxygen vacancies can be further reduced by filling oxygen vacancies in the oxide semiconductor film 115. For example, when an oxide insulating film having the following feature is used, the density of defect levels at the interface between the oxide insulating film 117 and the oxide film 113 can be decreased and oxygen vacancies in the oxide semiconductor film 115 can be further reduced. The feature of the oxide insulating film is that the number of oxygen molecules released from the oxide insulating film by heat treatment at a temperature higher than or equal to $100°$ C. and lower than or equal to $700°$ C., preferably higher than or equal to $100°$ C. and lower than or equal to $500°$ C. is greater than or equal to $1.0\times10^{18}$ molecules/cm$^3$ when measured by thermal desorption spectroscopy (hereinafter referred to as TDS spectroscopy).

In the case where an oxide insulating film containing nitrogen, such as a silicon oxynitride film or a silicon nitride oxide film, is used as the oxide insulating film 117, the nitrogen concentration measured by SIMS is higher than or equal to the lower limit of measurement by SIMS and lower than $3\times10^{20}$ atoms/cm$^3$, preferably higher than or equal to $1\times10^{18}$ atoms/cm$^3$ and lower than or equal to $1\times10^{20}$ atoms/cm$^3$. With use of such a film, the amount of nitrogen transferred to the oxide semiconductor film 115 in the transistor can be small. In addition, the number of defects in the oxide insulating film containing nitrogen itself can be reduced.

The oxide insulating film containing oxygen in excess of the stoichiometric composition can be formed by a CVD method, a sputtering method, or the like. Alternatively, after the oxide insulating film is formed by a CVD method, a sputtering method, or the like, oxygen may be added to the oxide insulating film by an ion implantation method, an ion doping method, plasma treatment, or the like.

<Modification Example 8>

Insulating films which can be used for the insulating film 131 and the insulating film 133 described in this embodiment are described below.

In the case where the insulating film 131 and the insulating film 133 are oxide insulating films, an oxide insulating film containing oxygen in excess of the stoichiometric composition described in Modification Example 7 may be used as one or both of the insulating film 131 and the insulating film 133. With use of such a film, the oxygen in the insulating film is transferred to the oxide semiconductor film, and oxygen vacancies are filled with the oxygen, so that oxygen vacancies can be further reduced.

As one or both of the insulating film 131 and the insulating film 133, a nitride insulating film where the hydrogen content is low may be provided. The nitride insulating film is as follows, for example: the number of hydrogen molecules released from the nitride insulating film is less than $5.0 \times 10^{21}$ atoms/cm$^3$, preferably less than $3.0 \times 10^{21}$ atoms/cm$^3$, further preferably less than $1.0 \times 10^{21}$ atoms/cm$^3$ when measured by TDS spectroscopy in which heat treatment is performed at a film surface temperature of higher than or equal to 100° C. and lower than or equal to 700° C., preferably higher than or equal to 100° C. and lower than or equal to 500° C.

The nitride insulating film has a thickness large enough to prevent entry of impurities such as hydrogen and water from the outside. For example, the thickness can become greater than or equal to 50 nm and less than or equal to 200 nm, preferably greater than or equal to 50 nm and less than or equal to 150 nm, further preferably greater than or equal to 50 nm and less than or equal to 100 nm.

In the case where a nitride insulating film with a low hydrogen content is used as the nitride insulating film, the nitride insulating film can be formed under the following formation conditions. Here, as the nitride insulating film, a silicon nitride film is formed. As for the formation conditions, the substrate placed in a treatment chamber of a plasma CVD apparatus, which is vacuum-evacuated, is held at a temperature higher than or equal to 180° C. and lower than or equal to 400° C., preferably higher than or equal to 200° C. and lower than or equal to 370° C., a source gas is introduced into the treatment chamber, the pressure in the treatment chamber is greater than or equal to 100 Pa and less than or equal to 250 Pa, preferably greater than or equal to 100 Pa and less than or equal to 200 Pa, and high frequency power is supplied to an electrode provided in the treatment chamber.

As the source gas of the nitride insulating film, a deposition gas containing silicon, a nitrogen gas, and an ammonia gas are preferably used. Typical examples of the deposition gas containing silicon include silane, disilane, trisilane, and silane fluoride. Further, the flow rate of nitrogen is preferably 5 times to 50 times that of ammonia, further preferably 10 times to 50 times that of ammonia. The use of ammonia as the source gas facilitates decomposition of nitrogen and the deposition gas containing silicon. This is because ammonia is dissociated by plasma energy or heat energy, and energy generated by the dissociation contributes to decomposition of a bond of the deposition gas molecules containing silicon and a bond of nitrogen molecules. Under the above conditions, a silicon nitride film which has a low hydrogen content and can suppress entry of impurities such as hydrogen and water from the outside can be formed.

<Modification Example 9>

Although the variety of films such as the oxide semiconductor film and the inorganic insulating film which are described in the above embodiment and the modification examples can be formed by a sputtering method or a plasma CVD method, such films may be formed by another method, e.g., a thermal CVD method. A metal organic chemical vapor deposition (MOCVD) method or an atomic layer deposition (ALD) method may be employed as an example of a thermal CVD method.

A thermal CVD method has an advantage that no defect due to plasma damage is generated since it does not utilize plasma for forming a film.

Deposition by a thermal CVD method may be performed in such a manner that the pressure in a chamber is set to an atmospheric pressure or a reduced pressure, and a source gas and an oxidizer are supplied to the chamber at a time and react with each other in the vicinity of the substrate or over the substrate.

Deposition by an ALD method may be performed in such a manner that the pressure in a chamber is set to an atmospheric pressure or a reduced pressure, source gases for reaction are sequentially introduced into the chamber, and then the sequence of the gas introduction is repeated. For example, two or more kinds of source gases are sequentially supplied to the chamber by switching respective switching valves (also referred to as high-speed valves). For example, a first source gas is introduced, an inert gas (e.g., argon or nitrogen) or the like is introduced at the same time as or after the introduction of the first gas so that the source gases are not mixed, and then a second source gas is introduced. Note that in the case where the first source gas and the inert gas are introduced at a time, the inert gas serves as a carrier gas, and the inert gas may also be introduced at the same time as the introduction of the second source gas. Alternatively, the first source gas may be exhausted by vacuum evacuation instead of the introduction of the inert gas, and then the second source gas may be introduced. The first source gas is adsorbed on the surface of the substrate to form a first single-atomic layer; then the second source gas is introduced to react with the first single-atomic layer; as a result, a second single-atomic layer is stacked over the first single-atomic layer, so that a thin film is formed. The sequence of the gas introduction is repeated plural times until a desired thickness is obtained, whereby a thin film with excellent step coverage can be formed. The thickness of the thin film can be adjusted by the number of repetitions times of the sequence of the gas introduction; therefore, an ALD method makes it possible to accurately adjust a thickness and thus is suitable for manufacturing a minute FET.

The variety of films such as the oxide semiconductor film and the organic insulating film which are described in the above embodiment can be formed by a thermal CVD method such as an MOCVD method or an ALD method. For example, in the case where an InGaZnO$_X$ (X>0) film is formed, trimethylindium, trimethylgallium, and diethylzinc are used. Note that the chemical formula of trimethylindium is In(CH$_3$)$_3$. The chemical formula of trimethylgallium is Ga(CH$_3$)$_3$. The chemical formula of diethylzinc is Zn(CH$_3$)$_2$. Without limitation to the above combination, triethylgallium (chemical formula: Ga(C$_2$H$_5$)$_3$) can be used instead of trimethylgallium and dimethylzinc (chemical formula: Zn(C$_2$H$_5$)$_2$) can be used instead of diethylzinc.

For example, in the case where a hafnium oxide film is formed, two kinds of gases, i.e., ozone ($O_3$) as an oxidizer and a source gas which is obtained by vaporizing a solvent and liquid containing a hafnium precursor compound (a hafnium alkoxide solution, typically tetrakis(dimethylamide)hafnium (TDMAH)) are used. Note that the chemical formula of tetrakis(dimethylamide)hafnium is $Hf[N(CH_3)_2]_4$. Examples of another material liquid include tetrakis(ethylmethylamide)hafnium.

For example, in the case where an aluminum oxide film is formed, two kinds of gases, e.g., $H_2O$ as an oxidizer and a source gas which is obtained by vaporizing a solvent and liquid containing an aluminum precursor compound (e.g., trimethylaluminum (TMA)) are used. Note that the chemical formula of trimethylaluminum is $Al(CH_3)_3$. Examples of another material liquid include tris(dimethylamide)aluminum, triisobutylaluminum, and aluminum tris(2,2,6,6-tetramethyl-3,5-heptanedionate).

For example, in the case where a silicon oxide film is formed, hexadichlorosilane is adsorbed on a surface where a film is to be formed, chlorine contained in the adsorbate is removed, and radicals of an oxidizing gas (e.g., $O_2$ or dinitrogen monoxide) are supplied to react with the adsorbate.

For example, an oxide semiconductor film, e.g., an $InGaZnO_X$ (X>0) film is formed using a deposition apparatus employing ALD, an $In(CH_3)_3$ gas and an $O_3$ gas are sequentially introduced plural times to form an $InO_2$ layer, a $Ga(CH_3)_3$ gas and an $O_3$ gas are introduced at a time to form a GaO layer, and then a $Zn(CH_3)_2$ gas and an $O_3$ gas are introduced at a time to form a ZnO layer. Note that the order of these layers is not limited to the this example. A mixed compound layer such as an $InGaO_2$ layer, an $InZnO_2$ layer, a GaInO layer, a ZnInO layer, or a GaZnO layer may be formed by mixing of these gases. Note that although an $H_2O$ gas which is obtained by bubbling with an inert gas such as Ar may be used instead of an $O_3$ gas, it is preferable to use an $O_3$ gas, which does not contain H. Further, instead of an $In(CH_3)_3$ gas, an $In(C_2H_5)_3$ gas may be used. Instead of a $Ga(CH_3)_3$ gas, a $Ga(C_2H_5)_3$ gas may be used. Instead of an $In(CH_3)_3$ gas, an $In(C_2H_5)_3$ may be used. Furthermore, a $Zn(CH_3)_2$ gas may be used.

Note that the structures, methods, and the like described in this embodiment can be used as appropriate in combination with any of the structures, methods, and the like described in the other embodiments and examples.

(Embodiment 2)

In this embodiment, a structure and a manufacturing method of a bottom-gate transistor are described with reference to FIGS. 8A to 8D and FIGS. 9A to 9E.

<Structural Example of Semiconductor Device>

Figure 8A:
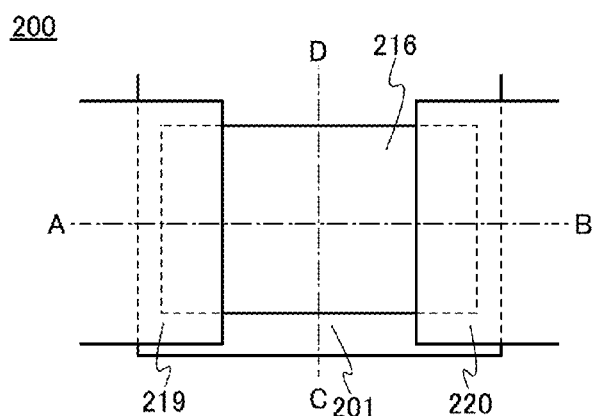
FIGS. 8A to 8D are a top view and cross-sectional views illustrating one embodiment of a semiconductor device.
Figure 8C:
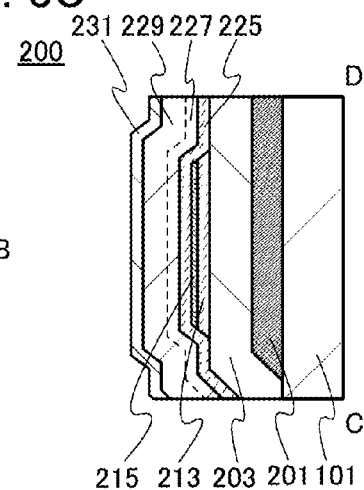
Figure 8B:
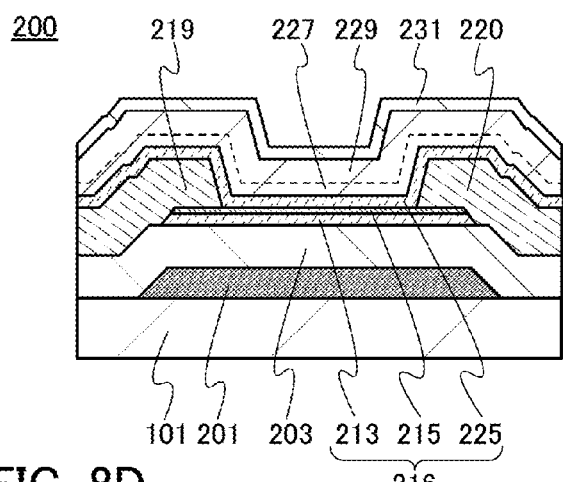
Figure 8D:
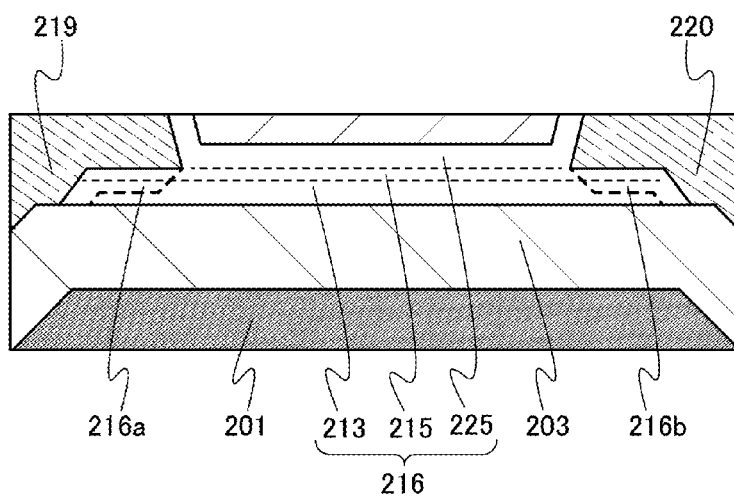

FIGS. 8A to 8D are a top view and cross-sectional views of a transistor 200 included in a semiconductor device. FIG. 8A is a top view of the transistor 200, FIG. 8B is a cross-sectional view taken along dashed-dotted line A-B in FIG. 8A, FIG. 8C is a cross-sectional view taken along dashed-dotted line C-D in FIG. 8A, and FIG. 8D is an enlarged view of the vicinity of a multilayer film in FIG. 8B. Note that in FIG. 8A, the substrate 101, a gate insulating film 203, an oxide film 225, an insulating film 227, an insulating film 229, an insulating film 231, and the like are not illustrated for simplicity.

The transistor 200 illustrated in FIGS. 8A to 8D includes a gate electrode 201 over the substrate 101. The transistor 200 includes the gate insulating film 203 over the substrate 101 and the gate electrode 201, an oxide film 213 overlapping with the gate electrode 201 with the gate insulating film 203 provided therebetween, an oxide semiconductor film 215 over the oxide film 213, and a pair of electrodes 219 and 220 in contact with the oxide semiconductor film 215. Further, the oxide film 225 is provided over the gate insulating film 203, the oxide semiconductor film 215, and the pair of electrodes 219 and 220. Note that the oxide film 213, the oxide semiconductor film 215, and the oxide film 225 are collectively referred to as a multilayer film 216. The insulating film 227, the insulating film 229, and the insulating film 231 are formed over the oxide film 225.

As the gate electrode 201 and the gate insulating film 203, the gate electrode 129 and the gate insulating film 127 which are described in Embodiment 1 can be used, respectively, as appropriate.

As the oxide film 213, the oxide semiconductor film 215, and the oxide film 225 which are included in the multilayer film 216, the oxide film 113, the oxide semiconductor film 115, and the oxide film 125 which are described in Embodiment 1 can be used, respectively, as appropriate.

In this embodiment, since the oxide semiconductor film 215 is in contact with the oxide films 213 and 225 containing one or more metal elements forming the oxide semiconductor film 215, the densities of interface levels at the interface between the oxide film 213 and the oxide semiconductor film 215 and at the interface between the oxide semiconductor film 215 and the oxide film 225 are extremely low. Thus, when oxygen is transferred from the oxide films 213 and 225 to the oxide film 215, the oxygen is less likely to be captured by the interface levels, and the oxygen in the oxide films 213 and 225 can be efficiently transferred to the oxide semiconductor film 215. Further, the density of localized levels in the multilayer film including the oxide semiconductor film 215 can be reduced.

Further, the oxide semiconductor film 215 is in contact with the oxide films 213 and 225 which contain one or more metal elements forming the oxide semiconductor film 215. In other words, the oxide semiconductor film 215 is provided over the oxide insulating film with the oxide films 213 and 225 provided therebetween, and accordingly the concentration of silicon or carbon which is one of elements belonging to Group 14 in the oxide semiconductor film 215 can be reduced. Therefore, the number of oxygen vacancies in the oxide semiconductor film 215 can be reduced, and the density of localized levels in the multilayer film including the oxide semiconductor film 215 can be reduced. As a result, the transistor 200 in this embodiment has a small change in the threshold voltage and high reliability.

As the pair of electrodes 219 and 220, the pair of electrodes 119 and 120 in Embodiment 1 can be used as appropriate.

As each of the insulating film 227, the insulating film 229, and the insulating film 231, the insulating film 131 or the insulating film 133 which is described in Embodiment 1 can be appropriately used.

<Method for Manufacturing Semiconductor Device>

Next, a method for manufacturing the transistor illustrated in FIGS. 8A to 8D is described with reference to FIGS. 9A to 9E.

Figure 9A:
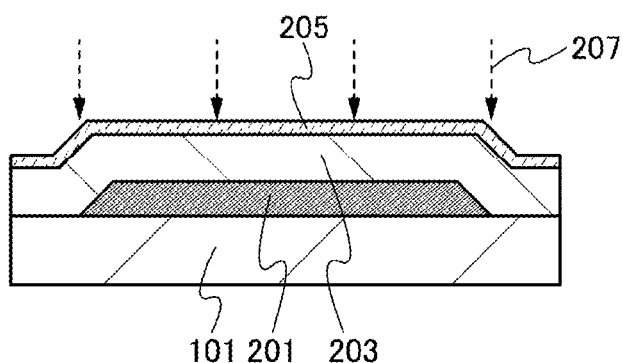
FIGS. 9A to 9E are cross-sectional views illustrating one embodiment of a method for manufacturing a semiconductor device.

As illustrated in FIG. 9A, the gate electrode 201 is formed over the substrate 101, and the gate insulating film 203 is formed at least over the gate electrode 201. Then, an oxide film 205 is formed over the gate insulating film 203. Next, oxygen 207 is added to the oxide film 205. As a result, the number of oxygen vacancies in the oxide film 205 can be reduced by heat treatment in a later step.

The gate electrode 201 and the gate insulating film 203 can be formed as appropriate by the formation methods of the gate electrode 129 and the gate insulating film 127 which are described in Embodiment 1, respectively.

The oxide film 205 can be formed as appropriate by the formation method of the oxide film 105 described in Embodiment 1. Further, as a method for adding the oxygen 207 to the oxide film 205, the method for adding the oxygen 107 described in Embodiment 1 can be appropriately used.

Figure 9B:
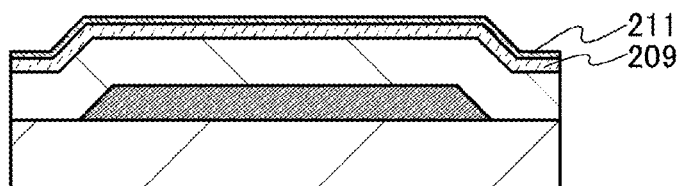

Through the above steps, the oxide film 209 to which oxygen is added in FIG. 9B can be formed.

After an oxide semiconductor film 211 is formed over the oxide film 209 to which oxygen is added, heat treatment is performed to transfer part of oxygen in the oxide film 209 to the oxide semiconductor film 211, so that the number of oxygen vacancies in the oxide semiconductor film 211 is reduced. The oxide semiconductor film 211 can be formed as appropriate by the formation method of the oxide semiconductor film 111 described in Embodiment 1. Further, as the heat treatment, the heat treatment in FIG. 2B in Embodiment 1 can be used as appropriate.

By the heat treatment, part of oxygen in the oxide film 209 to which oxygen is added is transferred to the oxide semiconductor film 211, so that the number of oxygen vacancies in the oxide semiconductor film 211 is reduced. Alternatively, by the heat treatment, part of oxygen in the gate insulating film 203 and the oxide film 209 to which oxygen is added is transferred to the oxide semiconductor film 211, so that the number of oxygen vacancies in the oxide semiconductor film 211 can be reduced. Further, oxygen vacancies in the oxide film 209 can be reduced. Note that in the oxide film 209 to which oxygen is added, the oxygen content is reduced by the heat treatment.

Through the above steps, oxygen vacancies in the oxide semiconductor film can be reduced.

Note that the heat treatment may be performed in a later step, not this step. In other words, in another heating step performed later, part of oxygen in the oxide film 209 to which oxygen is added may be transferred to the oxide semiconductor film 211. In this case, the number of heating steps can be reduced.

Figure 9C:
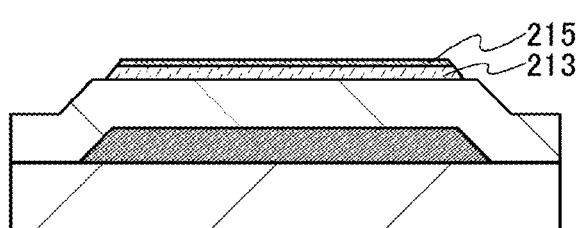

Then, after a mask is formed over the oxide semiconductor film 211 by a photolithography process, the oxide film 209 and the oxide semiconductor film 211 are each partly etched using the mask. Accordingly, the oxide film 213 and the oxide semiconductor film 215 are formed as illustrated in FIG. 9C. After that, the mask is removed. Note that in the etching step, the gate insulating film 203 is partly etched in some cases.

Figure 9D:
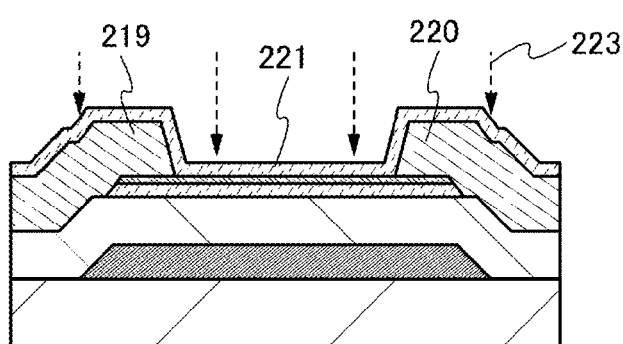

Next, as illustrated in FIG. 9D, the pair of electrodes 219 and 220 is formed over the oxide semiconductor film 215. After an oxide film 221 is formed over the oxide semiconductor film 215 and the pair of electrodes 219 and 220, oxygen 223 is added to the oxide film 221. Consequently, the oxide film to which oxygen is added can be formed.

Next, by heat treatment, part of oxygen in the oxide film 221 to which oxygen is added is transferred to the oxide semiconductor film 215, so that oxygen vacancies in the oxide semiconductor film 215 can be further reduced. Further, the oxide film 225 in which oxygen vacancies are reduced can be formed.

The pair of electrodes 219 and 220 can be formed as appropriate by the formation method of the pair of electrodes 119 and 120 in Embodiment 1.

The oxide film 221 can be formed in a manner similar to that of the oxide film 205. Further, a method for adding the oxygen 223 to the oxide film 221 can be similar to the method for adding the oxygen 207 to the oxide film 205.

In the transistor 200, by providing the oxide film 225 in which oxygen vacancies are reduced, release of oxygen from side surfaces of the oxide semiconductor film 215 is suppressed, so that generation of oxygen vacancies can be suppressed. Accordingly, the transistor can have improved electric characteristics and high reliability.

The temperature of heat treatment performed after oxygen is added to the oxide film 205 is preferably within the range of temperature where oxygen is transferred from the oxide film 225 to which oxygen is added to the oxide semiconductor film 215. It can be performed in a manner similar to that of the heat treatment in which oxygen is transferred from the oxide film 209 to which oxygen is added to the oxide semiconductor film 211 in FIG. 9B.

By the heat treatment, part of oxygen in the oxide film 225 can be transferred to the oxide semiconductor film 215, so that the number of oxygen vacancies in the oxide semiconductor film 215 can be reduced. Note that since the oxide semiconductor film 215 in contact with the oxide film 225 between the pair of electrodes 219 and 220 serves as a channel region here, by reducing oxygen vacancies with used of oxygen transferred from the oxide film 225, reliability of electric characteristics of the transistor is further increased.

Note that the heat treatment may be performed in a later step, not this step. In other words, in another heating step performed later, part of oxygen in the oxide film 225 to which oxygen is added may be transferred to the oxide semiconductor film 215. In this case, the number of heating steps can be reduced.

Figure 9E:
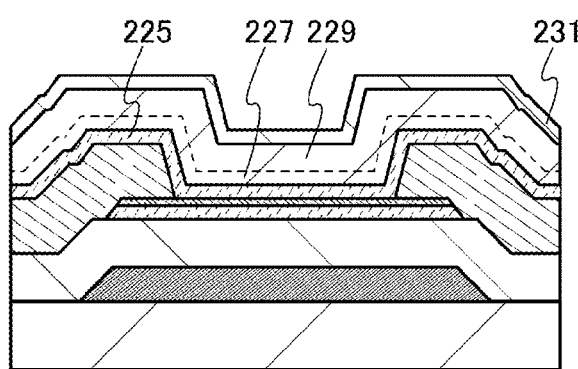

Next, as illustrated in FIG. 9E, the insulating film 227, the insulating film 229, and the insulating film 231 are stacked over the oxide film 225 in this order. Note that hydrogen in the insulating film 227, the insulating film 229, or the insulating film 231 may be released by performing heat treatment after any of the insulating film 227, the insulating film 229, and the insulating film 231 is formed.

Through the above steps, the density of localized levels of the multilayer film including the oxide semiconductor film is reduced, and a transistor with excellent electric characteristics can be manufactured. In addition, a highly reliable transistor in which a variation in electric characteristics with time or a variation in electric characteristics due to a stress test is small can be manufactured.

<Modification Example 1>

As described above, in this embodiment, after the oxide semiconductor film 211 is formed as illustrated in FIG. 9B, part of oxygen in the oxide film 209 to which oxygen is added is transferred to the oxide semiconductor film 211 by performing heat treatment. Instead of this, by setting the film formation temperature of the oxide semiconductor film 211 to higher than or equal to 170° C. and lower than the strain point of the substrate, part of oxygen in the oxide film 209 to which oxygen is added can be transferred to the oxide semiconductor film 211 while the oxide semiconductor film 211 being formed. Thus, the number of steps can be reduced.

<Modification Example 2>

Like the oxide film 155 described in Modification Example 3 in Embodiment 1, edge portions of the oxide film 225 may be positioned over the pair of electrodes 219 and 220. By providing the oxide film 225 in which oxygen vacancies are less likely to be generated, release of oxygen from the side surfaces of the oxide semiconductor film 215 is suppressed, so that generation of oxygen vacancies can be suppressed. Accordingly, the transistor can have improved electric characteristics and high reliability.

<Modification Example 3>

Although the pair of electrodes 219 and 220 is provided between the oxide semiconductor film 215 and the oxide film 225 in this embodiment, the pair of electrodes 219 and 220 may be provided between the oxide film 213 and the oxide semiconductor film 215.

<Modification Example 4>

As the gate insulating film 203 in this embodiment, the oxide insulating film whose oxygen content is in excess of that in the stoichiometric composition, which is described as the oxide insulating film 117 in Modification Example 7 in Embodiment 1, can be appropriately used.

<Modification Example 5>

Insulating films which can be used as the insulating film 227, the oxide insulating film 229, and the insulating film 231 described in this embodiment are described below.

As one or both of the insulating film 227 and the insulating film 229, the oxide insulating film whose oxygen content is in excess of that in the stoichiometric composition, which is described as the oxide insulating film 117 in Modification Example 7 in Embodiment 1, can be appropriately used.

Further, when the insulating film 227 is an oxide insulating film which can reduce the density of interface levels between the oxide insulating film and the oxide film 225, electric characteristics of the transistor are further improved. For example, the insulating film 227 is preferably an oxide insulating film having a lower defect density than the insulating film 229. Specifically, the spin density of the oxide insulating film at a g-value of 2.001 (E'-center) obtained by electron spin resonance is $3.0 \times 10^{17}$ spins/cm$^3$ or lower, preferably $5.0 \times 10^{16}$ spins/cm$^3$ or lower. The spin density at a g-value of 2.001 measured by electron spin resonance spectroscopy corresponds to the number of dangling bonds in the insulating film 227.

The thickness of the insulating film 227 can be greater than or equal to 5 nm and less than or equal to 150 nm, preferably greater than or equal to 5 nm and less than or equal to 50 nm, further preferably greater than or equal to 10 nm and less than or equal to 30 nm. The thickness of the insulating film 227 can be greater than or equal to 30 nm and less than or equal to 500 nm, preferably greater than or equal to 150 nm and less than or equal to 400 nm.

In the case where an oxide insulating film which can reduce the density of interface levels between the oxide insulating film and the oxide film 225 is used as the insulating film 227, the insulating film 227 can be formed under the following formation conditions. Here, as the oxide insulating film, a silicon oxide film or a silicon oxynitride film is formed. As for the formation conditions, the substrate placed in a treatment chamber of a plasma CVD apparatus, which is vacuum-evacuated, is held at a temperature higher than or equal to 180° C. and lower than or equal to 400° C., preferably higher than or equal to 200° C. and lower than or equal to 370° C., a deposition gas containing silicon and an oxidizing gas are introduced as a source gas into the treatment chamber, the pressure in the treatment chamber is higher than or equal to 20 Pa and lower than or equal to 250 Pa, preferably higher than or equal to 40 Pa and lower than or equal to 200 Pa, and high frequency power is supplied to an electrode provided in the treatment chamber.

Typical examples of the deposition gas containing silicon include silane, disilane, trisilane, and silane fluoride. Examples of the oxidizing gas include oxygen, ozone, dinitrogen monoxide, and nitrogen dioxide.

By setting the ratio of the amount of the oxidizing gas to the amount of the deposition gas containing silicon to 100 or higher, the hydrogen content in the insulating film 227 can be reduced and dangling bonds in the insulating film 227 can be reduced. Since oxygen transferred from the insulating film 229 might be captured by the dangling bonds in the insulating film 227, the dangling bonds in the insulating film 227 are reduced. As a result, the amount of hydrogen which enters the oxide semiconductor film can be reduced and oxygen vacancies in the oxide semiconductor film can be reduced.

In the case where the above oxide insulating film which includes an oxygen excess region or the above oxide insulating film containing oxygen in excess of the stoichiometric composition is used as the insulating film 229, the insulating film 229 can be formed under the following formation conditions. Here, as the oxide insulating film, a silicon oxide film or a silicon oxynitride film is formed. As for the formation conditions, the substrate placed in a treatment chamber of a plasma CVD apparatus, which is vacuum-evacuated, is held at a temperature higher than or equal to 180° C. and lower than or equal to 260° C., preferably higher than or equal to 180° C. and lower than or equal to 230° C., a source gas is introduced into the treatment chamber, the pressure in the treatment chamber is greater than or equal to 100 Pa and less than or equal to 250 Pa, preferably greater than or equal to 100 Pa and less than or equal to 200 Pa, and high-frequency power that is higher than or equal to 0.17 W/cm$^2$ and lower than or equal to 0.5 W/cm$^2$, preferably, higher than or equal to 0.25 W/cm$^2$ and lower than or equal to 0.35 W/cm$^2$ is supplied to an electrode provided in the treatment chamber.

As the source gas of the insulating film 229, a source gas which can be used for the insulating film 227 can be used.

As for the formation conditions of the insulating film 229, the high-frequency power having the above power density is supplied to the reaction chamber having the above pressure, whereby the decomposition efficiency of the source gas in plasma is increased, oxygen radicals are increased, and oxidation of the source gas proceeds; therefore, the oxygen content in the insulating film 229 is higher than that in the stoichiometric composition. However, in the case where the substrate temperature is within the above temperature range, the bond between silicon and oxygen is weak, and accordingly, part of oxygen is released by heating. Thus, it is possible to form an oxide insulating film which contains oxygen in excess of the stoichiometric composition and from which part of oxygen is released by heating. Further, the insulating film 227 is provided over the oxide film 225. Accordingly, in formation of the insulating film 229, the insulating film 227 serves as a protective film of the oxide film 225. Thus, even when the insulating film 229 is formed using the high-frequency power having a high power density, damage to the oxide film 225 can be suppressed.

Further, in order to suppress entry of impurities such as hydrogen and water from the outside, the insulating nitride film with a low hydrogen content, which is described in Modification Example 8 in Embodiment 1, may be provided as the insulating film 231.

Note that the structures, methods, and the like described in this embodiment can be used as appropriate in combination with any of the structures, methods, and the like described in the other embodiments and examples.

(Embodiment 3)

In this embodiment, a transistor having a structure different from those of Embodiment 1 and Embodiment 2 will be described with reference to FIG. 10. A transistor in this embodiment includes a plurality of gate electrodes facing each other with the multilayer film including the oxide semiconductor film 115 provided therebetween.

Figure 10:
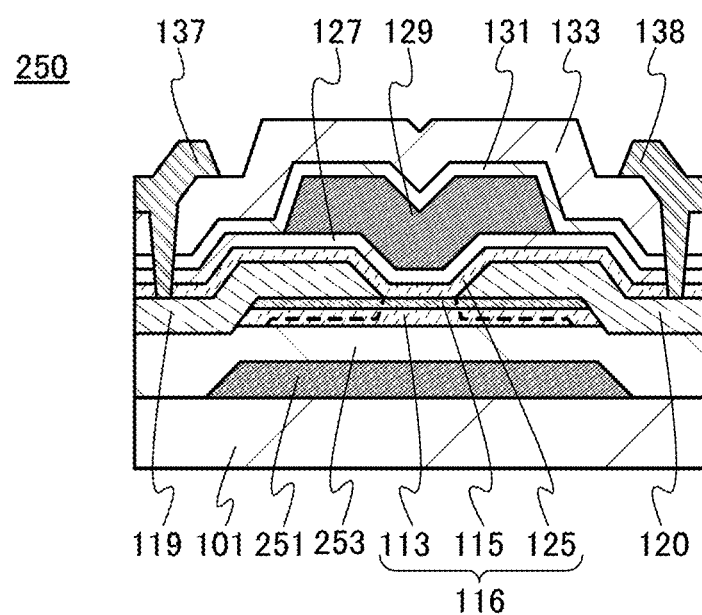
FIG. 10 is a cross-sectional view illustrating one embodiment of a semiconductor device.

A transistor 250 illustrated in FIG. 10 includes a gate electrode 251 over the substrate 101, a gate insulating film 253 over the substrate 101 and the gate electrode 251, the oxide film 113 over the gate insulating film 253, the oxide semiconductor film 115 over the oxide film 113, and the pair of electrodes 119 and 120 in contact with the oxide semiconductor film 115. Further, the oxide film 125 is formed over the gate insulating film 253, the oxide semiconductor film 115, and the pair of electrodes 119 and 120, and the gate insulating film 127 is formed over the oxide film 125. Note that the oxide film 113, the oxide semiconductor film 115, and the oxide film 125 are collectively referred to as the multilayer film 116. Further, the gate electrode 129 overlapping with the oxide semiconductor film 115 with the gate insulating film 127 provided therebetween is included. The insulating film 131 covering the gate insulating film 127 and the gate electrode 129 and the insulating film 133 covering the insulating film 131 may be provided. In openings in the gate insulating film 127, the insulating film 131, and the insulating film 133, the wirings 137 and 138 in contact with the pair of electrodes 119 and 120 may be provided.

The gate insulating film 253 can be formed in a manner similar to that of the gate insulating film 203 in Embodiment 2. Further, after the gate insulating film 203 in Embodiment 2 is formed, the film is planarized, so that the gate insulating film 253 in FIG. 10 can be formed.

The transistor in this embodiment has the gate electrode 251 and the gate electrode 129 facing each other with the oxide semiconductor film 115 provided therebetween. By application of different potentials to the gate electrode 251 and the gate electrode 129, the threshold voltage of the transistor can be controlled. Alternatively, the same potential may be applied to the gate electrode 251 and the gate electrode 129. Further alternatively, the potential of the gate electrode 129 may be a fixed potential or a ground potential.

Since in the transistor in this embodiment, two gate electrodes face each other with the multilayer film including the oxide semiconductor film 115 provided therebetween, electric characteristics of the transistor can be easily controlled.

Note that the structures, methods, and the like described in this embodiment can be used as appropriate in combination with any of the structures, methods, and the like described in the other embodiments and examples.

(Embodiment 4)

In this embodiment, a structure and a manufacturing method of a top-gate transistor which are different from those of Embodiment 1 will be described with reference to FIGS. 11A to 11C, FIGS. 12A and 12B, FIGS. 13A to 13C, FIG. 14, FIGS. 15A to 15C, FIGS. 16A and 16B, FIGS. 17A to 17E, FIGS. 18A to 18C, FIG. 19, FIGS. 20A to 20D, and FIGS. 21A to 21E.

<Structural Example of Semiconductor Device>

Figure 11A:
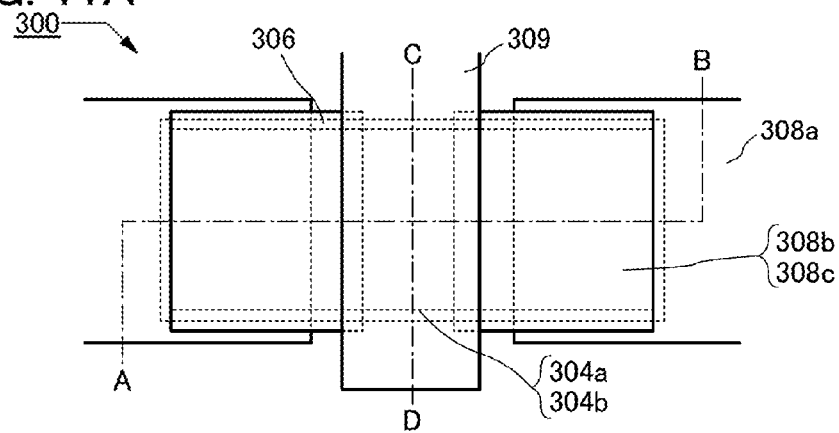
FIGS. 11A to 11C are a top view and cross-sectional views illustrating one embodiment of a semiconductor device.
Figure 11B:
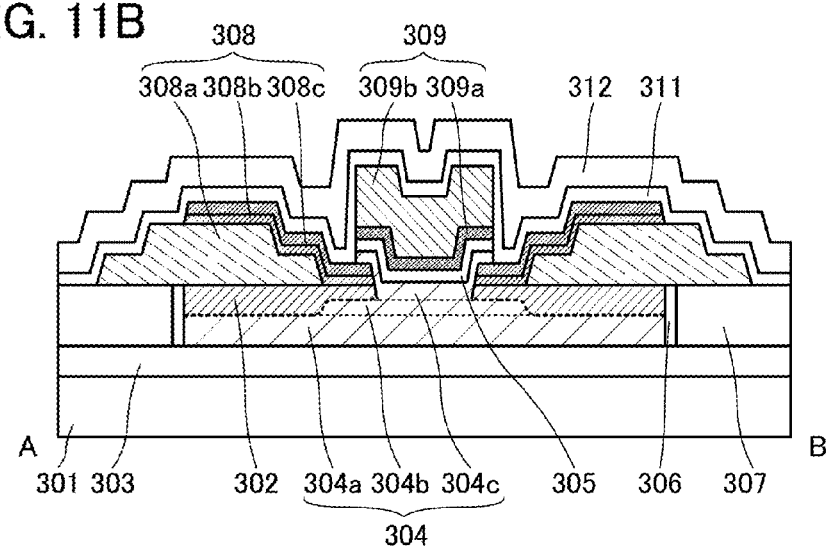
Figure 11C:
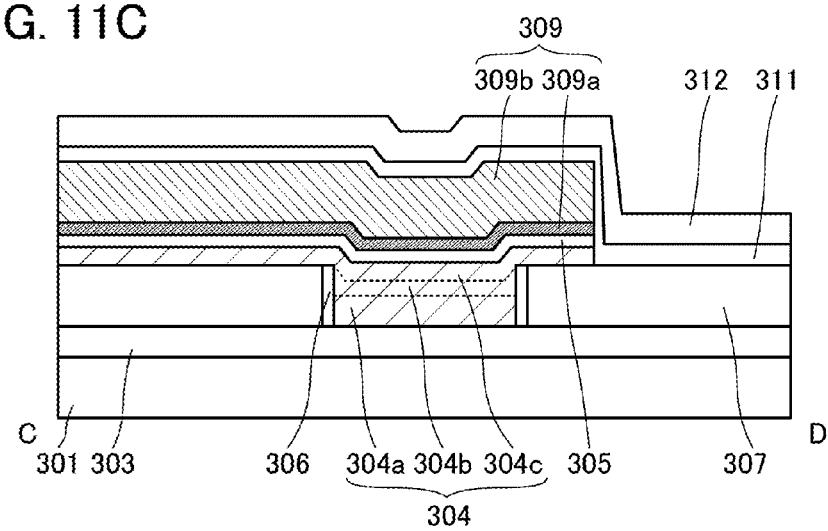

FIGS. 11A to 11C illustrate a structural example of a transistor 300. FIG. 11A is a schematic top view of the transistor 300, FIG. 11B is a schematic cross-sectional view taken along dashed-dotted line A-B in FIG. 11A, and FIG. 11C is a schematic cross-sectional view taken along dashed-dotted line C-D in FIG. 11A.

The transistor 300 in FIGS. 11A to 11C is provided over an insulating film 303 over a substrate 301. The transistor 300 includes an island-shaped oxide film 304a over the insulating film, an island-shaped oxide semiconductor film 304b over the oxide film 304a, oxide films 306 in contact with side surfaces of the oxide film 304a and the oxide semiconductor film 304b, an insulating film 307 which surrounds the side surfaces of the oxide film 304a and the oxide semiconductor film 304b and is in contact with side surfaces of the oxide film 306, a pair of electrodes 308a in contact with part of top surfaces of the insulating film 307, the oxide film 306, and the oxide semiconductor film 304b, a pair of electrodes 308b which is over the electrodes 308a and is in contact with part of a top surface of the oxide semiconductor film 304b, a pair of electrodes 308c over and in contact with the electrodes 308b, an oxide film 304c in contact with part of top surfaces of the pair of electrodes 308c and part of the top surface of the oxide semiconductor film 304b, a gate insulating film 305 over the oxide film 304c, and electrodes 309a and 309b stacked over the gate insulating film 305. In addition, an insulating film 311 covering the above components is provided. Further, an insulating film 312 may be provided over the insulating film 311.

In this embodiment, a stack of the oxide film 304a, the oxide semiconductor film 304b, and the oxide film 304c is referred to as a multilayer film 304.

In the multilayer film 304, low-resistance regions 302 are formed in regions which overlap with the electrodes 308a and the electrodes 308b.

A stack of the electrode 308a, the electrode 308b, and the electrode 308c is referred to as an electrode 308. The electrode 308 functions as a source electrode or a drain electrode of the transistor 300. Further, a stack of the electrode 309a and the electrode 309b is referred to as an electrode 309. The electrode 309 functions as a gate electrode of the transistor 300.

The components are described below.

As the substrate 301, the substrate 101 described in Embodiment 1 can be used as appropriate.

As the insulating film 303, the oxide insulating film 117 which functions as a base insulating film and is described in Embodiment 1 can be used as appropriate.

As the gate insulating film 305, the gate insulating film 127 described in Embodiment 1 can be used as appropriate.

As the insulating film 311 and the insulating film 312, the insulating film 131 and the insulating film 133 which are described in Embodiment 1 can be appropriately used.

The multilayer film 304 includes at least the oxide semiconductor film 304b where a channel is formed, the oxide film 304a between the oxide semiconductor film 304b and the insulating film 303, and the oxide film 304c between the oxide semiconductor film 304b and the gate insulating film 305.

The oxide film 304a and the oxide film 304c contain one or more kinds of metal elements forming the oxide semiconductor film 304b. As the oxide film 304a and the oxide film 304c, the oxide film 113 and the oxide film 125 which are described in Embodiment 1 can be used, respectively, as appropriate. As the oxide semiconductor film 304b, the oxide semiconductor film 115 described in Embodiment 1 can be appropriately used.

In the multilayer film 304, the oxide films in which oxygen vacancies are less likely to be generated than in the oxide semiconductor film 304b are provided over and under and in contact with the oxide semiconductor film 304b where a channel is formed, whereby generation of oxygen vacancies in the channel formation region of the transistor can be suppressed. Further, since the oxide semiconductor film 304b is in contact with the oxide films 304a and 304c containing one or more metal elements forming the oxide semiconductor film 304b, the densities of interface levels at the interface between the oxide film 304a and the oxide semiconductor film 304b and at the interface between the oxide semiconductor film 304b and the oxide film 304c are extremely low. Thus, after oxygen is added to the oxide films 304a and 304c, the oxygen is transferred from the oxide films 304a and 304c to the oxide semiconductor film 304b by heat treatment; however, the oxygen is hardly trapped by the interface levels at this time, and the oxygen in the oxide films 304a and 304c can be efficiently transferred to the oxide semiconductor film 304b. Further, the density of localized levels in the multilayer film including the oxide semiconductor film 304b can be reduced.

The oxide film 306 is provided in contact with at least the side surface of the oxide semiconductor film 304b. It is preferable that the oxide film 306 be provided in contact with the side surface of the oxide film 304a and the side surface of the oxide semiconductor film 304b.

The oxide film 306 is formed using an oxide which contains one or more kinds of metal elements forming the oxide semiconductor film 304b. For example, the material which can be used for the oxide film 304a or the oxide film 304c described above can be employed.

The width of the oxide film 306 is greater than or equal to 0.1 nm and less than 10 nm, preferably greater than or equal to 0.5 nm and less than 5 nm, further preferably greater than or equal to 1 nm and less than 3 nm.

The oxide film 306 in which oxygen vacancies are not easily generated is provided in contact with the side surfaces of the oxide semiconductor film 304b and the oxide film 304a, whereby desorption of oxygen from the side surfaces of the oxide semiconductor film 304b and the oxide film 304a is inhibited; thus, generation of oxygen vacancies can be inhibited. As a result, a transistor which has improved electric characteristics and high reliability can be provided.

In this manner, the oxide semiconductor film 304b in which the channel is formed is surrounded by the oxide film 304a, the oxide film 304c, and the oxide film 306 in each of which oxygen vacancies are not easily generated, whereby oxygen vacancies which might exist in the channel can be reduced.

The insulating film 307 is provided so as to surround the side surfaces of the oxide semiconductor film 304b and the oxide film 306. Here, it is preferable that the top surface of the insulating film 307 be planarized by planarization treatment. At this time, the level of the highest region of the top surface of the oxide semiconductor film 304b is preferably lower than the level of the top surface of the insulating film 307. Note that the level of the top surface of the insulating film 307 may be equal to the level of the top surface of the oxide semiconductor film 304b. The level of the top surface of the oxide film 306 may be equal to the level of the top surface of the insulating film 307 or the level of the top surface of the oxide semiconductor film 304b. Alternatively, the level of the top surface of the oxide film 306 may be higher than the level of the top surface of the oxide semiconductor film 304b and lower than or equal to the level of the top surface of the insulating film 307.

Here, the levels of top surfaces of two layers are determined by distances from a planar surface which is located below the two layers. For example, it is possible to use a distance from a top surface of the substrate 301 or a distance from a top surface of the insulating film 307 which is planarized.

As described above, the side surface of the oxide semiconductor film 304b is surrounded by the insulating film 307 and the top surface of the oxide semiconductor film 304b is level with or located below the insulating film 307. In other words, the oxide semiconductor film 304b is embedded in the insulating film 307. Such a structure can also be called a shallow trench structure.

Here, it is preferable that a side surface of an end portion of a stack of the oxide film 304a and the oxide semiconductor film 304b be substantially perpendicular to a surface where the stack is formed (e.g., the surface of the insulating film 303), as illustrated in FIGS. 11B and 11C. When the side surface is processed in that way, the area occupied by the stack of the oxide film 304a and the oxide semiconductor film 304b can be reduced, so that higher integration can be achieved.

Figure 12A:
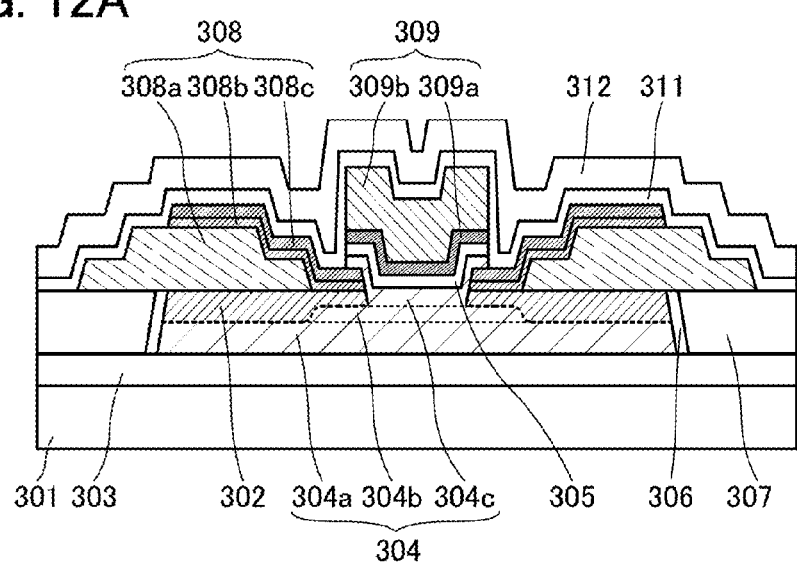
FIGS. 12A and 12B are cross-sectional views illustrating one embodiment of a semiconductor device.

Note that the end portion of the stack of the oxide film 304a and the oxide semiconductor film 304b is tapered in some cases as illustrated in FIG. 12A, depending on processing conditions for the oxide film 304a and the oxide semiconductor film 304b. When the end portion of the stack of the oxide film 304a and the oxide semiconductor film 304b is processed to be tapered, coverage with a layer (e.g., the insulating film 307) which is provided over the stack can be improved.

The above-described shallow trench structure in one embodiment of the present invention has various advantages as described below.

Owing to the oxide semiconductor film 304b (and the oxide film 304a) embedded in the insulating film 307, the above structure does not include a step at an end portion which exists in the case of forming the oxide semiconductor film 304b (and the oxide film 304a) as a thin film(s) over a planar surface. Thus, at the time when the electrode 308 and the electrode 309 are formed, it is not necessary to take into account coverage at a portion which extends beyond the step, so that the degree of freedom of the process can be increased. In addition, since a thin region is not formed at the end portion of the oxide semiconductor film 304b (and the oxide film 304a), the thickness of the oxide semiconductor film 304b in a region in which the electrode 309 overlaps with the end portion can be uniform; therefore, the transistor can have favorable electric characteristics.

Further, at the time when a plurality of the stacks of the oxide film 304a and the oxide semiconductor film 304b are provided adjacent to each other, distances between the stacks can be small as compared to the case of formation which uses a thin film over a planar surface. Thus, it can be said that the transistor of one embodiment of the present invention can be highly integrated.

In the pair of electrodes 308, the electrode 308a is provided in contact with the top surfaces of the insulating film 307, the oxide film 306, and the oxide semiconductor film 304b. A stack of the electrode 308b and the electrode 308c is provided so as to extend beyond an end portion of the electrode 308a on the channel side and to be in contact with the top surface of the oxide semiconductor film 304b. The electrode 309a is provided using a material similar to that of the electrode 308a as appropriate.

For the electrode 308a and the electrode 308b, the conductive material easily bonded to oxygen, which is described in Embodiment 1, can be used. For example, tungsten, titanium, aluminum, copper, molybdenum, chromium, or tantalum, an alloy thereof, or the like can be used. When such a conductive material which is easily bonded to oxygen is in contact with the multilayer film 304, an n-type region (low-resistance region 302) is formed in the multilayer film 304. Thus, the low-resistance region 302 can function as a source or a drain of the transistor 300.

A conductive material which is not easily bonded to oxygen is used for the electrode 308c. As the conductive material, for example, a metal nitride such as tantalum nitride or titanium nitride is preferably used. The electrode 308c which is not easily bonded to oxygen is provided in contact with a top surface of the electrode 308b, whereby oxygen diffused from the multilayer film 304 can be prevented from diffusing to above the electrode 308b through the electrode 308b in a region of the electrode 308b which is in contact with the oxide semiconductor film 304b, and thus it is possible to prevent too much oxygen from being extracted from the multilayer film 304. Note that the conductive material which is not easily bonded to oxygen includes, in its category, a material to which oxygen is not easily diffused.

At this time, by control of the thickness of the electrode 308b, the depth of the low-resistance region 302 formed in a region of the multilayer film 304 which is in contact with the electrode 308b can be controlled. For example, when the electrode 308b is formed to be thinner than the electrode 308a, the low-resistance region 302 can have a smaller depth in a region overlapping with the electrode 308b than in a region overlapping with the electrode 308a as illustrated in FIG. 11B.

The low-resistance region 302 with a smaller depth in the vicinity of the channel formation region can function as a lightly doped drain (LDD) region and can inhibit degradation of the characteristics of the transistor 300.

Note that in the low-resistance region 302, the conductivity may vary continuously in the depth direction. For example, the shallower region often has lower resistance. In addition, the region overlapping with the electrode 308a and the region overlapping with the electrode 308b may have different conductivities. In that case, in the low-resistance region 302, a shallow region formed in the vicinity of the channel formation region preferably has lower conductivity than a deeper region, in which case degradation of the characteristics of the transistor 300 can be more inhibited.

To control the depth of the low-resistance region 302, any of the methods below can also be employed.

In one method, the materials used for the electrode 308a and the electrode 308b are different in the degree of ease of being bonded to oxygen. For example, when a tungsten film is used as the electrode 308a and a titanium film is used as the electrode 308b, the depth of the low-resistance region 302 can differ between the region which is in contact with the electrode 308a and the region which is in contact with the electrode 308b.

Figure 12B:
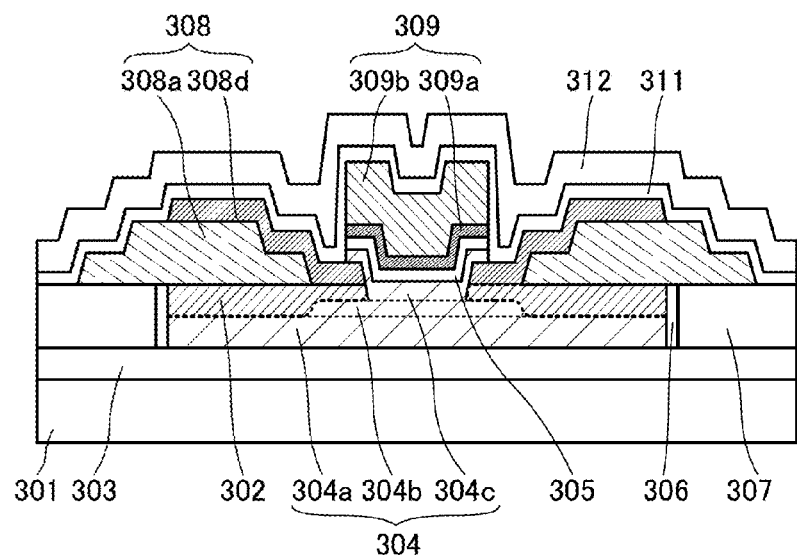

In another method, as illustrated in FIG. 12B, an electrode 308d in which the degree of ease of being bonded to oxygen is controlled is used instead of the stack of the electrode 308b and the electrode 308c. For the electrode 308d, a metal nitride in which the amount of added nitrogen is adjusted to be relatively small (a metal nitride film whose nitrogen concentration is reduced) can be used. In the case of using titanium nitride, for example, it is possible to use a material in which the proportion of titanium and the proportion of nitrogen in the composition satisfy the following relation: 0<N<Ti.

In a region overlapping with the electrode 308d in which the degree of ease of being bonded to oxygen is controlled, the depth of the low-resistance region 302 formed in the multilayer film 304 can be controlled.

Figure 13A:
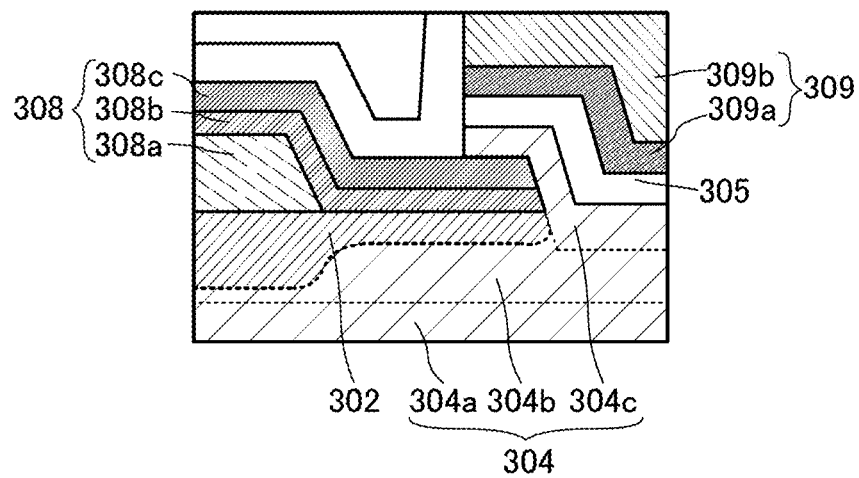
FIGS. 13A to 13C are cross-sectional views illustrating one embodiment of a semiconductor device.
Figure 13B:
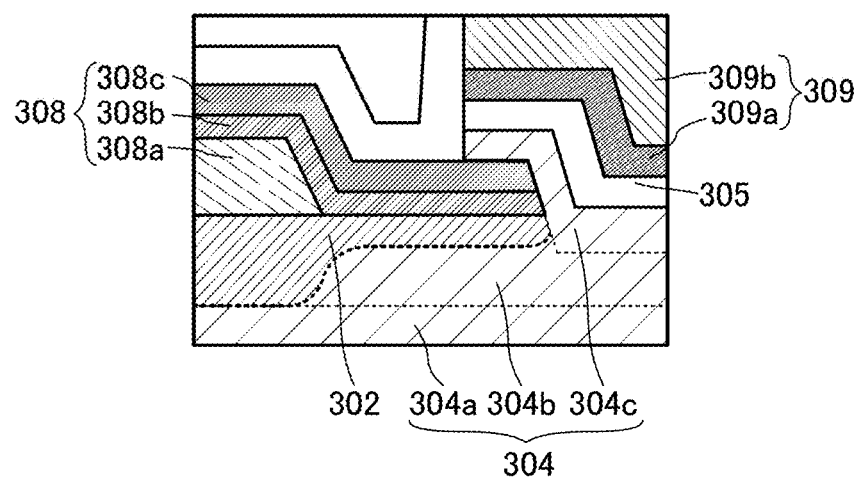
Figure 13C:
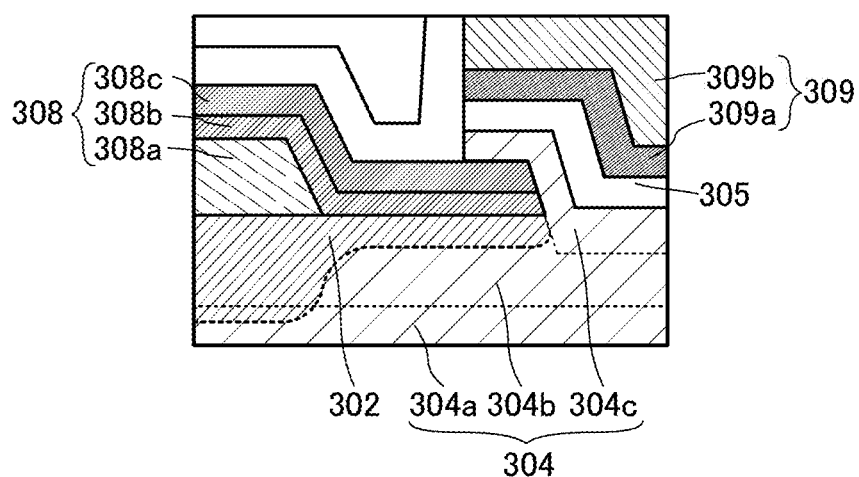

FIGS. 13A to 13C are enlarged schematic diagrams of the vicinity of the low-resistance region 302 in FIG. 11B. Here, the low-resistance region 302 in the multilayer film 304 may be formed in only the oxide semiconductor film 304b as illustrated in FIG. 13A. Alternatively, as illustrated in FIG. 13B, the low-resistance region 302 may be formed to reach the vicinity of an interface between the oxide semiconductor film 304b and the oxide film 304a in the depth direction. Further alternatively, as illustrated in FIG. 13C, the low-resistance region 302 reaches the oxide film 304a in some cases.

Note that in the transistor having the structure illustrated in FIGS. 11A to 11C, the channel length refers to a distance between the pair of electrodes 308b.

Further, in the transistor having the structure illustrated in FIGS. 11A to 11C, a channel is formed in a part of the oxide semiconductor film 304b which is between the pair of electrodes 308b.

Furthermore, in the transistor having the structure illustrated in FIGS. 11A to 11C, a channel formation region means parts of the oxide film 304a, the oxide semiconductor film 304b, and the oxide film 304c which are between the pair of electrodes 308b.

The electrode 309 functioning as a gate electrode has a structure in which the electrode 309a and the electrode 309b are stacked. Note that the electrode 309 may be a stack of three or more conductive layers.

For the electrode 309b, it is possible to use a conductive film of a metal material such as Al, Ti, Cr, Co, Ni, Cu, Y, Zr, Mo, Ru, Ag, Ta, or W, or an alloy material containing the above metal material.

For the electrode 309a, which is provided on the oxide semiconductor film 304b side, the above-described conductive material which is not easily bonded to oxygen can be used. When the electrode 309a which is not easily bonded to oxygen is provided between the electrode 309b and the gate insulating film 305, oxygen in the multilayer film 304 can be prevented from diffusing to the electrode 309b through the gate insulating film 305, which leads to high reliability of the transistor.

For example, a titanium nitride film and a titanium-tungsten alloy film are used for the electrode 309a and the electrode 309b, respectively. Alternatively, a tantalum nitride film and a tungsten film are used for the electrode 309a and the electrode 309b, respectively. Further alternatively, a structure can be employed in which a titanium nitride film and a tungsten film are used for the electrode 309a and the electrode 309b, respectively, and a titanium-tungsten alloy film is included between the electrode 309a and the electrode 309b.

Note that when oxygen is not easily diffused from the gate insulating film 305, the electrode 309a is not necessarily provided.

Figure 14:
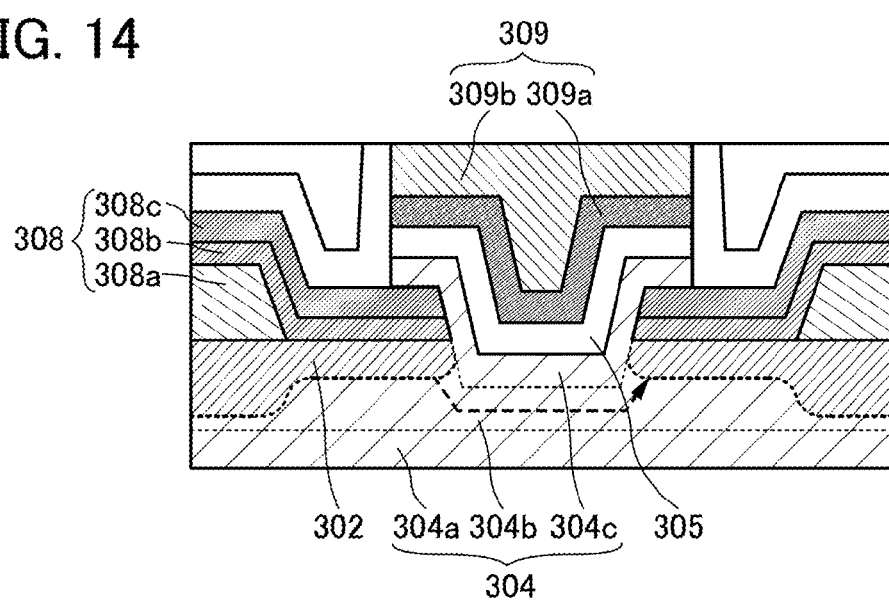
FIG. 14 is a cross-sectional view illustrating one embodiment of a semiconductor device.

FIG. 14 is an enlarged schematic diagram illustrating the channel formation region of the transistor 300.

It is preferable that as illustrated in FIG. 14, the oxide semiconductor film 304b be partly etched such that the top surface of a recessed portion of the oxide semiconductor film 304b in the channel formation region is located below a region where the low-resistance region 302, the oxide semiconductor film 304b, and the oxide film 304c are in contact with one another. In addition, the oxide film 304c is preferably formed in contact with a top surface of a thin region of the oxide semiconductor film 304b.

Here, in the oxide semiconductor film 304b, a region whose resistance is reduced due to extraction of oxygen by the electrode 308b extends not only in the depth direction but also in the channel length direction in some cases. Therefore, when the channel length is set extremely small, the pair of low-resistance regions 302 might be connected to each other to be short-circuited.

However, such short circuit between the pair of low-resistance regions 302 can be prevented when the oxide semiconductor film 304b is etched so that the top surface of the recessed portion of the oxide semiconductor film 304b is located below the region where the low-resistance region 302, the oxide semiconductor film 304b, and the oxide film 304c are in contact with one another in the channel formation region as illustrated in FIG. 14.

In FIG. 14, a dashed arrow schematically illustrates a path of a current which mainly flows between the pair of electrodes 308. The channel is mainly formed in the oxide semiconductor film 304b, so that a current also flows mainly in the oxide semiconductor film 304b. The larger a difference between the level of the bottom surface of the low-resistance region 302 in the vicinity of the channel formation region and the level of the top surface of the oxide semiconductor film 304b is, the longer the channel length can be; thus, a short channel effect can be inhibited. Even a transistor in which an actual channel length is extremely short can have favorable electric characteristics.

The channel length of the transistor of one embodiment of the present invention can be set to as short as 30 nm or less, preferably 20 nm or less, further preferably 10+X nm (X is greater than or equal to 0 and less than 10) or less.

<Modification Example 1>

Figure 15A:
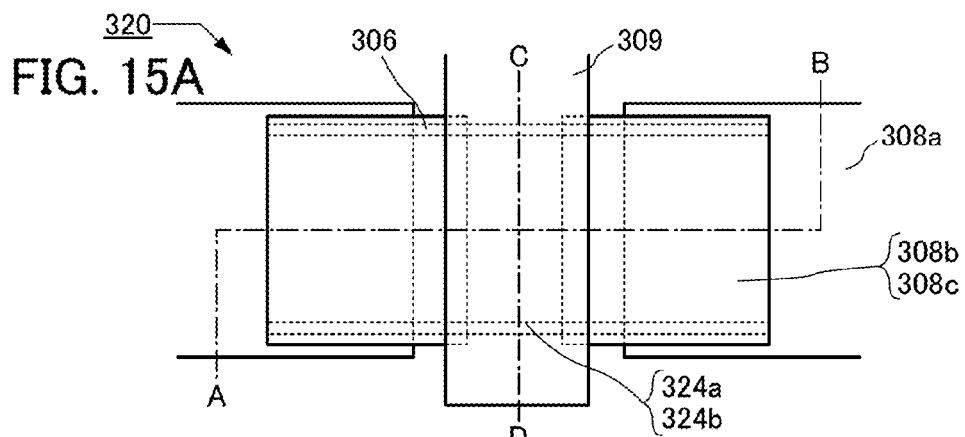
FIGS. 15A to 15C are a top view and cross-sectional views illustrating one embodiment of a semiconductor device.
Figure 15B:
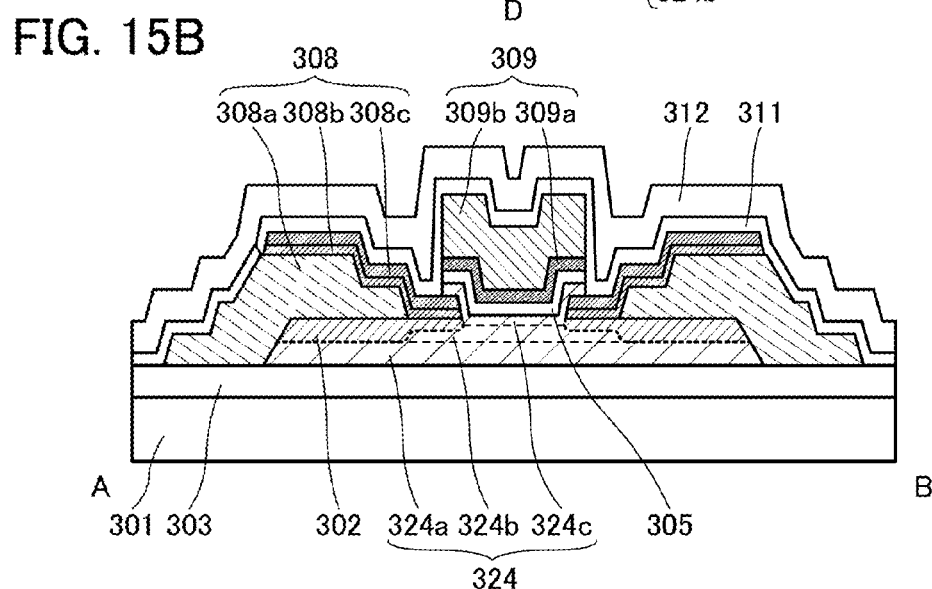
Figure 15C:
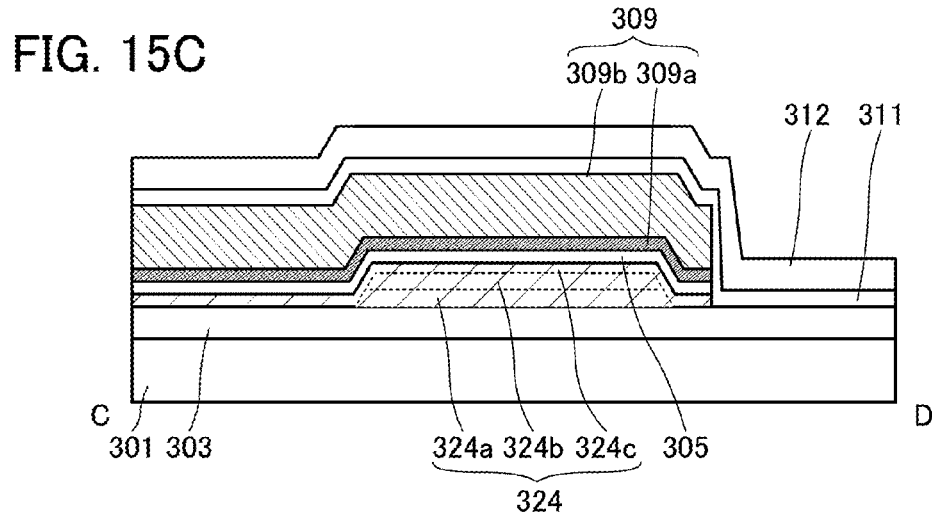

In the transistor described in this embodiment, a multilayer film 324 illustrated in FIGS. 15A to 15C may be used instead of the multilayer film 304 of the transistor 300 illustrated in FIGS. 11A to 11C.

FIG. 15A is a schematic top view of a transistor 320, FIG. 15B is a schematic cross-sectional view taken along dashed-dotted line A-B in FIG. 15A, and FIG. 15C is a schematic cross-sectional view taken along dashed-dotted line C-D in FIG. 15A.

The multilayer film 324 includes an island-shaped oxide film 324a over the insulating film 303, an island-shaped oxide semiconductor film 324b over the oxide film 324a, and an oxide film 324c in contact with part of top surfaces of the pair of electrodes 308c and part of a top surface of the oxide semiconductor film 324b.

The number of steps for forming the multilayer film 324 can be smaller than that of the multilayer film 304.

<Modification Example 2>

In the formation process of the transistor 300, a capacitor can also be formed without an increase of the number of steps of the process.

Figure 16A:
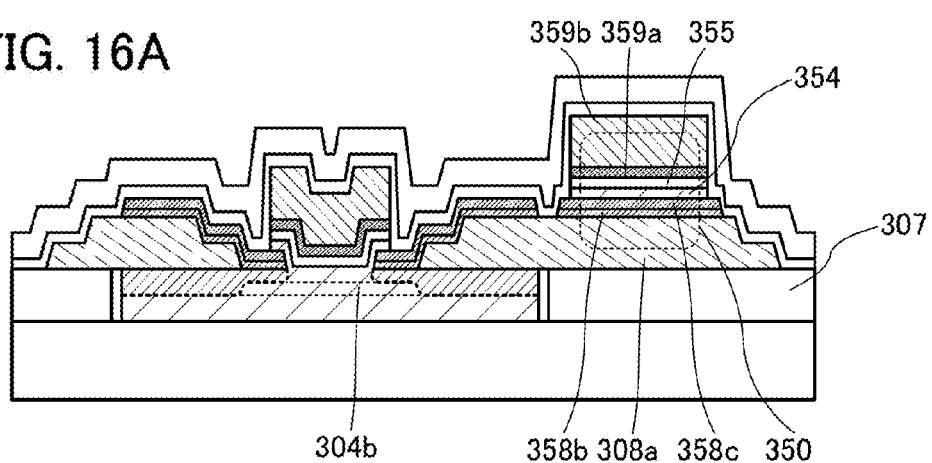
FIGS. 16A and 16B are cross-sectional views illustrating one embodiment of a semiconductor device.
Figure 16B:
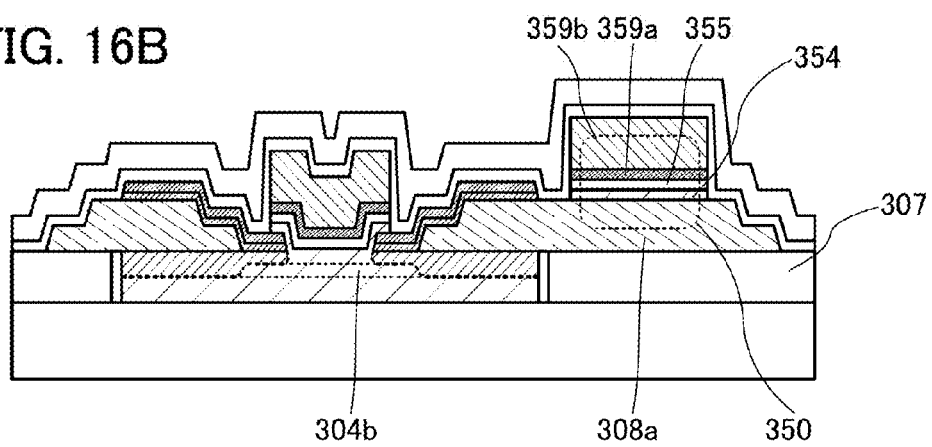

In FIGS. 16A and 16B, a structural example is illustrated in which a capacitor 350 is formed so as to be electrically connected to the transistor 300.

The capacitor 350 illustrated in FIG. 16A has a structure in which part of the electrode 308a, an electrode 358b, an electrode 358c, an oxide film 354, an insulating film 355, an electrode 359a, and an electrode 359b are stacked in this order.

The electrode 358b can be formed by processing the same film as the electrode 308b. Similarly, the electrode 358c, the oxide film 354, the insulating film 355, the electrode 359a, and the electrode 359b can be formed by processing the same films as the electrode 308c, the oxide film 304c, the gate insulating film 305, the electrode 309a, and the electrode 309b, respectively. Thus, the capacitor 350 can be formed at the same time as fabrication of the transistor 300 without an increase of the number of steps.

The capacitor 350 illustrated in FIG. 16B has a structure in which part of the electrode 308a, the oxide film 354, the insulating film 355, the electrode 359a, and the electrode 359b are stacked in this order.

In each of the above structures, a stack of the oxide film 354 and the insulating film 355 functions as a dielectric of the capacitor.

Here, when an oxide semiconductor is used for the oxide film 354, a relative permittivity higher than a relative permittivity of an insulator such as silicon oxide can be achieved. For example, while silicon oxide has a relative permittivity of 4.0 to 4.5, an oxide semiconductor can have a relative permittivity of 13 to 17 or 14 to 16. Therefore, without a reduction in capacitance, the thickness of the oxide film 354 can be large and thus a withstand voltage of the capacitor can be increased.

Further, as illustrated in FIGS. 16A and 16B, the capacitor can be formed over the insulating film 307 outside the region (also referred to as trench region) in which the oxide semiconductor film 304b is embedded.

With such a structure, the transistor 300 and the capacitor 350 can be fabricated at the same time without an increase of the number of steps. Therefore, a semiconductor circuit including the transistor 300 and the capacitor 350 can be easily fabricated.

<Method for Manufacturing Semiconductor Device>

An example of a manufacturing method of the transistor described above is described below with reference to the drawings.

First, the insulating film 303 is formed over the substrate 301.

The insulating film 303 can be formed by a method such as a plasma CVD method or a sputtering method.

Figure 17A:
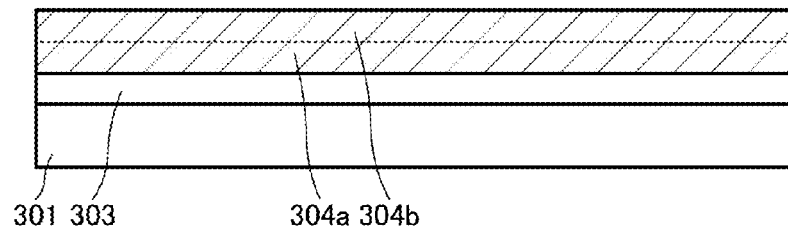
FIGS. 17A to 17E are cross-sectional views illustrating one embodiment of a method for manufacturing a semiconductor device.

Next, the oxide film 304a and the oxide semiconductor film 304b are formed over the insulating film 303 by a sputtering method, a coating method, a pulsed laser deposition method, a laser ablation method, or the like (see FIG. 17A).

As each of the oxide film 304a and the oxide film 304c formed later, the oxide film 113 described in Embodiment 1 can be appropriately used. As the oxide semiconductor film 304b, the oxide semiconductor film 115 described in Embodiment 1 can be appropriately used. As in Embodiment 1, by adding oxygen to the oxide film 304a, oxygen in the oxide film 304a is transferred to the oxide semiconductor film 304b by heat treatment performed later, so that oxygen vacancies in the oxide semiconductor film 304b can be filled. Further, oxygen vacancies in the oxide film 304a can be reduced. Thus, oxygen vacancies in the oxide semiconductor film 304b can be reduced.

Then, the stack of the oxide film 304a and the oxide semiconductor film 304b is selectively etched, so that an island-shaped stack of the oxide film 304a and the oxide semiconductor film 304b is formed. Note that heating may be performed before etching.

Figure 17B:
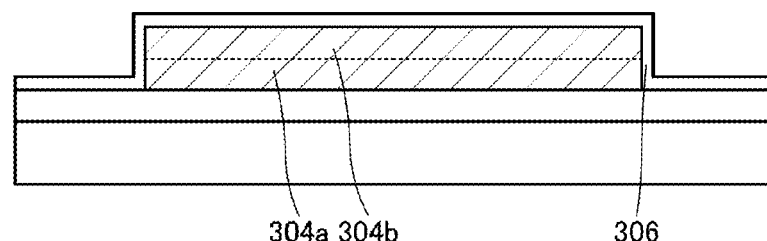

Subsequently, the oxide film 306 is formed so as to be in contact with at least a side surface of the stack of the oxide film 304a and the oxide semiconductor film 304b (FIG. 17B). The oxide film 306 is formed by a sputtering method, a coating method, a pulsed laser deposition method, or a laser ablation method.

Alternatively, an oxide (e.g., gallium oxide) not containing indium can be used for the oxide film 306. In this case, a film of the oxide is preferably formed by a CVD method.

Next, the oxide film 306 except for that in a region in contact with the side surfaces of the oxide film 304a and the oxide semiconductor film 304b is removed by etching. For example, by anisotropic etching using a dry etching method or the like, only the oxide film 306 in the region in contact with the side surfaces of the oxide film 304a and the oxide semiconductor film 304b can be left. In this manner, the oxide film 306 in contact with the side surfaces of the oxide film 304a and the oxide semiconductor film 304b can be formed.

Figure 17C:
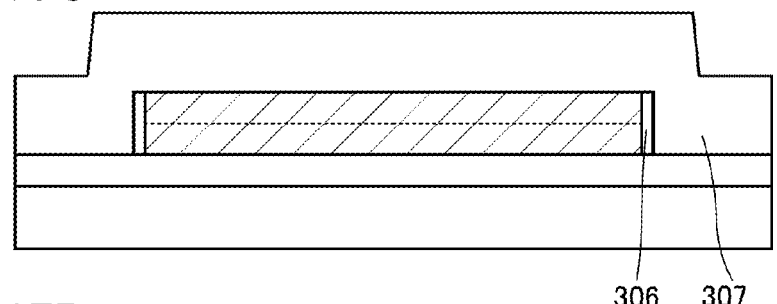

Then, the insulating film 307 is formed so as to cover the oxide semiconductor film 304b and the oxide film 306 (FIG. 17C). The insulating film 307 can be formed by a plasma CVD method, a sputtering method, or the like.

Figure 17D:
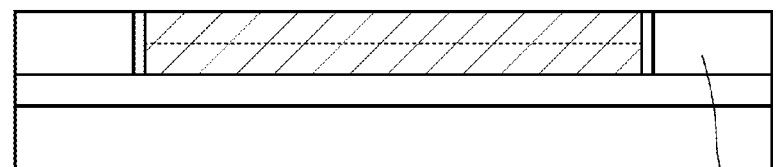

The insulating film 307 is then subjected to planarization treatment, so that the top surface of the oxide semiconductor film 304b is exposed (FIG. 17D). To the planarization treatment, a CMP method or the like can be applied.

In some cases, the planarization treatment causes a reduction in the thickness of the oxide semiconductor film 304b. In that case, with a thickness reduced by the planarization treatment taken into consideration, the oxide semiconductor film 304b having a large thickness is preferably formed in advance.

After the planarization treatment, heat treatment is preferably performed. Owing to the heat treatment, efficient oxygen supply can be performed from the insulating film 303 to the oxide film 304a and the oxide semiconductor film 304b, whereby oxygen vacancies in the oxide film 304a and the oxide semiconductor film 304b can be reduced. Further, by the heat treatment, the crystallinity of the oxide film 304a and the oxide semiconductor film 304b can be increased, and moreover, an impurity such as hydrogen or water can be removed from at least one of the insulating film 307, the oxide film 304a, the oxide semiconductor film 304b, and the oxide film 306.

The heat treatment may be performed at a temperature higher than or equal to 250° C. and lower than or equal to 650° C., preferably higher than or equal to 300° C. and lower than or equal to 500° C., in an inert gas atmosphere, an atmosphere containing an oxidizing gas at 10 ppm or more, or a reduced pressure state. Alternatively, the heat treatment may be performed in such a manner that heat treatment is performed in an inert gas atmosphere, and then another heat treatment is performed in an atmosphere containing an oxidizing gas at 10 ppm or more in order to compensate desorbed oxygen.

Figure 19:
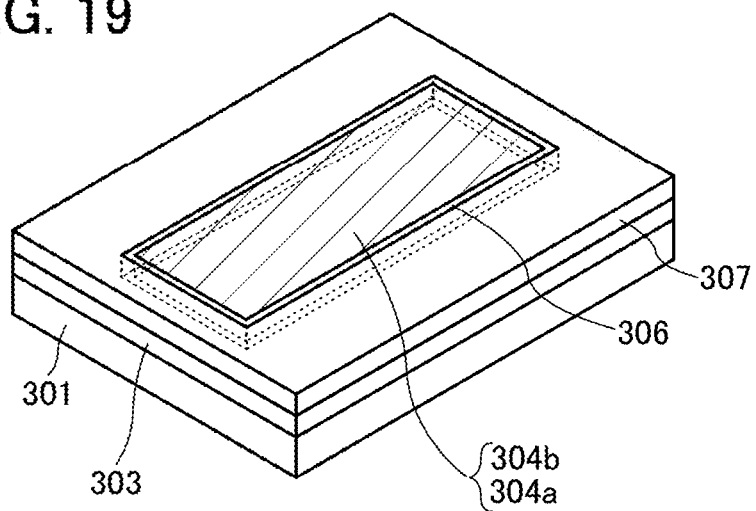
FIG. 19 is a perspective view illustrating one embodiment of a method for manufacturing a semiconductor device.

FIG. 19 is a schematic perspective view of this stage. As illustrated in the drawing, the side surface of the island-shaped stack of the oxide film 304a and the oxide semiconductor film 304b is covered with the oxide film 306, and the island-shaped stack is embedded in the insulating film 307. The top surfaces of the oxide semiconductor film 304b, the oxide film 306, and the insulating film 307 are planarized. The levels of the top surfaces are substantially the same, or a difference between the levels is extremely small. It is thus possible to prevent an adverse effect due to a step at the time of formation of a layer over these layers. When a plurality of the above island-shaped stacks are provided, a distance between adjacent stacks can be made extremely small.

Then, a conductive film is formed over the oxide semiconductor film 304b, the oxide film 306, and the insulating film 307 and selectively etched so as to be divided over the oxide semiconductor film 304b; thus, the pair of electrodes 308a are formed.

The electrodes 308a can be formed as appropriate by the method for forming the pair of electrodes which is described in Embodiment 1.

At this time, the end portion of the electrode 308a is preferably formed so as to have a staircase-like shape as illustrated in the drawing. The end portion can be formed in such a manner that a step of making a resist mask recede by ashing and an etching step are alternately performed a plurality of times. By making the end portion have a staircase-like shape, coverage with a film (e.g., the electrode 308b or the electrode 308c) to be formed thereover can be improved, and the film to be formed can be thus thin. In addition, the electrode 308a can be formed thick, whereby the resistance of the electrode can be reduced.

Note that although not illustrated, by overetching of the conductive film, part of the oxide semiconductor film 304b or the insulating film 307 (an exposed region) is etched in some cases.

Figure 17E:
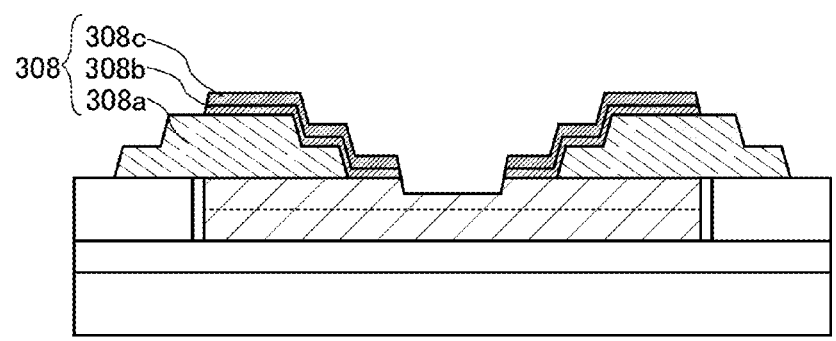

Next, over the oxide semiconductor film 304b, the electrode 308a, and the insulating film 307, a conductive film to be the electrodes 308b and a conductive film to be the electrodes 308c are formed and selectively etched so as to be divided over the oxide semiconductor film 304b; thus, a pair of stacks of the electrodes 308b and the electrodes 308c are formed (FIG. 17E).

The electrodes 308b and the electrodes 308c can be formed as appropriate by the method for forming the pair of electrodes which is described in Embodiment 1.

When the electrodes 308b and the electrodes 308c are formed by processing the conductive films by etching, they are preferably overetched so that part of the oxide semiconductor film 304b is etched intentionally. At this time, the oxide semiconductor film 304b is preferably etched such that the top surface of a recessed portion of the oxide semiconductor film 304b is located below a region where the low-resistance region 302 to be formed later, the oxide semiconductor film 304b, and the oxide film 304c are in contact with one another.

Note that with a reduction in the thickness of the oxide semiconductor film 304b due to processing of the conductive film into the electrodes 308a, the electrodes 308b, and the electrodes 308c taken into consideration, the oxide semiconductor film 304b having a large thickness is preferably formed in advance.

Note that in the case of forming a transistor whose channel length is extremely short, at least a region to divide the stack of the conductive films to be the electrodes 308b and the electrodes 308c is etched using resist masks that are processed by a method suitable for fine line processing, such as electron beam exposure. Note that by the use of a positive type resist for the resist masks, the exposed region can be minimized and throughput can be thus improved. In the above manner, a transistor having a channel length of 30 nm or less can be formed. Alternatively, minute processing may be performed by an exposure technology which uses light with an extremely short wavelength (e.g., extreme ultraviolet (EUV)), X-rays, or the like.

Then, the oxide film 304c is formed over the oxide semiconductor film 304b, the electrodes 308a, the electrodes 308c, and the insulating film 307. The oxide film 304c can be formed by a sputtering method, a coating method, a pulsed laser deposition method, a laser ablation method, or the like using the above-described material.

As in Embodiment 1, by adding oxygen to the oxide film 304c, oxygen in the oxide film 304c is transferred to the oxide semiconductor film 304b by heat treatment performed later, so that oxygen vacancies in the oxide semiconductor film 304b can be filled. Thus, oxygen vacancies in the oxide semiconductor film 304b can be reduced. Further, oxygen vacancies in the oxide film 304c can be reduced.

Figure 18A:
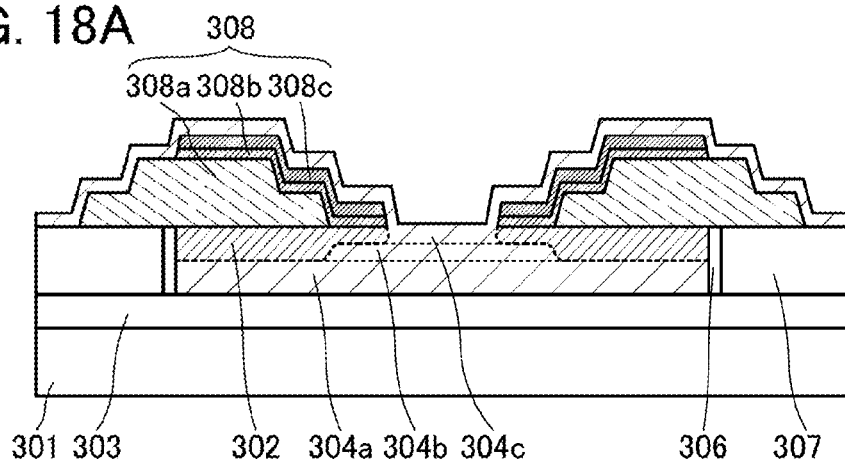
FIGS. 18A to 18C are cross-sectional views illustrating one embodiment of a method for manufacturing a semiconductor device.

Next, heat treatment is performed, so that the low-resistance regions 302 are formed and part of oxygen in the oxide films 304a and 304c is transferred to the oxide semiconductor film 304b (FIG. 18A). When the heat treatment is performed in a state where the electrodes 308a are in contact with the oxide semiconductor film 304b, oxygen in the stack of the oxide semiconductor film 304b and the oxide film 304a is taken into the electrodes 308a which are easily bonded to oxygen. Accordingly, oxygen vacancies are generated in regions of the oxide semiconductor film 304b which are in the vicinities of the interfaces with the electrodes 308a, so that the low-resistance regions 302 are formed. Similarly, by the heat treatment, the low-resistance regions 302 are formed in regions of the oxide semiconductor film 304b which are in the vicinities of the interfaces with the electrodes 308b.

Here, in accordance with the thicknesses, materials, and the like of the electrode 308a and the electrode 308b, the depth of the low-resistance region 302, which is formed thereunder, is determined. The depth can also be controlled in accordance with conditions of the heat treatment (temperature, time, pressure, or the like). For example, the higher the heating temperature is or the longer the heating time is, the larger the depth of the low-resistance region 302 is. Note that the low-resistance region 302 is not formed in some cases depending on the temperature of the heat treatment.

The heat treatment may be performed at a temperature higher than or equal to 250° C. and lower than or equal to 650° C., preferably higher than or equal to 300° C. and lower than or equal to 500° C., in an inert gas atmosphere, an atmosphere containing an oxidizing gas at 10 ppm or more, or a reduced pressure state. Alternatively, the heat treatment may be performed in such a manner that heat treatment is performed in an inert gas atmosphere, and then another heat treatment is performed in an atmosphere containing an oxidizing gas at 10 ppm or more in order to compensate desorbed oxygen.

By the heat treatment, efficient oxygen supply can be performed from the oxide film 304c to the oxide semiconductor film 304b, whereby oxygen vacancies in the oxide semiconductor film 304b can be reduced. Further, by the heat treatment, the crystallinity of the oxide film 304a, the oxide semiconductor film 304b, and the oxide film 304c can be increased, and moreover, an impurity such as hydrogen or water can be removed from at least one of the insulating film 307, the oxide film 304a, the oxide semiconductor film 304b, the oxide film 304c, and the oxide film 306.

Next, the gate insulating film 305 is formed over the oxide film 304c. The gate insulating film 305 can be formed by a sputtering method, a CVD method, an MBE method, an ALD method, a PLD method, or the like. In particular, it is preferable that the gate insulating film 305 be formed by a CVD method, further preferably a plasma CVD method, because favorable coverage can be achieved.

After the formation of the gate insulating film 305, heat treatment is preferably performed. By the heat treatment, an impurity such as water or hydrogen contained in the gate insulating film 305 can be desorbed (dehydration or dehydrogenation can be performed). The temperature of the heat treatment is preferably higher than or equal to 300° C. and lower than or equal to 400° C. The heat treatment may be performed in such a manner that heat treatment is performed in an inert gas atmosphere, and then another heat treatment is performed in an atmosphere containing an oxidizing gas at 10 ppm or more in order to compensate desorbed oxygen. By the heat treatment, an impurity such as hydrogen or water can be removed from the gate insulating film 305. In addition, impurities such as hydrogen and water are further removed from the oxide film 304a, the oxide semiconductor film 304b, and the oxide film 304c in some cases. Further, when the heat treatment is performed in an atmosphere containing an oxidizing gas, oxygen can be supplied to the gate insulating film 305.

Note that it is preferable that the heat treatment be successively performed in a deposition chamber after the gate insulating film 305 is formed. Alternatively, the heating at the time of forming the gate insulating film 305 can serve as the heat treatment.

Then, a conductive film to be the electrode 309a and a conductive film to be the electrode 309b are formed in this order. The conductive films can be formed by a sputtering method or the like.

Figure 18B:
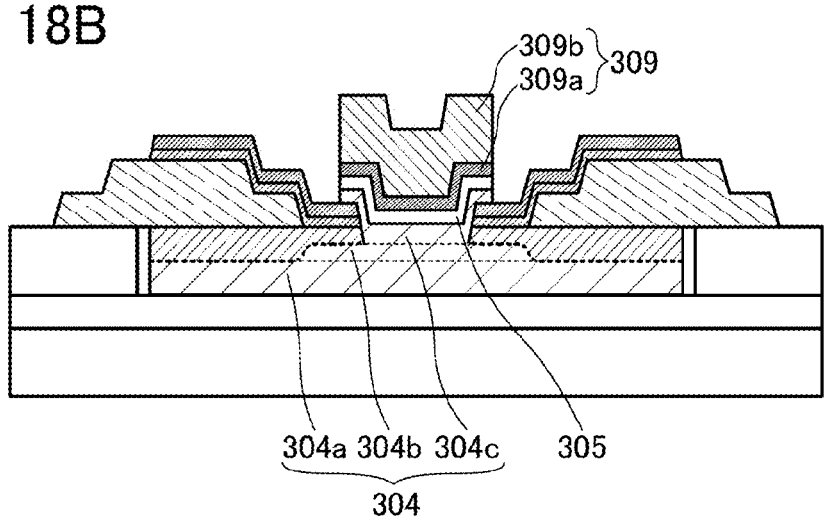

Next, the conductive film to be the electrode 309b, the conductive film to be the electrode 309a, the gate insulating film 305, and the oxide film 304c are selectively etched so as to overlap with the channel formation region, so that a stack of the oxide film 304c, the gate insulating film 305, the electrode 309a, and the electrode 309b is formed (FIG. 18B).

Here, in the above etching step, the electrodes 308b and the electrodes 308c can serve as etching stoppers.

Note that heat treatment may be performed after the conductive film to be the electrode 309a and the conductive film to be the electrode 309b are formed, or after the above etching step. To the heat treatment, the conditions of the heat treatment which can be performed after the formation of the gate insulating film 305 can be applied.

Here, the heat treatment for the formation of the low-resistance regions 302 is not necessarily performed just after the oxide film 304c is formed and may be performed at any timing after the oxide film 304c is formed. The low-resistance regions 302 can be formed by performing heat treatment at least once. When heat treatment is performed a plurality of times, oxygen vacancies in the multilayer film 304 can be reduced more effectively.

Figure 18C:
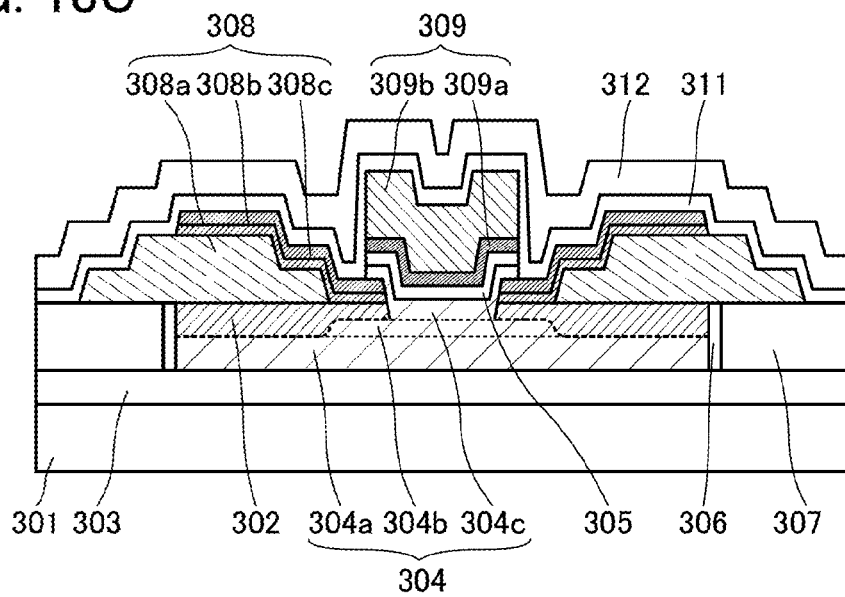

Then, the insulating film 311 and the insulating film 312 are formed in this order over the insulating film 307, the electrodes 308, and the electrode 309 (FIG. 18C).

The insulating film 311 and the insulating film 312 can be formed by a plasma CVD method, a sputtering method, or the like.

Further, heat treatment may be performed after the formation of the insulating film 312. For example, the heat treatment is performed under conditions of the heat treatment which can be performed after the formation of the gate insulating film 305, whereby oxygen can be supplied from the insulating film 311 to the channel formation region.

In this manner, the transistor 300 in this embodiment can be fabricated.

The above is the description of this fabrication method.

<Modification Example 1>

An example which is partly different from the above fabrication method of the transistor is described below. Specifically, in this modification example, steps up to and including the formation step of the insulating film 307 in the above-described example of the manufacturing method of the transistor are described.

First, in a manner similar to the above, the insulating film 303, the oxide film 304a, and the oxide semiconductor film 304b are formed over the substrate 301.

Figure 20A:
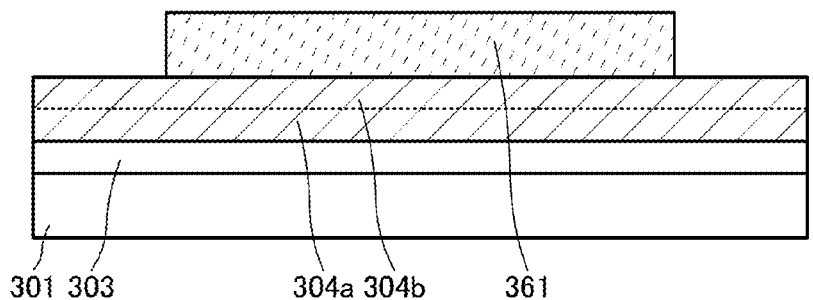
FIGS. 20A to 20D are cross-sectional views illustrating one embodiment of a method for manufacturing a semiconductor device.

Over the oxide semiconductor film 304b, a resist mask 361 is formed (FIG. 20A). The resist mask 361 can be formed by photolithography.

Then, the oxide semiconductor film 304b in a region where the resist mask 361 is not provided is etched by a dry etching method, so that the oxide film 304a is exposed.

Figure 20B:
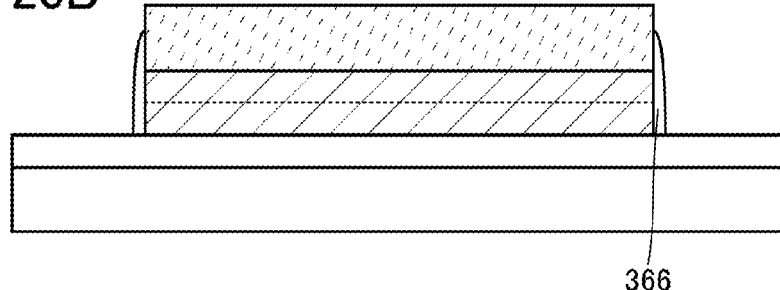

After that, the oxide film 304a which is exposed is etched by a dry etching method. At this time, a reaction product of the oxide film 304a is attached to side surfaces of the oxide film 304a, the oxide semiconductor film 304b, and the resist mask 361 to form an oxide film 366 serving as a sidewall protective layer (also referred to as a sidewall oxide layer or a rabbit ear) (FIG. 20B). The oxide film 366 can be formed as appropriate by the formation method described in Modification Example 4 in Embodiment 1. Then, the resist mask 361 is removed.

Since the oxide film 366 is formed of the reaction product of the oxide film 304a, main components of the oxide film 366 are the same as components of the oxide film 304a.

At this time, the insulating film 303 might be also partly etched, in which case the oxide film 366 contains components of the insulating film 303 (e.g., silicon).

Note that since the oxide film 366 is formed of the reaction product of the oxide film 304a, components of the etching gas used at the time of etching (e.g., chlorine and boron) remain therein in some cases.

Figure 20C:
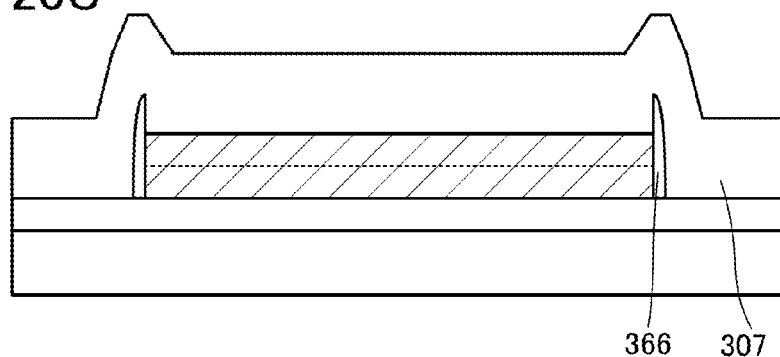

Then, the insulating film 307 is formed so as to cover the oxide semiconductor film 304b and the oxide film 366 (FIG. 20C). The insulating film 307 may be formed in a manner similar to the above.

Figure 20D:
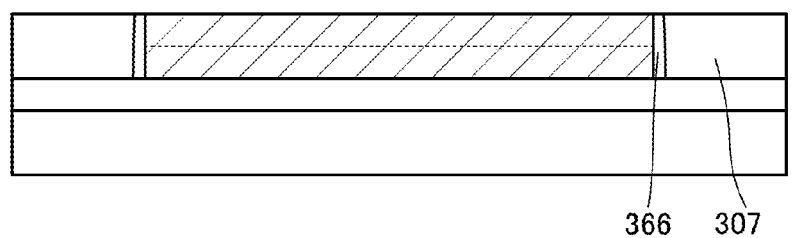

The insulating film 307 is then subjected to planarization treatment, so that the top surface of the oxide semiconductor film 304b is exposed (FIG. 20D).

At this time, a part of the oxide film 366 which protrudes above the top surface of the oxide semiconductor film 304b is also subjected to the planarization treatment, whereby the levels of top surfaces of the insulating film 307, the oxide film 366, and the oxide semiconductor film 304b can be substantially the same.

In this manner, a structure can be provided which includes the oxide semiconductor film 304b (and the oxide film 304a) embedded in the insulating film 307, and the oxide film 366 surrounding the side surfaces of the oxide semiconductor film 304b and the oxide film 304a.

The above-described manufacturing of the transistor is applied to the subsequent steps; accordingly, a highly reliable transistor can be fabricated.

In the manufacturing method described in this modification example, it is possible to skip steps of film formation and etching which are performed to form the oxide film in contact with the side surfaces of the oxide semiconductor film 304b and the oxide film 304a, so that the process can be simplified.

<Modification Example 2>

A manufacturing method of a transistor which is partly different from the manufacturing method in Embodiment 3 is described below. Here, as in Modification Example 1, steps up to and including the formation step of the insulating film 307 are described.

First, in a manner similar to the above, the insulating film 303, the oxide film 304a, and the oxide semiconductor film 304b are formed over the substrate 301.

Figure 21A:
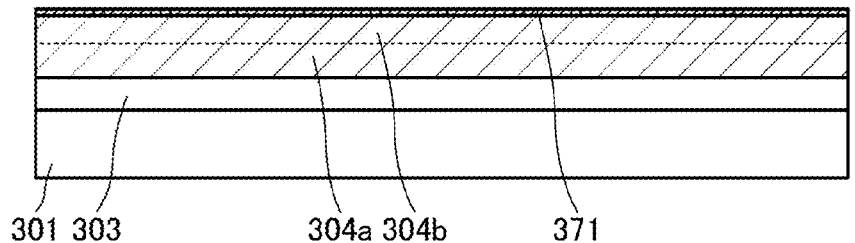
FIGS. 21A to 21E are cross-sectional views illustrating one embodiment of a method for manufacturing a semiconductor device.

A barrier film 371 is formed over the oxide semiconductor film 304b (FIG. 21A).

The barrier film 371 has a function of preventing the oxide semiconductor film 304b from being etched by planarization treatment to be performed later.

For the barrier film 371, a material resistant to the planarization treatment is selected. Any of an insulator, a conductor, and a semiconductor can be used since the barrier film 371 is removed later by etching. For example, a film formed by a sputtering method or a CVD method using silicon nitride or aluminum oxide may be used.

A stack of the oxide film 304a, the oxide semiconductor film 304b, and the barrier film 371 is selectively etched to be processed into an island-like shape.

Figure 21B:
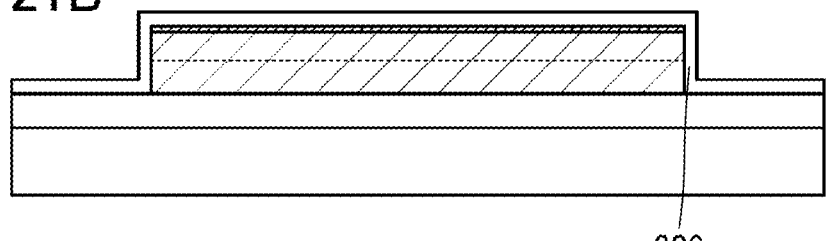

Next, the oxide film 306 is formed by a method similar to the above-described method (FIG. 21B).

Then, the oxide film 306 except for that in a region in contact with side surfaces of the oxide film 304a, the oxide semiconductor film 304b, and the barrier film 371 is removed by anisotropic etching, so that the oxide film 306 which is in contact with a side surface of the stack of the oxide film 304a, the oxide semiconductor film 304b, and the barrier film 371 is formed.

Figure 21C:
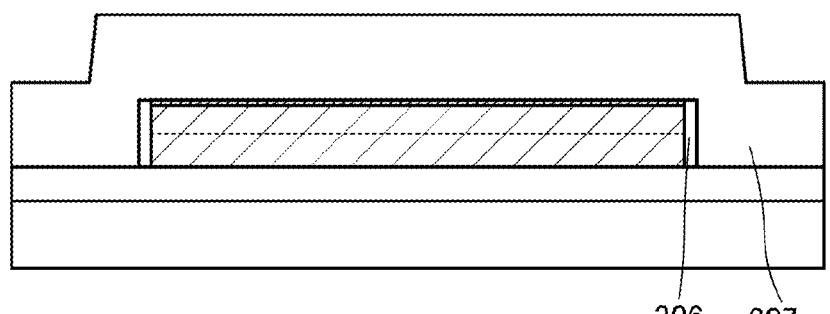

After that, by a method similar to the above-described method, the insulating film 307 is formed so as to cover the oxide film 306 and the barrier film 371 (FIG. 21C).

Figure 21D:
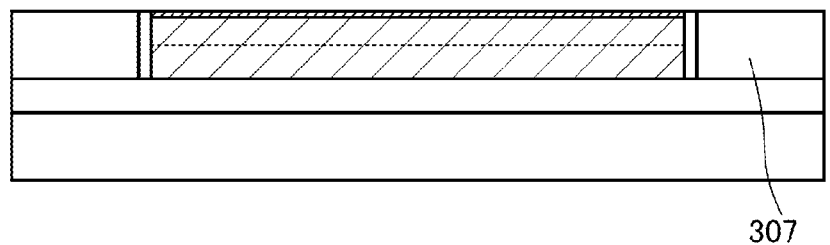

Then, the insulating film 307 is subjected to planarization treatment, so that top surfaces of the barrier film 371 and the oxide film 306 are exposed (FIG. 21D).

At this time, since the barrier film 371 is provided over the oxide semiconductor film 304b, a reduction in the thickness of the oxide semiconductor film 304b due to the planarization treatment can be prevented. In addition, owing to the barrier film 371, the degree of freedom in setting conditions of the planarization treatment can be increased.

Figure 21E:
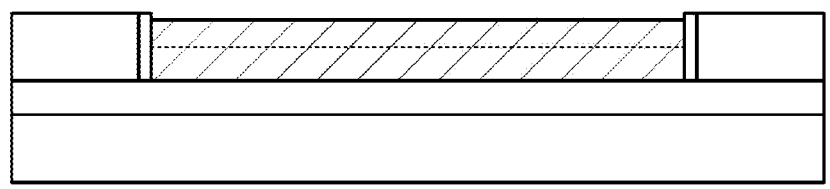

Then, the barrier film 371 is removed by etching (FIG. 21E). At the time of removing the barrier film 371, the conditions are preferably set such that at least the oxide semiconductor film 304b is not easily etched.

In this manner, a structure can be provided which includes the oxide semiconductor film 304b (and the oxide film 304a) embedded in the insulating film 307, and the oxide film 306 surrounding the side surfaces of the oxide semiconductor film 304b and the oxide film 304a.

Here, the top surface of the oxide semiconductor film 304b is located below the top surfaces of the oxide film 306 and the insulating film 307 after the removal of the barrier film 371, whereby a step is formed between the oxide semiconductor film 304b and the oxide film 306 in some cases. Thus, in order to reduce an adverse effect on coverage with a layer to be provided over the oxide semiconductor film 304b and the oxide film 306, the thickness of the barrier film 371 is preferably small. The barrier film 371 is preferably formed as thin as possible, as long as the barrier layer is resistant to the planarization treatment. The thickness may be greater than or equal to 0.1 nm and less than or equal to 10 nm, preferably greater than or equal to 1 nm and less than or equal to 5 nm, further preferably greater than or equal to 1 nm and less than or equal to 3 nm. When the barrier film 371 is formed thin, damage to the oxide semiconductor film 304b at the time of etching of the barrier film 371 can be reduced.

The above-described manufacturing method of the transistor is applied to the subsequent steps; accordingly, a highly reliable transistor can be manufactured.

Note that the oxide film in contact with the side surfaces of the oxide semiconductor film 304b and the oxide film 304a can also be formed by the method described in Modification Example 1. In that case, at the same time as processing of the oxide film 304a, the oxide semiconductor film 304b, and the barrier film 371 into an island-like shape, the oxide film in contact with the side surfaces of the oxide film 304a, the oxide semiconductor film 304b, and the barrier film 371 may be formed.

The above is the description of this modification example.

By the manufacturing method described in this modification example, a reduction in the thickness of the oxide semiconductor film 304b due to the planarization treatment can be inhibited. Further, the top surface of the oxide semiconductor film 304b is not directly processed by planarization treatment; thus, physical, chemical, or thermal damage to the oxide semiconductor film 304b can be reduced. Therefore, by application of such a method, a transistor with excellent electric characteristics and improved reliability can be provided.

This embodiment can be combined with any of the other embodiments disclosed in this specification as appropriate.

(Embodiment 5)

In this embodiment, one embodiment applicable to an oxide semiconductor film in the transistor included in the semiconductor device described in the above embodiment will be described.

The oxide semiconductor film can be formed using any of an amorphous oxide semiconductor, a single-crystal oxide semiconductor, and a polycrystalline oxide semiconductor. Alternatively, the oxide semiconductor film may include an oxide semiconductor with a crystallinity part (CAAC-OS).

The CAAC-OS film is one of oxide semiconductor films including a plurality of crystal parts, and most of the crystal parts each fit inside a cube whose one side is less than 100 nm. Thus, there is a case where a crystal part included in the CAAC-OS film fits a cube whose one side is less than 10 nm, less than 5 nm, or less than 3 nm. The density of defect levels of the CAAC-OS film is lower than that of a microcrystalline oxide semiconductor film. The CAAC-OS film is described in detail below.

In a transmission electron microscope (TEM) image of the CAAC-OS film, a boundary between crystal parts, that is, a grain boundary is not clearly observed. Thus, in the CAAC-OS film, a reduction in electron mobility due to the grain boundary is less likely to occur.

According to the TEM image of the CAAC-OS film observed in a direction substantially parallel to a sample surface (cross-sectional TEM image), metal atoms are arranged in a layered manner in the crystal parts. Each metal atom layer has a morphology reflected by a surface over which the CAAC-OS film is formed (hereinafter, a surface over which the CAAC-OS film is formed is referred to as a formation surface) or a top surface of the CAAC-OS film, and is arranged in parallel to the formation surface or the top surface of the CAAC-OS film.

On the other hand, according to the TEM image of the CAAC-OS film observed in a direction substantially perpendicular to the sample surface (plan TEM image), metal atoms are arranged in a triangular or hexagonal configuration in the crystal parts. However, there is no regularity of arrangement of metal atoms between different crystal parts.

From the results of the cross-sectional TEM image and the plan TEM image, alignment is found in the crystal parts in the CAAC-OS film.

A CAAC-OS film is subjected to structural analysis with an X-ray diffraction (XRD) apparatus. For example, when the CAAC-OS film including an InGaZnO$_4$ crystal is analyzed by an out-of-plane method, a peak appears frequently when the diffraction angle (2θ) is around 31°. This peak is derived from the (009) plane of the InGaZnO$_4$ crystal, which indicates that crystals in the CAAC-OS film have c-axis alignment, and that the c-axes are aligned in a direction substantially perpendicular to the formation surface or the top surface of the CAAC-OS film.

On the other hand, when the CAAC-OS film is analyzed by an in-plane method in which an X-ray enters a sample in a direction substantially perpendicular to the c-axis, a peak appears frequently when 2θ is around 56°. This peak is derived from the (110) plane of the InGaZnO$_4$ crystal. Here, analysis (φ scan) is performed under conditions where the sample is rotated around a normal vector of a sample surface as an axis (φ axis) with 2θ fixed at around 56°. In the case where the sample is a single-crystal oxide semiconductor film of InGaZnO$_4$, six peaks appear. The six peaks are derived from crystal planes equivalent to the (110) plane. On the other hand, in the case of a CAAC-OS film, a peak is not clearly observed even when φ scan is performed with 2θ fixed at around 56°.

According to the above results, in the CAAC-OS film having c-axis alignment, while the directions of a-axes and b-axes are different between crystal parts, the c-axes are aligned in a direction parallel to a normal vector of a formation surface or a normal vector of a top surface. Thus, each metal atom layer arranged in a layered manner observed in the cross-sectional TEM image corresponds to a plane parallel to the a-b plane of the crystal.

Note that the crystal part is formed concurrently with deposition of the CAAC-OS film or is formed through crystallization treatment such as heat treatment. As described above, the c-axis of the crystal is aligned in a direction parallel to a normal vector of a formation surface or a normal vector of a top surface. Thus, for example, in the case where a shape of the CAAC-OS film is changed by etching or the like, the c-axis might not be necessarily parallel to a normal vector of a formation surface or a normal vector of a top surface of the CAAC-OS film.

Further, the degree of crystallinity in the CAAC-OS film is not necessarily uniform. For example, in the case where crystal growth leading to the CAAC-OS film occurs from the vicinity of the top surface of the film, the degree of the crystallinity in the vicinity of the top surface is higher than that in the vicinity of the formation surface in some cases. Further, when an impurity is added to the CAAC-OS film, the crystallinity in a region to which the impurity is added is changed, and the degree of crystallinity in the CAAC-OS film varies depending on regions.

Note that when the CAAC-OS film with an InGaZnO$_4$ crystal is analyzed by an out-of-plane method, a peak of 2θ may also be observed at around 36°, in addition to the peak of 2θ at around 31°. The peak of 2θ at around 36° indicates that a crystal having no c-axis alignment is included in part of the CAAC-OS film. It is preferable that in the CAAC-OS film, a peak of 2θ appear at around 31° and a peak of 2θ do not appear at around 36°.

There are three methods for forming a CAAC-OS.

The first method is to form an oxide semiconductor film at a temperature in the range of 100° C. to 450° C. to form, in the oxide semiconductor film, crystal parts in which the c-axes are aligned in the direction parallel with a normal vector of a surface where the oxide semiconductor film is formed or a normal vector of a surface of the oxide semiconductor film.

The second method is to form an oxide semiconductor film with a small thickness and then heat it at a temperature in the range of 200° C. to 700° C., to form, in the oxide semiconductor film, crystal parts in which the c-axes are aligned in the direction parallel with a normal vector of a surface where the oxide semiconductor film is formed or a normal vector of a surface of the oxide semiconductor film.

The third method is to form a first oxide semiconductor film with a small thickness, then heat it at a temperature in the range of 200° C. to 700° C., and form a second oxide semiconductor film to form, in the second oxide semiconductor film, crystal parts in which the c-axes are aligned in the direction parallel with a normal vector of the surface where the second oxide semiconductor film is formed or to a normal vector of the top surface of the second oxide semiconductor film.

In a transistor in which a CAAC-OS is used for an oxide semiconductor film, change in electric characteristics due to irradiation with visible light or ultraviolet light is small. Accordingly, the transistor including a CAAC-OS film as an oxide semiconductor film has favorable reliability.

For the deposition of the CAAC-OS film, the following conditions are preferably used.

By reducing the number of impurities entering the CAAC-OS film during the deposition, the crystal state can be prevented from being broken by the impurities. For example, the concentration of impurities (e.g., hydrogen, water, carbon dioxide, or nitrogen) which exist in a deposition chamber may be reduced. Furthermore, the concentration of impurities in a deposition gas may be reduced. Specifically, a deposition gas whose dew point is −80° C. or lower, preferably −100° C. or lower is used.

By increasing the heating temperature of the surface where the CAAC-OS film is formed (for example, the substrate heating temperature) during the deposition, migration of a sputtered particle is likely to occur after the sputtered particle reaches the surface where the CAAC-OS film is formed. Specifically, the temperature of the surface where the CAAC-OS film is formed during the deposition is higher than or equal to 100° C. and lower than or equal to 740° C., preferably higher than or equal to 150° C. and lower than or equal to 500° C.

Furthermore, it is preferable that the proportion of oxygen in the deposition gas be increased and the power be optimized in order to reduce plasma damage at the deposition. The proportion of oxygen in the deposition gas is higher than or equal to 30 vol. % and lower than or equal to 100 vol. %.

As an example of the sputtering target, an In—Ga—Zn—O compound target is described below.

The In—Ga—Zn—O compound target, which is polycrystalline, is made by mixing $InO_X$ powder, $GaO_Y$ powder, and $ZnO_Z$ powder in a predetermined molar ratio, applying pressure, and performing a heat treatment at a temperature higher than or equal to 1000° C. and lower than or equal to 1500° C. This pressure treatment may be performed while cooling is performed or may be performed while heating is performed. Note that X, Y, and Z are each a given positive number. Here, the predetermined molar ratio of $InO_X$ powder to $GaO_Y$ powder and $ZnO_Z$ powder is, for example, 2:2:1, 8:4:3, 3:1:1, 1:1:1, 4:2:3, or 3:1:2. The kinds of powder and the molar ratio for mixing powder may be determined as appropriate depending on the desired sputtering target.

Note that the structures and the like described in this embodiment can be combined as appropriate with any of the structures and the like described in the other embodiments and example.

(Embodiment 6)

In this embodiment, a semiconductor device of one embodiment of the present invention which includes the transistor described in the above embodiment will be described with reference to the drawing.

The semiconductor device in this embodiment includes a plurality of transistors, including the transistor described in the above embodiment. At least one of the plurality of transistors is stacked in the longitudinal direction in order to increase the degree of integration.

<Structural Example 1 of Semiconductor Device>

Figure 22A:
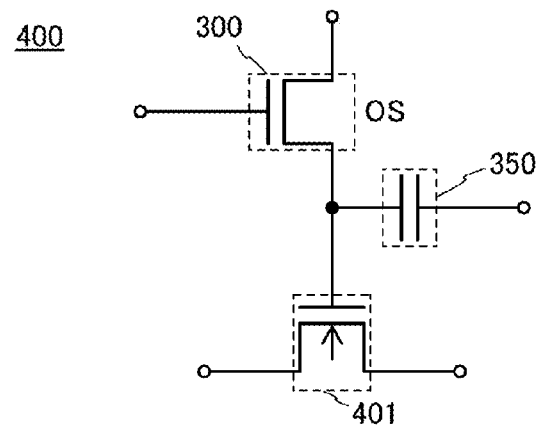
FIGS. 22A and 22B are a circuit diagram and a cross-sectional view illustrating a semiconductor device of one embodiment of the present invention.

FIG. 22A is a circuit diagram of a semiconductor device 400 which is described in this embodiment. The semiconductor device 400 includes the transistor 300 and the capacitor 350 which are described in the above embodiment, and a transistor 401.

The connection relation in the semiconductor device 400 is as follows. A gate of the transistor 401 is electrically connected to one electrode of the capacitor 350 and a source or a drain of the transistor 300.

Another circuit element (e.g., a transistor or a capacitor) may be electrically connected to any of a gate of the transistor 300, the source or the drain of the transistor 300, the other electrode of the capacitor 350, and a source and a drain of the transistor 401.

The transistor 300 is an n-channel transistor which includes an oxide semiconductor, as described in the above embodiment.

The transistor 401 is an n-channel transistor which includes a semiconductor material other than an oxide semiconductor. For example, a compound semiconductor such as a silicon semiconductor, a germanium semiconductor, gallium arsenide, or gallium nitride can be used. By the use of a single crystal substrate, a polycrystalline substrate, a silicon on insulator (SOI) substrate, or the like for the transistor 401, a transistor which operates at high speed can be easily fabricated.

The transistor 300 includes an oxide semiconductor, and at least in its channel formation region, high purity is achieved by sufficient removal of impurities such as hydrogen and oxygen vacancies are reduced; thus, an off-state current (also referred to as leakage current or off leakage current) of the transistor is reduced.

In addition, since an off-state current of the transistor 300 is extremely low, electric charge can be held between the source or the drain of the transistor 300, one electrode of the capacitor 350, and the gate of the transistor 401. In other words, the semiconductor device 400 can function as a semiconductor memory device.

In the semiconductor device 400, since the transistor 300 includes the oxide semiconductor, power consumption is small as compared to the case where the semiconductor device illustrated in the circuit diagram in FIG. 22A is all formed using a semiconductor material other than an oxide semiconductor.

Figure 22B:
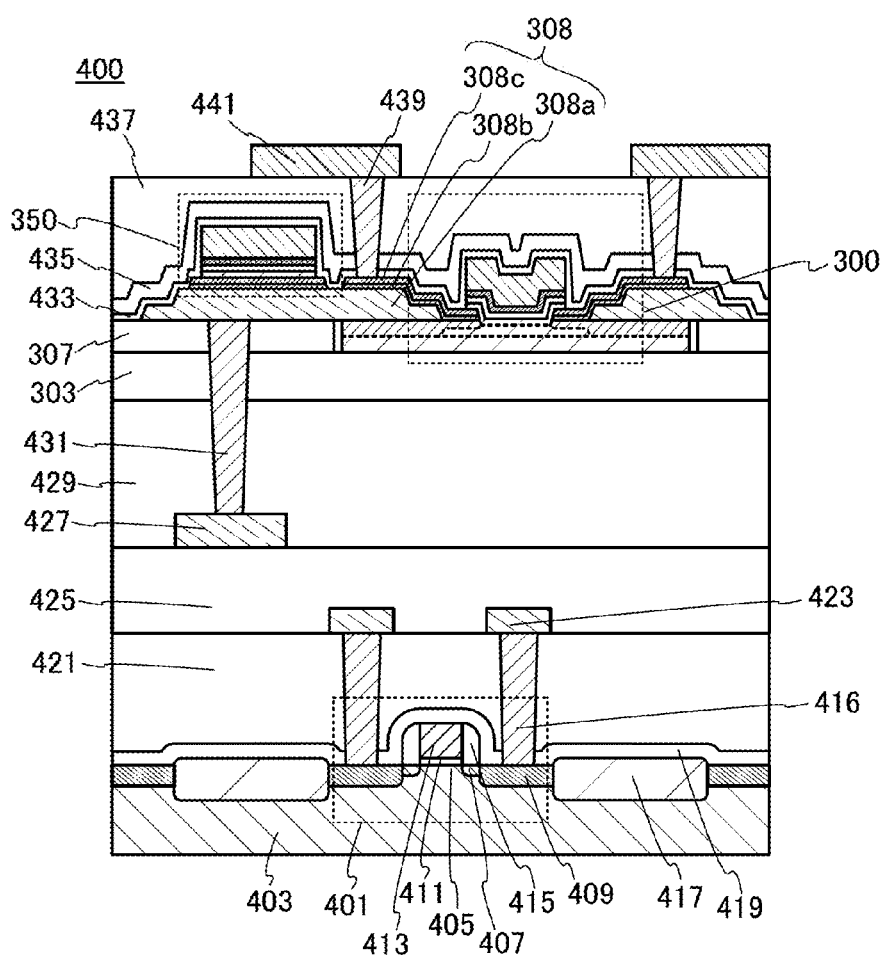

FIG. 22B is a cross-sectional view illustrating a cross-sectional structure of the semiconductor device 400.

In the semiconductor device 400, the transistor 300 and the capacitor 350 are stacked over the transistor 401 with interlayer insulating films provided therebetween. Details of the semiconductor device 400 are described below.

The transistor 401 can be formed using a substrate 403, which includes a semiconductor material. Here, a single crystal silicon substrate having p-type conductivity is used, and the channel formation region of the transistor 401 is formed in the substrate 403. Note that the substrate 403 is not limited to a single crystal silicon substrate having p-type conductivity and can be a single crystal silicon substrate having n-type conductivity, an SOI substrate, a glass substrate on which polycrystalline silicon is formed, or the like.

The transistor 401 includes a channel formation region 405 which is provided in the substrate 403; impurity regions 407 between which the channel formation region 405 is sandwiched; high-concentration impurity regions 409 which are electrically connected to the impurity regions 407 (the impurity regions 407 and the high-concentration impurity regions 409 are also referred to as impurity regions collectively); a gate insulating film 411 which is provided over the channel formation region 405; a gate electrode 413 which is provided over the gate insulating film 411; and sidewall insulating films 415 which are provided on side surfaces of the gate electrode 413.

An insulating film 419 is provided over the transistor 401, and an interlayer insulating film 421 is provided over the insulating film 419. An opening reaching the high-concentration impurity region 409 is provided in the insulating film 419 and the interlayer insulating film 421. In the opening, a source electrode or a drain electrode (hereinafter referred to as an electrode 416) of the transistor 401 is provided.

A wiring 423 is provided in contact with the electrode 416. The wiring 423 is provided in contact with the source electrode or the drain electrode to function as a source wiring or a drain wiring. The wiring 423 is electrically connected to other elements which are included in the semiconductor device 400, other devices, or the like.

In addition, element isolation insulating films 417 are provided on the substrate 403 so as to surround the transistor 401. The insulating film 419 is provided so as to cover the transistor 401 and the element isolation insulating films 417.

The impurity region 407 functions as an LDD region or an extension region. The high-concentration impurity region 409 functions as a source region or a drain region of the transistor 401.

An interlayer insulating film 425 is provided over the interlayer insulating film 421. A wiring 427 is provided over the interlayer insulating film 425. The wiring 427 functions as a wiring. The wiring 427 is electrically connected to a gate wiring (not illustrated) which is electrically connected to the gate electrode 413 through an opening (not illustrated) which is formed in the insulating film 419, the interlayer insulating film 421, and the interlayer insulating film 425. The gate wiring is provided over the gate insulating film 411 and partly branches to be the gate electrode 413.

An interlayer insulating film 429 is provided over the interlayer insulating film 425 and the wiring 427. The transistor 300 and the capacitor 350 are provided over the interlayer insulating film 429. Note that for details of the transistor 300 and the capacitor 350, the above embodiment can be referred to.

An electrode 431 is provided so as to penetrate the interlayer insulating film 429, the insulating film 303, and the insulating film 307 and to be in contact with the wiring 427 and the electrode 308a of the transistor 300, which also functions as one electrode of the capacitor 350.

Note that in the semiconductor device 400, an insulating film 433 is provided over the transistor 300 and an insulating film 435 is provided over the insulating film 433. An interlayer insulating film 437 is provided over the insulating film 435. An opening reaching the electrode 308c of the transistor 300 is provided in the insulating film 433, the insulating film 435, and the interlayer insulating film 437, and in the opening, an electrode 439 is provided. A wiring 441 is provided in contact with the electrode 439. At least the wiring 441 functions as a source wiring or a drain wiring of the transistor 300.

Since the oxide semiconductor film is surrounded by (or embedded in) the insulating film, the transistor 300 can be referred to as a transistor having a trench structure. The transistor 401 has a trench structure (shallow trench isolation: STI) in which the transistor is surrounded by the element isolation insulating films 417. In other words, the semiconductor device 400, which includes the transistor 300 and the transistor 401, can be referred to as a semiconductor device having a double trench structure.

<Structural Example 2 of Semiconductor Device>

A semiconductor device of one embodiment of the present invention at least includes the transistor 300 described in the above embodiment, and a transistor provided below the transistor 300 is not limited to the transistor 401. A semiconductor device of one embodiment of the present invention whose structure is partly different from that of the semiconductor device 400 is described below.

Figure 23A:
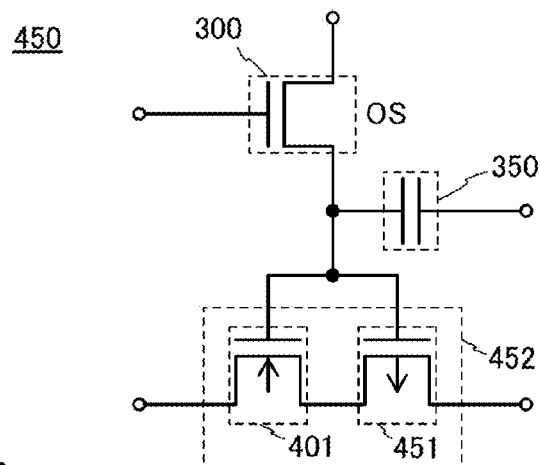
FIGS. 23A and 23B are a circuit diagram and a cross-sectional view illustrating a semiconductor device of one embodiment of the present invention.
Figure 23B:
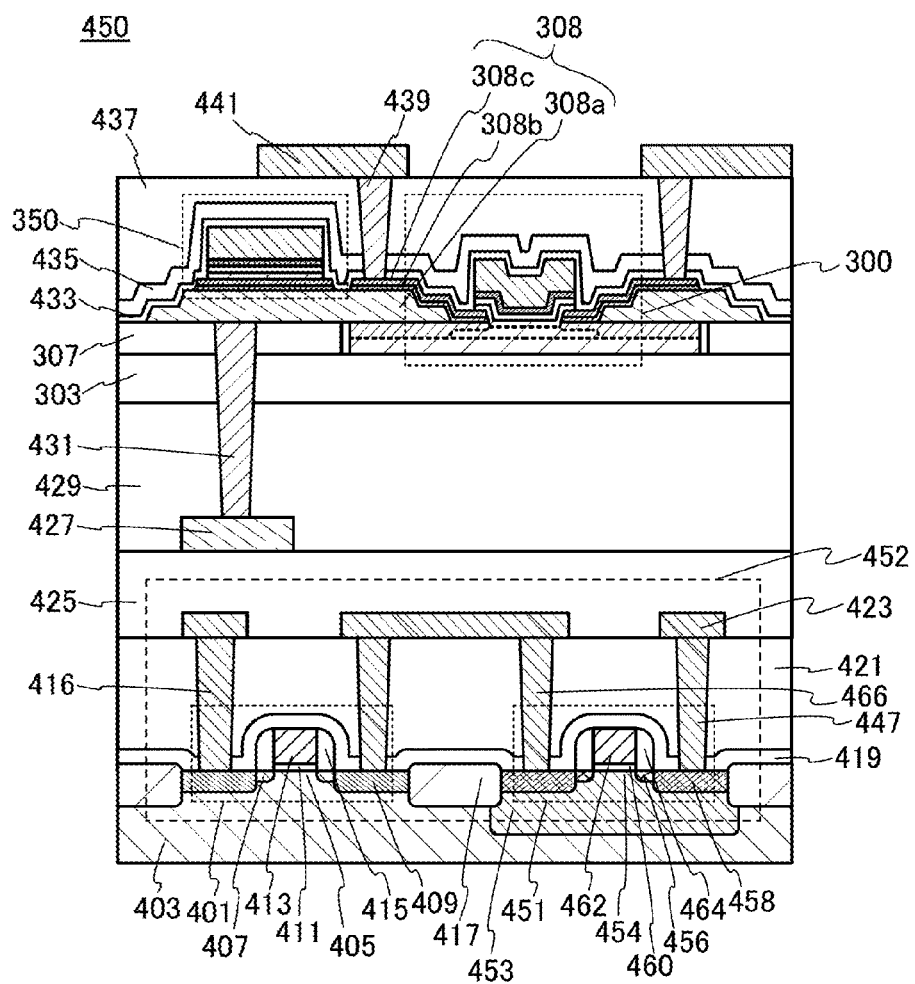

FIG. 23A is a circuit diagram illustrating a semiconductor device 450 whose structure is partly different from that of the semiconductor device 400, and FIG. 23B illustrates a cross-sectional structure of the semiconductor device 450.

The semiconductor device 450 is provided with a transistor 451 that is a p-channel transistor in addition to the transistor 401, and includes a complementary metal oxide semiconductor (CMOS) circuit 452 in which the transistor 401 and the transistor 451 are electrically connected. In the semiconductor device 450, the transistor 300 and the capacitor 350 are stacked over the CMOS circuit 452 with the interlayer insulating films provided therebetween.

Since the transistor 300 is provided, electric charge can be held between the source or the drain of the transistor 300, one electrode of the capacitor 350, and the gates of the transistors 401 and 451 in the semiconductor device 450, as in the semiconductor device 400. In other words, the semiconductor device 450 can function as a semiconductor memory device.

In the semiconductor device 450, since the transistor 300 is included, power consumption is small as compared to the case where the semiconductor device illustrated in the circuit diagram in FIG. 23A is all formed using a semiconductor material other than an oxide semiconductor.

Since the semiconductor device 450 and the semiconductor device 400 are different from each other in mainly structures other than the structures of the transistor 300 and the capacitor 350, the CMOS circuit 452 is described here. Note that in description of the semiconductor device 450, the reference numerals used for the semiconductor device 400 are appropriately used.

In the CMOS circuit 452, the transistor 401 and the transistor 451 are electrically connected as described above. For details of the transistor 401, the above description can be referred to.

The transistor 451 is provided on an n-well 453 which is formed by addition of an impurity element imparting n-type conductivity to the substrate 403. The transistor 451 includes a channel formation region 454 which is provided in the n-well 453; impurity regions 456 between which the channel formation region 454 is sandwiched; high-concentration impurity regions 458 which are electrically connected to the impurity regions 456 (the impurity regions 456 and the high-concentration impurity regions 458 are also referred to as impurity regions collectively); a gate insulating film 460 which is provided over the channel formation region 454; a gate electrode 462 which is provided over the gate insulating film 460; and sidewall insulating films 464 which are provided on side surfaces of the gate electrode 462.

The insulating film 419 is provided over the transistor 401 and the transistor 451, and the interlayer insulating film 421 is provided over the insulating film 419. An opening reaching the high-concentration impurity region 458 is provided in the insulating film 419 and the interlayer insulating film 421. In the opening, a source electrode or a drain electrode (hereinafter referred to as an electrode 447) of the transistor 451 is provided.

The wiring 423 is provided in contact with the electrode 447. The wiring 423 is provided in contact with the source electrode or the drain electrode to function as a source wiring or a drain wiring. The wiring 423 is electrically connected to other elements which are included in the semiconductor device 450, other devices, or the like.

In the case of the semiconductor device 450, the element isolation insulating films 417 are provided on the substrate 403 so as to surround the transistor 401 and the transistor 451.

The impurity region 456 functions as an LDD region or an extension region. The high-concentration impurity region 458 functions as a source region or a drain region of the transistor 451.

In the semiconductor device 450, electrodes 466 are provided in contact with the high-concentration impurity region 409 which is closer to the transistor 451 in the transistor 401 and the high-concentration impurity region 458 which is closer to the transistor 401 in the transistor 451. The electrodes 466 function as the source electrode or the drain electrode of the transistor 401 and the source electrode or the drain electrode of the transistor 451. Further, the transistor 401 and the transistor 451 are electrically connected to each other with the electrodes 466 to form the CMOS circuit 452.

The semiconductor device 450, which includes the transistors 401 and 451 with trench structures in addition to the transistor 300, can be referred to as a semiconductor device having a double trench structure.

□Structural Example 3 of Semiconductor Device>

A semiconductor device of one embodiment of the present invention whose structure is partly different from that of the semiconductor device 400 or the semiconductor device 450 is described below.

Figure 24:
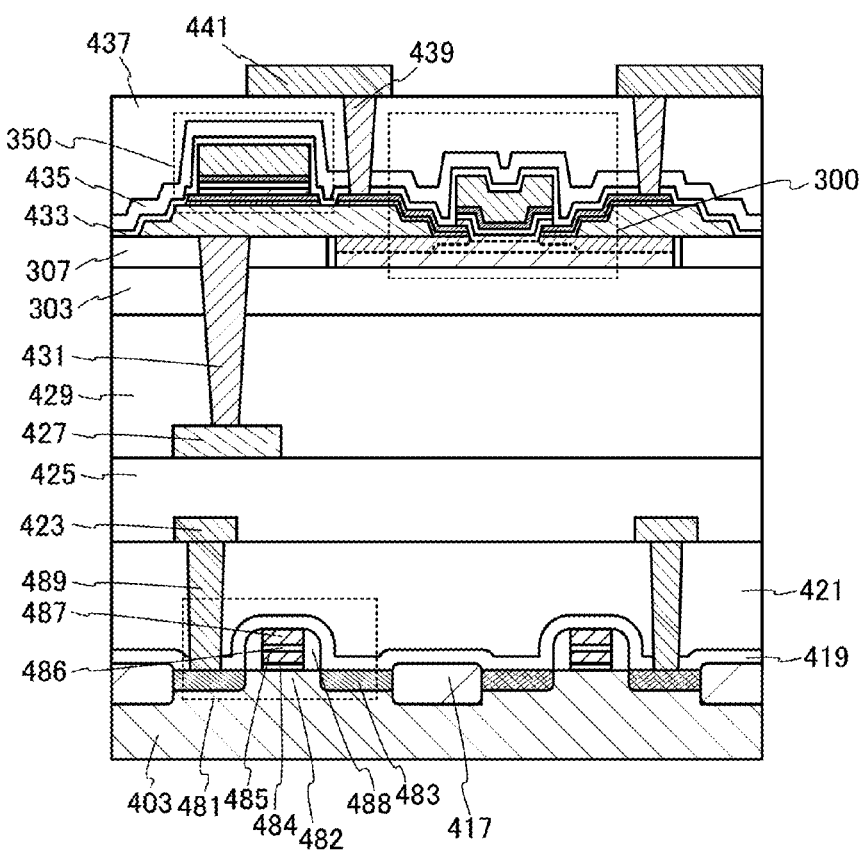
FIG. 24 is a cross-sectional view illustrating a semiconductor device of one embodiment of the present invention.

FIG. 24 is a circuit diagram illustrating a semiconductor device 480 whose structure is partly different from that of the semiconductor device 400 or the semiconductor device 450.

In the semiconductor device 480, the transistor 300 and the capacitor 350 are stacked over a transistor 481 with interlayer insulating films provided therebetween.

Since the semiconductor device 480 includes the transistor 300 with a reduced off-state current, the power consumption can be reduced.

The element isolation insulating films 417 are provided on the substrate 403 over which the transistor 481 is formed. Impurity regions 483, between which a channel formation region 482 is sandwiched, are provided between the element isolation insulating films 417. A gate insulating film 484 is provided over the channel formation region 482. A first gate electrode 485 is provided over the gate insulating film 484. An insulating film 486 is provided over the first gate electrode 485. A second gate electrode 487 is provided over the insulating film 486. Sidewall insulating layers 488 are provided on side surfaces of the gate insulating film 484, the first gate electrode 485, the insulating film 486, and the second gate electrode 487.

The insulating film 419 is provided over the transistor 481. The interlayer insulating film 421 is provided over the insulating film 419. Electrodes 489 are provided in the insulating film 419 and the interlayer insulating film 421 to be in contact with the impurity regions 483. The wirings 423 are provided in contact with the electrodes 489.

The interlayer insulating film 425 is provided over the wirings 423. The wiring 427 is provided over the interlayer insulating film 425. The wiring 427 is electrically connected to other elements of the semiconductor device 480, such as the transistor 481 (including the electrode 489 and the wiring 423), other devices, and the like.

The components provided over the wiring 427 are the same as those of the semiconductor device 400 and the semiconductor device 450.

In the transistor 481, the first gate electrode 485 functions as a floating gate; thus, the transistor 481 can function as a nonvolatile memory device. As illustrated in FIG. 24, a plurality of the transistors 481 can be provided over the substrate 403. When a plurality of the transistors 481 are provided, it is possible to increase the amount of data which can be stored. Note that in the case where a plurality of the transistors 481 are provided, the electrode 489 is not necessarily provided for each of the transistors.

The transistor 481 can be fabricated by appropriately using the method for manufacturing the transistor 401 or the transistor 451 of the semiconductor device 400 and the semiconductor device 450. A method for manufacturing a transistor which has a known floating gate can also be applied to the manufacture of the transistor 481 as appropriate.

The semiconductor device 480, which includes the transistors 481 with trench structures in addition to the transistor 300, can be referred to as a semiconductor device having a double trench structure.

This embodiment can be combined with any of the other embodiments disclosed in this specification as appropriate.

(Embodiment 7)

Any of the semiconductor devices described in the above embodiments can be applied to a microcomputer, a CPU, and the like which are used for a variety of electronic appliances.

A structure and operation of a fire alarm system that is an example of the electronic appliance using a microcomputer will be described with reference to FIG. 25, FIGS. 26A to 26C, and FIG. 27A.

The fire alarm in this specification refers to any system which raises an alarm over fire occurrence instantly and includes, for example, a residential fire alarm, an automatic fire alarm system, and a fire detector used for the automatic fire alarm system in its category.

Figure 25:
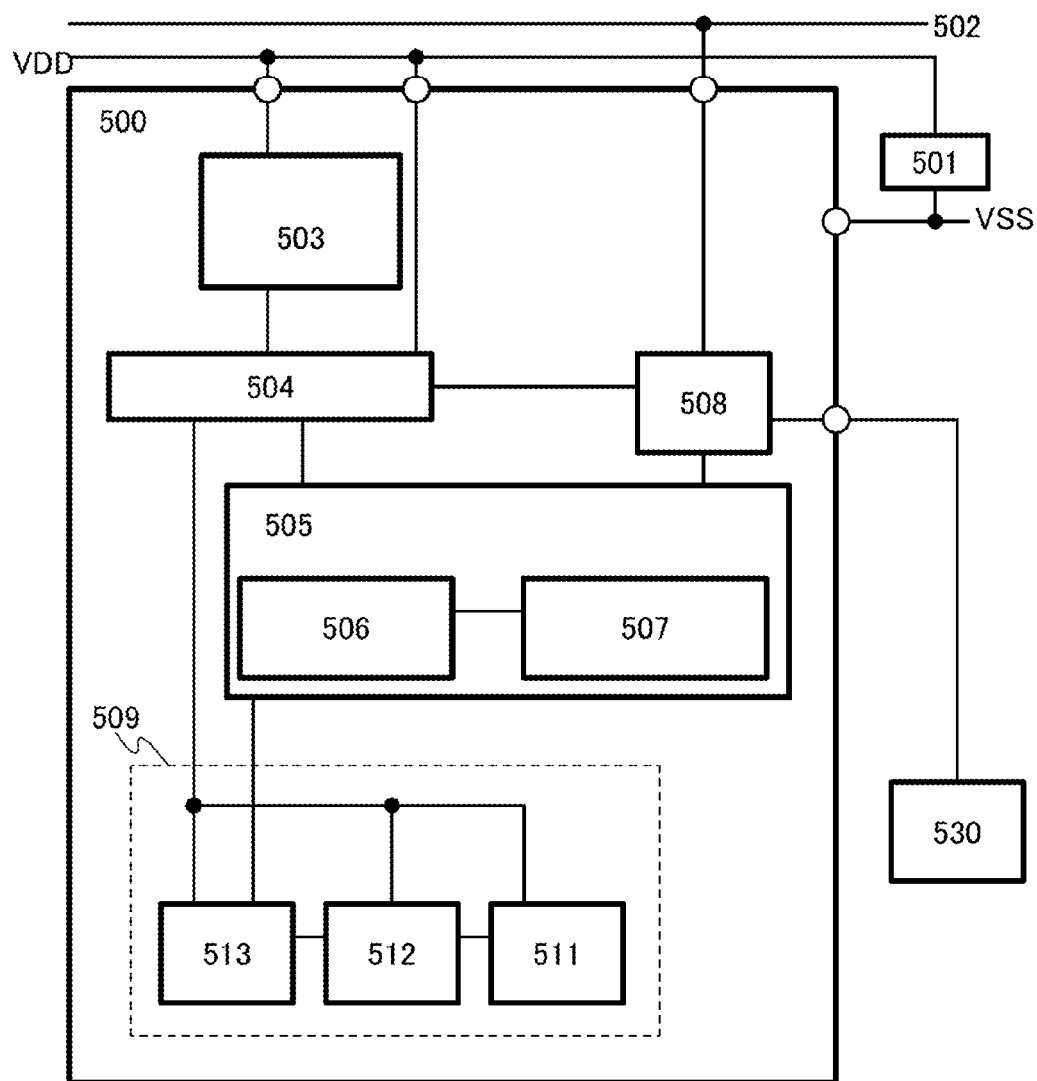
FIG. 25 is a block diagram illustrating a semiconductor device of one embodiment of the present invention.

An alarm system illustrated in FIG. 25 includes at least a microcomputer 500. The microcomputer 500 is provided inside the alarm system. The microcomputer 500 includes a power gate controller 503 electrically connected to a high potential power supply line VDD, a power gate 504 electrically connected to the high potential power supply line VDD and the power gate controller 503, a central processing unit (CPU) 505 electrically connected to the power gate 504, and a sensor portion 509 electrically connected to the power gate 504 and the CPU 505. Further, the CPU 505 includes a volatile memory portion 506 and a nonvolatile memory portion 507.

The CPU 505 is electrically connected to a bus line 502 via an interface 508. The interface 508, as well as the CPU 505, is electrically connected to the power gate 504. As a bus standard of the interface 508, for example, an I²C bus can be used. A light-emitting element 530 electrically connected to the power gate 504 via the interface 508 is provided in the alarm system.

The light-emitting element 530 is preferably an element which emits light with high directivity, and for example, an organic EL element, an inorganic EL element, or an LED can be used.

The power gate controller 503 includes a timer and controls the power gate 504 with the use of the timer. The power gate 504 allows or stops supply of power from the high potential power supply line VDD to the CPU 505, the sensor portion 509, and the interface 508, in accordance with the control by the power gate controller 503. Here, as an example of the power gate 504, a switching element such as a transistor can be given.

With the use of the power gate controller 503 and the power gate 504, power is supplied to the sensor portion 509, the CPU 505, and the interface 508 in a period during which the amount of light is measured, and supply of power to the sensor portion 509, the CPU 505, and the interface 508 can be stopped during an interval between measurement periods. The alarm system operates in such a manner, whereby power consumption can be reduced as compared to the case where power is continuously supplied to the above structures.

In the case where a transistor is used as the power gate 504, it is preferable to use a transistor which has an extremely low off-state current and can be used for the nonvolatile memory portion 507, for example, any of the transistors described in the above embodiments. With the use of such a transistor, a leakage current can be reduced when supply of power is stopped by the power gate 504, so that power consumption can be reduced.

A direct-current power source 501 may be provided in the alarm system so that power is supplied from the direct-current power source 501 to the high potential power supply line VDD. An electrode of the direct-current power source 501 on the high potential side is electrically connected to the high potential power supply line VDD, and an electrode of the direct-current power source 501 on the low potential side is electrically connected to a low potential power supply line VSS. The low potential power supply line VSS is electrically connected to the microcomputer 500. Here, the high potential power supply line VDD is supplied with a high potential H. The low potential power supply line VSS is supplied with a low potential L, for example, a ground potential (GND).

In the case where a battery is used as the direct-current power source 501, for example, a battery case which includes an electrode electrically connected to the high potential power supply line VDD, an electrode electrically connected to the low potential power supply line VSS, and a housing which can hold the battery is provided in the housing. Note that the alarm system does not necessarily include the direct-current power source 501 and may have, for example, a structure in which power is supplied from an alternate-current power source provided outside the alarm system through a wiring.

As the above battery, a secondary battery such as a lithium ion secondary battery (also called a lithium ion storage battery or a lithium ion battery) can be used. Further, a solar battery is preferably provided so that the secondary battery can be charged.

The sensor portion 509 measures a physical quantity relating to an abnormal situation and transmits a measured value to the CPU 505. A physical quantity relating to an abnormal situation depends on the usage of the alarm system, and in an alarm system functioning as a fire alarm, a physical quantity relating to a fire is measured. Thus, the sensor portion 509 measures the amount of light as a physical quantity relating to a fire and senses smoke.

The sensor portion 509 includes an optical sensor 511 electrically connected to the power gate 504, an amplifier 512 electrically connected to the power gate 504, and an AD converter 513 electrically connected to the power gate 504 and the CPU 505. The light-emitting element 530, the optical sensor 511, the amplifier 512, and the AD converter 513 operate when the power gate 504 allows supply of power to the sensor portion 509.

The optical sensor 511 includes at least a photoelectric conversion element such as a photodiode. The optical sensor 511 can be manufactured by utilizing the manufacturing process of any of the semiconductor devices (e.g., the semiconductor device 400, the semiconductor device 450, and the semiconductor device 480) which are described in the above embodiments.

The photoelectric conversion element can be fabricated with the use of a semiconductor film which can perform photoelectric conversion, and for example, silicon, germanium, or the like can be used. In the case of using silicon for the semiconductor film, an optical sensor which senses visible light can be obtained. Further, there is a difference between silicon and germanium in wavelengths of absorbed electromagnetic waves. In the case of using germanium for the semiconductor film, a sensor which senses infrared rays can be obtained.

In the above manner, the sensor portion 509 including the optical sensor 511 can be incorporated into the microcomputer 500, so that the number of components can be reduced and the housing of the alarm system can be reduced.

In the fire alarm including the above-described IC chip, the CPU 505 in which a plurality of circuits each including any of the above transistors are combined and mounted on one IC chip is used.

Figure 26A:
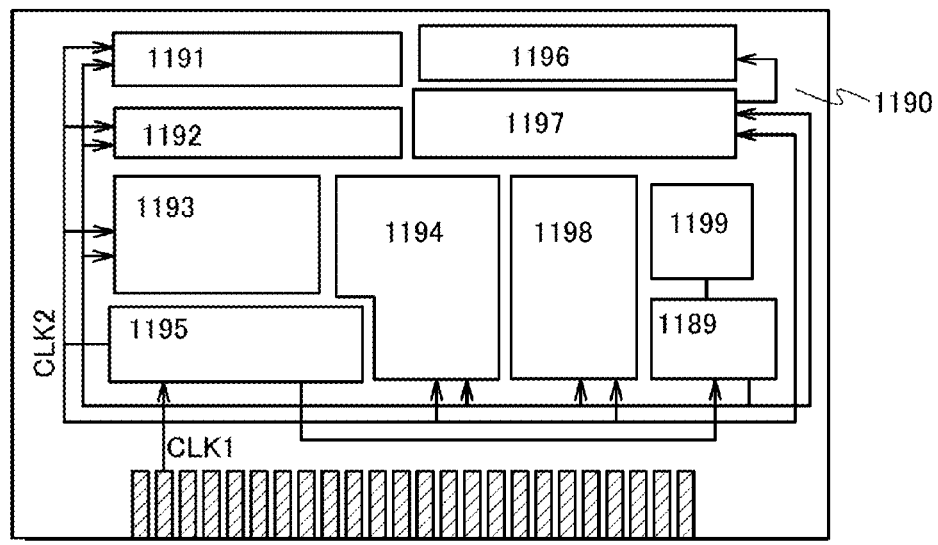
FIGS. 26A to 26C are block diagrams illustrating a semiconductor device of one embodiment of the present invention.
Figure 26B:
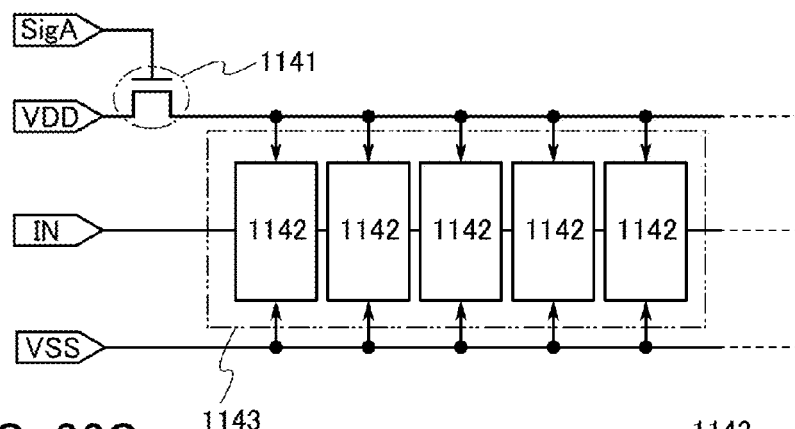
Figure 26C:
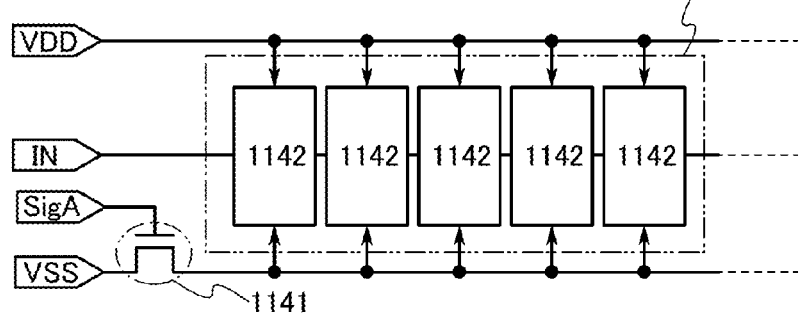

FIGS. 26A to 26C are block diagrams illustrating a specific structure of a CPU at least partly including any of the semiconductor devices described in the above embodiments.

The CPU illustrated in FIG. 26A includes an arithmetic logic unit (ALU) 1191, an ALU controller 1192, an instruction decoder 1193, an interrupt controller 1194, a timing controller 1195, a register 1196, a register controller 1197, a bus interface (Bus I/F) 1198, a rewritable ROM 1199, and a ROM interface (ROM I/F) 1189 over a substrate 1190. A semiconductor substrate, an SOI substrate, a glass substrate, or the like is used as the substrate 1190. The ROM 1199 and the ROM interface 1189 may be provided over separate chips. Needless to say, the CPU in FIG. 26A is just an example of a simplified structure, and an actual CPU may have a variety of structures depending on the application.

An instruction that is input to the CPU through the bus interface 1198 is input to the instruction decoder 1193 and decoded therein, and then, input to the ALU controller 1192, the interrupt controller 1194, the register controller 1197, and the timing controller 1195.

The ALU controller 1192, the interrupt controller 1194, the register controller 1197, and the timing controller 1195 conduct various controls in accordance with the decoded instruction. Specifically, the ALU controller 1192 generates signals for controlling the operation of the ALU 1191. While the CPU is executing a program, the interrupt controller 1194 judges an interrupt request from an external input/output device or a peripheral circuit on the basis of its priority or a mask state, and processes the request. The register controller 1197 generates an address of the register 1196, and reads/writes data from/to the register 1196 in accordance with the state of the CPU.

The timing controller 1195 generates signals for controlling operation timings of the ALU 1191, the ALU controller 1192, the instruction decoder 1193, the interrupt controller 1194, and the register controller 1197. For example, the timing controller 1195 includes an internal clock generator for generating an internal clock signal CLK2 on the basis of a reference clock signal CLK1, and supplies the internal clock signal CLK2 to the above circuits.

In the CPU illustrated in FIG. 26A, a memory cell is provided in the register 1196. As the memory cell of the register 1196, the above transistor can be used.

In the CPU illustrated in FIG. 26A, the register controller 1197 selects an operation of holding data in the register 1196 in accordance with an instruction from the ALU 1191. That is, the register controller 1197 selects whether data is held by a flip-flop or by a capacitor in the memory cell included in the register 1196. When data holding by the flip-flop is selected, a power supply voltage is supplied to the memory cell in the register 1196. When data holding by the capacitor is selected, the data is rewritten in the capacitor, and supply of a power supply voltage to the memory cell in the register 1196 can be stopped.

The power supply can be stopped by a switching element provided between a memory cell group and a node to which a power supply potential VDD or a power supply potential VSS is supplied, as illustrated in FIG. 26B or FIG. 26C. Circuits illustrated in FIGS. 26B and 26C are described below.

FIGS. 26B and 26C each illustrate a memory device in which any of the semiconductor devices described in the above embodiments is used as a switching element which controls supply of a power supply potential to a memory cell.

The memory device illustrated in FIG. 26B includes a switching element 1141 and a memory cell group 1143 including a plurality of memory cells 1142. Specifically, as each of the memory cells 1142, the above transistor can be used. Each of the memory cells 1142 included in the memory cell group 1143 is supplied with the high-level power supply potential VDD via the switching element 1141. Further, each of the memory cells 1142 included in the memory cell group 1143 is supplied with a potential of a signal IN and the low-level power supply potential VSS.

In FIG. 26B, the above transistor is used as the switching element 1141, and the switching of the transistor is controlled by a signal SigA supplied to a gate electrode layer thereof.

Note that FIG. 26B illustrates the structure in which the switching element 1141 includes only one transistor; however, one embodiment of the present invention is not limited thereto and the switching element 1141 may include a plurality of transistors. In the case where the switching element 1141 includes a plurality of transistors which serve as switching elements, the plurality of transistors may be connected to each other in parallel, in series, or in combination of parallel connection and series connection.

Although the switching element 1141 controls the supply of the high-level power supply potential VDD to each of the memory cells 1142 included in the memory cell group 1143 in FIG. 26B, the switching element 1141 may control the supply of the low-level power supply potential VSS.

FIG. 26C illustrates an example of a memory device in which each of the memory cells 1142 included in the memory cell group 1143 is supplied with the low-level power supply potential VSS via the switching element 1141. The supply of the low-level power supply potential VSS to each of the memory cells 1142 included in the memory cell group 1143 can be controlled by the switching element 1141.

When a switching element is provided between a memory cell group and a node to which the power supply potential VDD or the power supply potential VSS is supplied, data can be held even in the case where an operation of a CPU is temporarily stopped and the supply of the power supply voltage is stopped; accordingly, power consumption can be reduced. Specifically, for example, while a user of a personal computer does not input data to an input device such as a keyboard, the operation of the CPU can be stopped, so that the power consumption can be reduced.

Although the CPU is given as an example, the transistor can also be applied to an LSI such as a digital signal processor (DSP), a custom LSI, or a field programmable gate array (FPGA).

Although a microcomputer is described as an example of the semiconductor device in this embodiment, the semiconductor device of one embodiment of the present invention is not limited thereto.

For example, the transistor described in the above embodiment can be used as appropriate for a display device which is a device including a display element, a light-emitting device which is a device including a light-emitting element, and the like.

For example, an electroluminescence (EL) element (e.g., an EL element including organic and inorganic materials, an organic EL element, or an inorganic EL element), an LED (e.g., a white LED, a red LED, a green LED, or a blue LED), a transistor (a transistor which emits light in accordance with current), an electron emitter, a liquid crystal element, electronic ink, or an electrophoretic element can be used as a display element or a light-emitting element.

Note that examples of display devices having EL elements include an EL display. Examples of display devices having electron emitters include a field emission display (FED), an SED-type flat panel display (SED: surface-conduction electron-emitter display), and the like. Examples of display devices including liquid crystal elements include a liquid crystal display (e.g., a transmissive liquid crystal display, a transflective liquid crystal display, a reflective liquid crystal display, a direct-view liquid crystal display, or a projection liquid crystal display). Examples of display devices having electronic ink or electrophoretic elements include electronic paper.

For example, a display medium, whose contrast, luminance, reflectivity, transmittance, or the like changes by an electromagnetic action, such as a grating light valve (GLV), a plasma display panel (PDP), a digital micromirror device (DMD), or a piezoelectric ceramic display can be included as a display device or a light-emitting device.

Next, electronic appliances including the above semiconductor device are described with reference to FIGS. 27A to 27C.

Figure 27A:
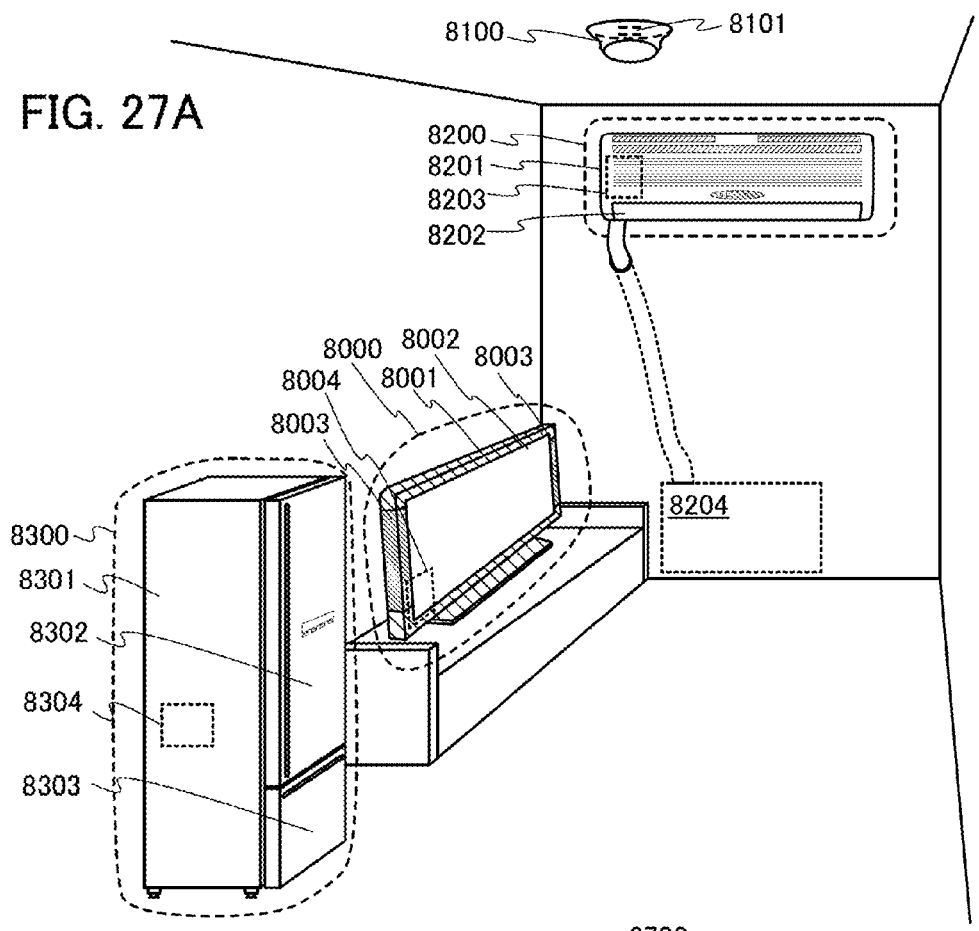
FIGS. 27A to 27C are diagrams illustrating semiconductor devices of embodiments of the present invention.

As illustrated in FIG. 27A, the display device 8000 corresponds to a display device for TV broadcast reception and includes a housing 8001, a display portion 8002, speaker portions 8003, a CPU 8004, and the like. A CPU including any of the above transistors can save the power of the display device 8000. A display device including the above transistor is used as the display portion 8002, whereby display quality of the display device 8000 can be increased.

In FIG. 27A, an alarm system 8100 is a residential fire alarm, which includes a sensor portion and a microcomputer 8101. The microcomputer 8101 includes a CPU in which any of the above transistors is used.

In FIG. 27A, a CPU that uses any of the above transistors is included in an air conditioner which includes an indoor unit 8200 and an outdoor unit 8204. Specifically, the indoor unit 8200 includes a housing 8201, an air outlet 8202, a CPU 8203, and the like. Although the CPU 8203 is provided in the indoor unit 8200 in FIG. 27A, the CPU 8203 may be provided in the outdoor unit 8204. Alternatively, the CPU 8203 may be provided in both the indoor unit 8200 and the outdoor unit 8204. A CPU that uses any of the above transistors can save the power of the air conditioner.

In FIG. 27A, a CPU that uses any of the above transistors is included in an electric refrigerator-freezer 8300. Specifically, the electric refrigerator-freezer 8300 includes a housing 8301, a door for a refrigerator 8302, a door for a freezer 8303, a CPU 8304, and the like. In FIG. 27A, the CPU 8304 is provided in the housing 8301. A CPU that uses any of the above transistors can save the power of the electric refrigerator-freezer 8300.

Figure 27B:
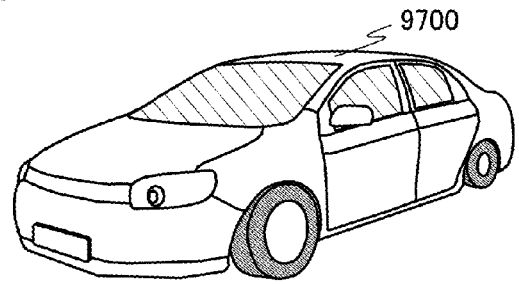
Figure 27C:
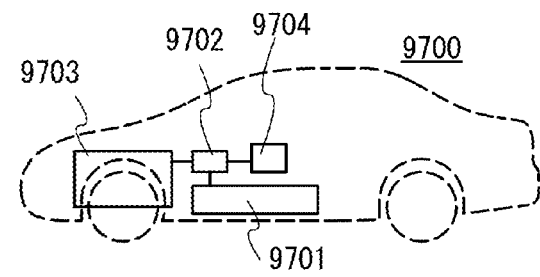

FIGS. 27B and 27C illustrate an example of an electric vehicle. An electric vehicle 9700 is equipped with a secondary battery 9701. The output of the electric power of the secondary battery 9701 is adjusted by a control circuit 9702 and the electric power is supplied to a driving device 9703. The control circuit 9702 is controlled by a processing unit 9704 including a ROM, a RAM, a CPU, or the like which is not illustrated. A CPU that uses any of the above transistors can save the power of the electric vehicle 9700.

The driving device 9703 includes a DC motor or an AC motor either alone or in combination with an internal-combustion engine. The processing unit 9704 outputs a control signal to the control circuit 9702 on the basis of input data such as data of operation (e.g., acceleration, deceleration, or stop) by a driver or data during driving (e.g., data on an upgrade or a downgrade, or data on a load on a driving wheel) of the electric vehicle 9700. The control circuit 9702 adjusts the electric energy supplied from the secondary battery 9701 in accordance with the control signal of the processing unit 9704 to control the output of the driving device 9703. In the case where the AC motor is mounted, although not illustrated, an inverter which converts a direct current into an alternate current is also incorporated.

This embodiment can be combined with any of the other embodiments disclosed in this specification as appropriate.

Example 1

In this example, the density of localized levels of a multilayer film including an oxide semiconductor film was estimated by a constant photocurrent method (CPM).

First, a structure of Sample 1 which was subjected to CPM measurement and a fabrication method thereof are described.

Figure 28:
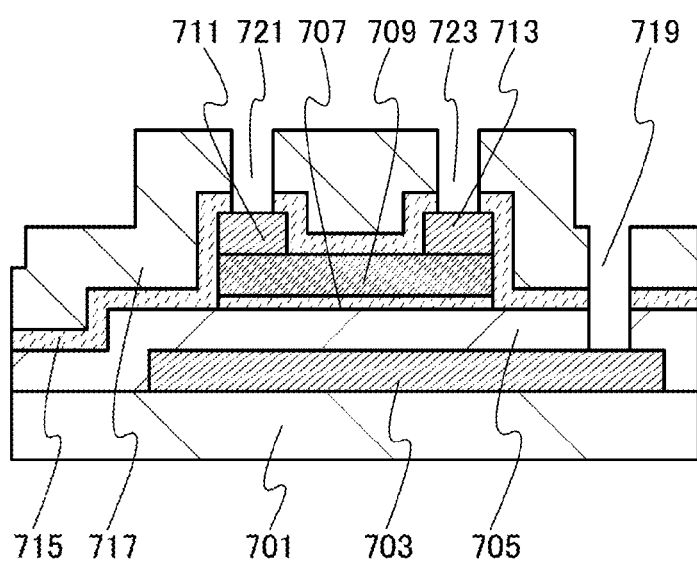
FIG. 28 is a diagram illustrating a structure of a sample.

The structure of Sample 1 is described with reference to FIG. 28. In Sample 1, an electrode 703 is provided over a glass substrate 701, and an insulating film 705 is provided over the electrode 703. An oxide film 707 is provided over the insulating film 705, and an oxide semiconductor film 709 is provided over the oxide film 707. A pair of electrodes 711 and 713 is provided over the oxide semiconductor film 709, an oxide film 715 is provided over the oxide semiconductor film 709, and an insulating film 717 is provided over the oxide film 715.

Further, through an opening 721 formed in the oxide film 715 and the insulating film 717, the electrode 711 is exposed. Through an opening 723 formed in the oxide film 715 and the insulating film 717, the electrode 713 is exposed. Through an opening 719 formed in the insulating film 705, the oxide film 715, and the insulating film 717, the electrode 703 is exposed.

Next, a method for fabricating Sample 1 is described.

A 100-nm-thick tungsten film was formed over the glass substrate 701 by a sputtering method, and then with use of a mask formed by a photolithography process, the tungsten film was etched, so that the electrode 703 was formed.

The insulating film 705 was formed over the glass substrate 701 and the electrode 703. In this case, as the insulating film 705, a 100-nm-thick silicon oxynitride film was formed by a CVD method.

Over the insulating film 705, an oxide film was formed by a sputtering method. In this case, with use of a target of an In—Ga—Zn oxide (In:Ga:Zn=1:3:2 [atomic ratio]), a 30-nm-thick In—Ga—Zn oxide was formed by a sputtering method. Note that an argon gas (flow rate: 30 sccm) and an oxygen gas (flow rate: 15 sccm) were used as a deposition gas, the pressure was set to be 0.4 Pa, the substrate temperature was set to be 200° C., and a DC power of 0.5 kW was applied.

Next, oxygen was added to the oxide film by an ion implantation method. Oxygen ions were added with a dose of $1\times10^{16}/cm^2$ to the oxide film at an accelerating voltage of 5 keV.

Next, an oxide semiconductor film was formed over the oxide film by a sputtering method. In this case, with use of a target of an In—Ga—Zn oxide (In:Ga:Zn=1:1:1 [atomic ratio]), a 100-nm-thick In—Ga—Zn oxide was formed by a sputtering method. Note that an argon gas (flow rate: 30 sccm) and an oxygen gas (flow rate: 15 sccm) were used as a deposition gas, the pressure was set to be 0.4 Pa, the substrate temperature was set to be 300° C., and a DC power of 0.5 kW was applied.

Next, after a mask was formed over the oxide semiconductor film by a photolithography process, the oxide film and the oxide semiconductor film were etched, so that the oxide film 707 and the oxide semiconductor film 709 were formed.

Next, heat treatment was performed to make part of oxygen in the oxide film 707 transfer to the oxide semiconductor film 709, so that the number of oxygen vacancies in the oxide semiconductor film 709 was reduced. In this case, after heat treatment performed at 450° C. for 1 hour in a nitrogen atmosphere, heat treatment was performed at 450° C. for 1 hour in a dry-air atmosphere.

Next, the pair of electrodes 711 and 713 was formed over the oxide semiconductor film 709. In this case, a 100-nm-thick tungsten film was formed by a sputtering method, and then with use of a mask formed by a photolithography process, the tungsten film was etched, so that the pair of electrodes 711 and 713 was formed.

Next, the oxide film 715 was formed over the insulating film 705, the oxide film 707, the oxide semiconductor film 709, and the pair of electrodes 711 and 713, and then the insulating film 717 was formed by a CVD method.

As the oxide film 715, a 30-nm-thick In—Ga—Zn oxide was formed by a sputtering method with use of a target of an In—Ga—Zn oxide (In:Ga:Zn=1:3:2 [atomic ratio]). Note that an argon gas (flow rate: 30 sccm) and an oxygen gas (flow rate: 15 sccm) were used as a deposition gas, the pressure was set to be 0.4 Pa, the substrate temperature was set to be 200° C., and a DC power of 0.5 kW was applied.

In this case, as the insulating film 717, a 300-nm-thick silicon oxide film was formed by a sputtering method.

Next, heat treatment was performed. Here, the heat treatment was performed at 300° C. for 1 hour in a dry-air atmosphere.

Then, a mask was formed over the insulating film 717 by a photolithography process. The insulating film 705, the oxide film 715, and the insulating film 717 were partly etched, so that the openings 719, 721, and 723 were formed, and the electrode 703 and the pair of electrodes 711 and 713 were exposed.

Through the above steps, Sample 1 was fabricated.

Figure 29A:
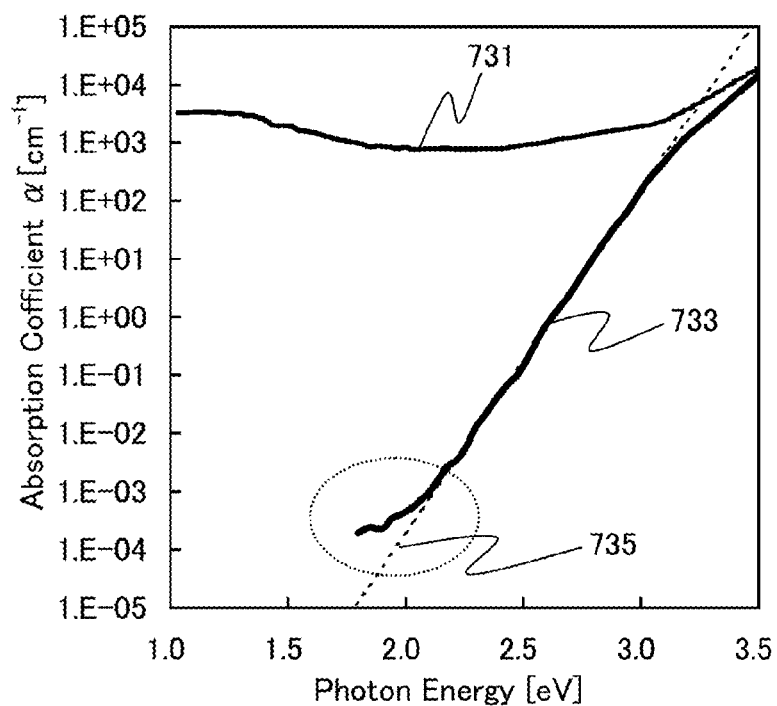
FIGS. 29A and 29B are graphs showing results of CPM measurement.
Figure 29B:
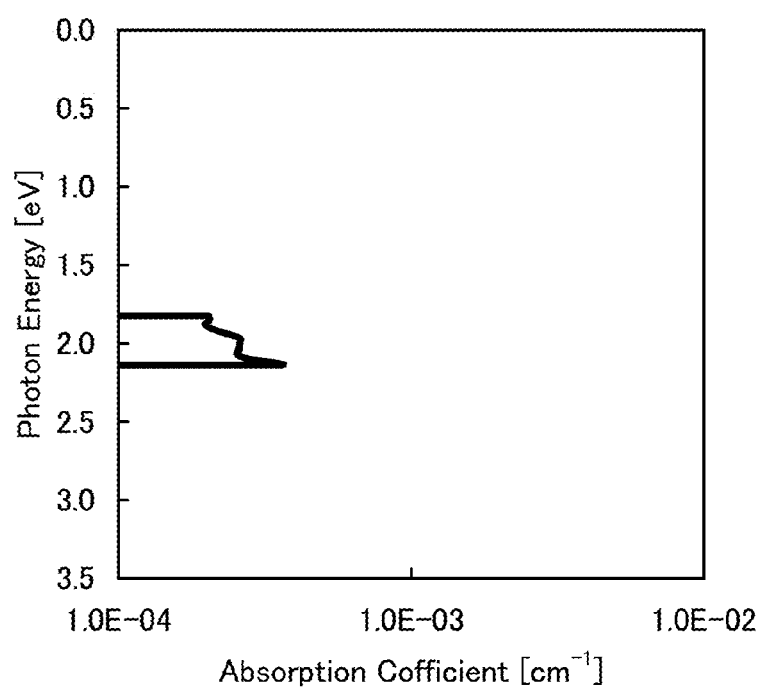

Next, CPM measurement was performed on Sample 1. CPM measurement is carried out in such a manner that the amount of light with which a sample surface between the pair of electrodes is irradiated is adjusted in a state where voltage is applied between the pair of electrodes 711 and 713 in contact with the oxide semiconductor film 709 in the sample so that a photocurrent value is kept constant, and an absorption coefficient is derived from the amount of irradiation light at each wavelength. In the CPM measurement, when the measurement object has a defect, the absorption coefficient at energy which corresponds to a level at which the defect exists (calculated from a wavelength) is increased. By multiplying an increase in the absorption coefficient by a constant, the defect density of the measurement object can be obtained. FIG. 29A shows measurement results of Sample 1. A curve 733 represents the absorption coefficient curve of the sample, a curve 731 represents the absorption coefficient measured optically with a spectrophotometer, and a thin dashed line 735 represents a tangent of the curve 733. The integral value of the absorption coefficient in an energy range surrounded by a dashed-line circle in FIG. 29A was derived in such a manner that the absorption coefficient at an Urbach tail (the thin dashed line 735) was subtracted from the absorption coefficient (the curve 731) measured by CPM. The derivation result of the integral value is shown in FIG. 29B.

In FIG. 29A, the horizontal axis indicates the photon energy, and the vertical axis indicates the absorption coefficient. In FIG. 29B, the horizontal axis indicates the absorption coefficient, and the vertical axis indicates the photon energy. The bottom of the conduction band and the top of the valence band of the oxide semiconductor film are set to 0 eV and 3.15 eV, respectively, on the vertical axis in FIG. 29B. Further, in FIG. 29B, the curve indicated by a solid line corresponds to the localized levels of Sample 1, and absorption due to the localized levels was observed in an energy range from 1.5 eV to 2.3 eV, inclusive. When the values at each energy level are integrated, it was found that the absorption coefficient due to the localized levels of Sample 1 was $4.36 \times 10^{-5}$/cm.

The localized levels observed in this example are supposed to be derived from impurities or defects. From the above, it is found that the oxide film 707 and the oxide semiconductor film 709 have extremely low density of levels derived from impurities or defects. In other words, when a transistor is manufactured using the oxide film 707 and the oxide semiconductor film 709, the on-state current of the transistor can be increased, and the field-effect mobility can also be increased. In addition, a highly reliable transistor in which a variation in electric characteristics with time or a variation in electric characteristics due to a stress test is small can be manufactured.

Example 2

In this example, the numbers of hydrogen molecules, water molecules, and oxygen molecules released by heating from the oxide film to which oxygen is added were estimated, and the results thereof will be described.

First, a method for fabricating evaluated samples is described. The fabricated samples are Sample 2 to Sample 6.

Methods for fabricating Sample 2 and Sample 3 are described.

A silicon wafer was used as the substrate. The substrate was heated at 950° C. in an oxygen atmosphere containing hydrogen chloride, so that a 100-nm-thick silicon oxide film including chlorine was formed over a surface of the substrate.

Next, a 300-nm-thick silicon oxynitride film was formed over the silicon oxide film including chlorine by a CVD method. Then, a surface of the silicon oxynitride film was planarized by CMP treatment.

Next, a 30-nm-thick In—Ga—Zn-based oxide film was formed as the oxide film by a sputtering method. In this case, a target (In:Ga:Zn=1:3:2 [atomic ratio]) was used, and an argon gas (flow rate: 30 sccm) and an oxygen gas (flow rate: 15 sccm) were used as a sputtering gas. The sputtering gas was introduced to a chamber at a pressure of 0.4 Pa, the substrate temperature was set to be 200° C., and a DC power of 0.5 kW was applied.

Through the above steps, Sample 2 was fabricated.

Next, oxygen was added to the oxide film included in Sample 2, so that an oxide film to which oxygen is added was formed. In this case, oxygen ions were added with a dose of $1 \times 10^{16}$/cm$^2$ to the oxide film by an ion implantation method at an accelerating voltage of 5 keV.

Through the above steps, the sample 3 was fabricated.

The film density of the oxide film in each of Sample 2 and Sample 3 was measured by an X-ray reflectmetry (XRR) analysis method, whereby the film density of Sample 2 was 5.8 g/cm$^3$, and the film density of Sample 3 was 5.6 g/cm$^3$. From the above, it is found that the film density is reduced by addition of oxygen to the oxide semiconductor film.

Figure 30A:
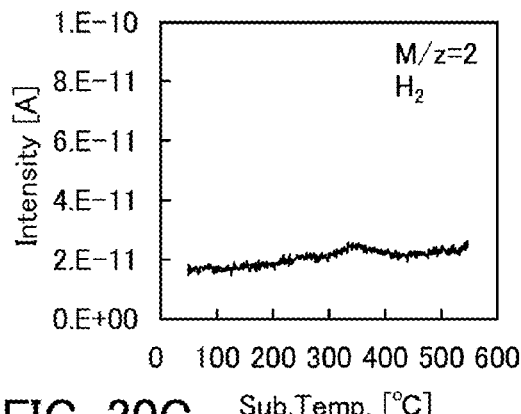
FIGS. 30A to 30F are graphs showing results of TDS measurement.
Figure 30C:
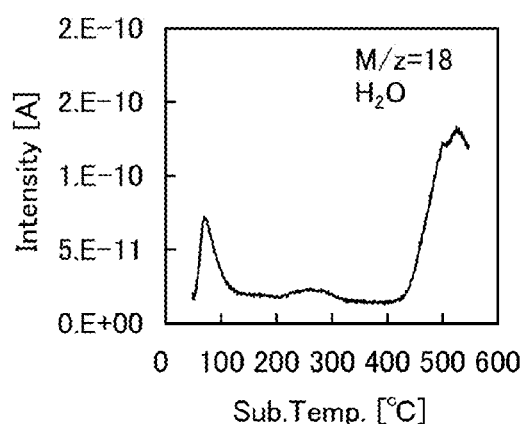
Figure 30E:
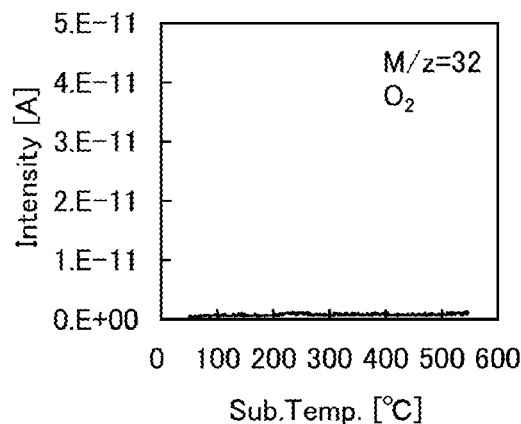
Figure 30B:
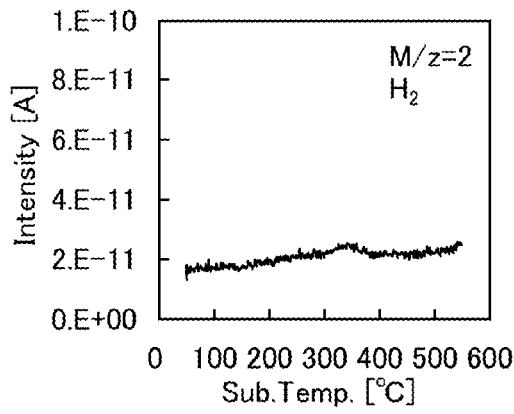
Figure 30D:
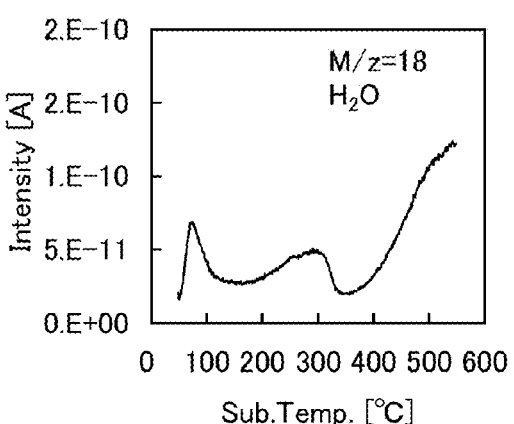
Figure 30F:
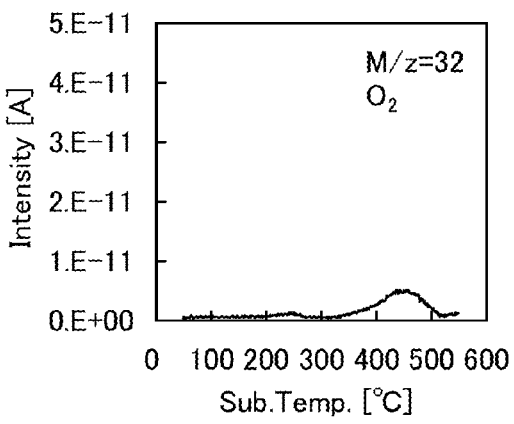

Next, Sample 2 and Sample 3 were subjected to TDS analysis. FIGS. 30A and 30B show the number of hydrogen molecules released from Sample 2 and Sample 3 with respect to the substrate temperature. FIGS. 30C and 30D show the number of water molecules released with respect to the substrate temperature. FIGS. 30E and 30F show the number of oxygen molecules released with respect to the substrate temperature.

According to FIGS. 30A and 30B, Sample 2 and Sample 3 show a similar tendency as for the number of released hydrogen molecules. According to FIGS. 30C and 30D, the number of water molecules released at around 300° C. in Sample 3 is large as compared with that in Sample 2. According to FIGS. 30E and 30F, oxygen is not released from the oxide film in Sample 2 even when the substrate was heated, whereas oxygen molecules are released within a temperature range from 350° C. to 510° C. inclusive in Sample 3.

The total number of molecules released to the outside corresponds to the integral value of a curve representing the TDS analysis results. Thus, the total number of oxygen molecules released to the outside was calculated, and the results were as follows: $6.8 \times 10^{13}$ molecules/cm' (Sample 2) and $2.1 \times 10^{14}$ molecules/cm$^2$ (Sample 3).

From the above, it is found that heat treatment is performed after oxygen is added to the oxide film, whereby oxygen is released from the oxide film.

Next, Sample 4 was fabricated in such a manner that after oxygen was added to the 300-nm-thick silicon oxynitride film formed over the substrate in Sample 2, an oxide film was formed over the silicon oxynitride film.

In addition, Sample 5 was fabricated in such a manner that after oxygen was added to the 300-nm-thick silicon oxynitride film formed over the substrate in Sample 3, an oxide film was formed over the silicon oxynitride film.

In this case, oxygen ions were added with a dose of $2 \times 10^{16}$/cm$^2$ to each of the silicon oxynitride films by an ion implantation method at an accelerating voltage of 60 keV.

Figure 31A:
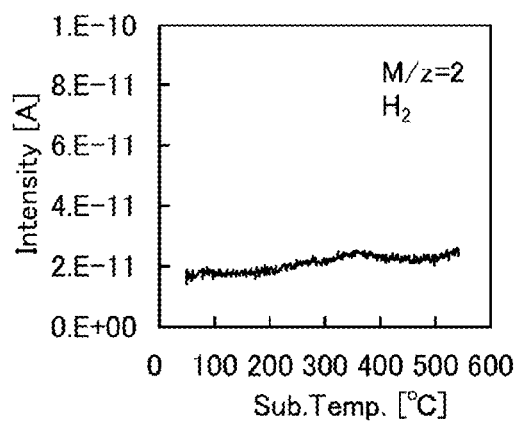
FIGS. 31A to 31F are graphs showing results of TDS measurement.
Figure 31B:
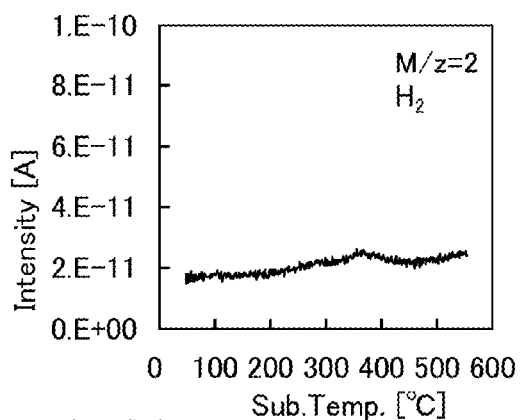
Figure 31C:
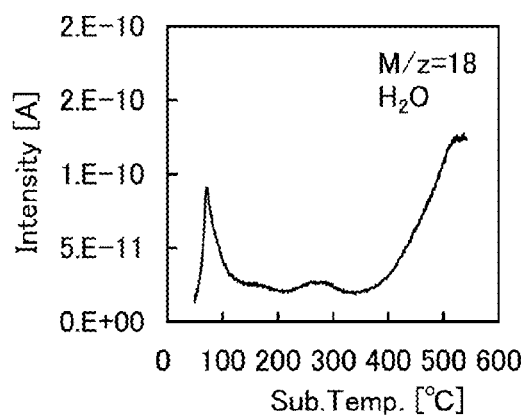
Figure 31D:
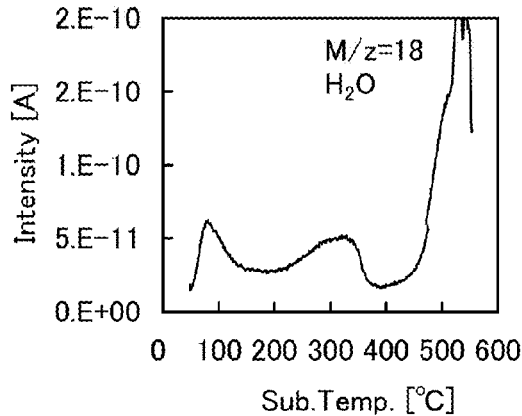
Figure 31E:
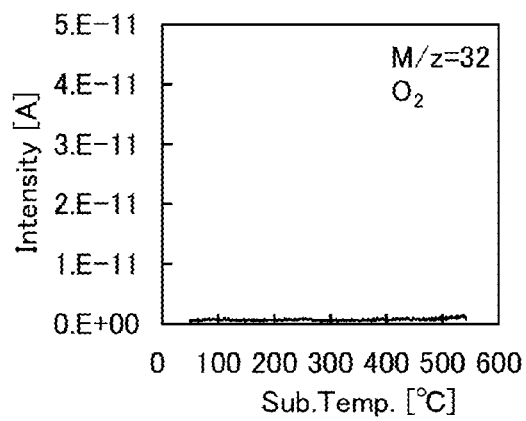
Figure 31F:
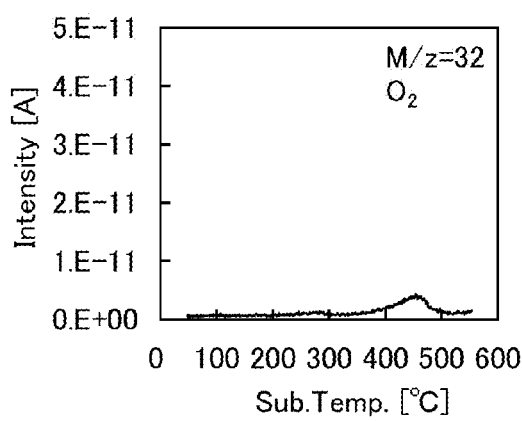

Next, Sample 4 and Sample 5 were subjected to TDS analysis. FIGS. 31A and 31B show the number of hydrogen molecules released from Sample 4 and Sample 5 with respect to the substrate temperature. FIGS. 31C and 31D show the number of water molecules released with respect to the substrate temperature. FIGS. 31E and 31F show the number of oxygen molecules released with respect to the substrate temperature.

According to FIGS. 31A and 31B, Sample 4 and Sample 5 show a similar tendency as for the number of released hydrogen molecules. According to FIGS. 31C and 31D, the number of water molecules released at around 300° C. in Sample 5 is large as compared with that in Sample 4. According to FIGS. 31E and 31F, oxygen is not released from the oxide film in Sample 4 even when the substrate was heated, whereas oxygen molecules are released within a range higher than or equal to 350° C. and lower than or equal to 510° C. in Sample 5.

The total number of oxygen molecules released to the outside was calculated, and the results were as follows: $5.9 \times 10^{13}$ molecules/cm$^2$ (Sample 4) and $1.7 \times 10^{14}$ molecules/cm$^2$ (Sample 5).

From the above, it is found that heat treatment is performed after oxygen is added to the oxide film, whereby oxygen is released from the oxide film. Further, by comparison of FIG. 30F with FIG. 31F, it is found that the numbers of released oxygen molecules are equivalent to each other; thus, the number of oxygen molecules released from the silicon oxynitride film to which oxygen is added is small, and the oxygen molecules are released mainly from the oxide film.

Note that Sample 6 was fabricated in such a manner that a silicon oxynitride film was formed over the substrate and oxygen was added to the silicon oxynitride film. In other words, Sample 6 has a structure of Sample 4 without the oxide film.

Figure 32A:
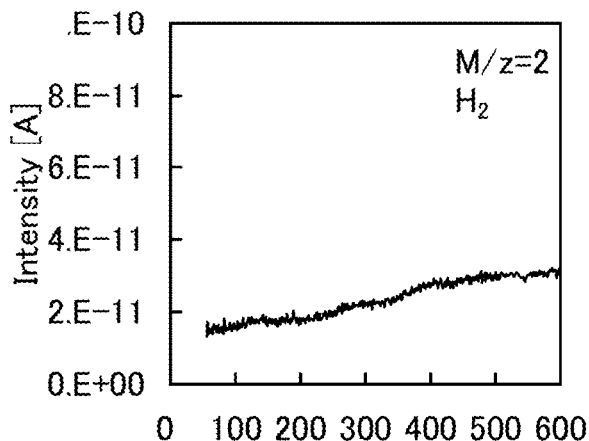
FIGS. 32A to 32C are graphs showing results of TDS measurement.
Figure 32B:
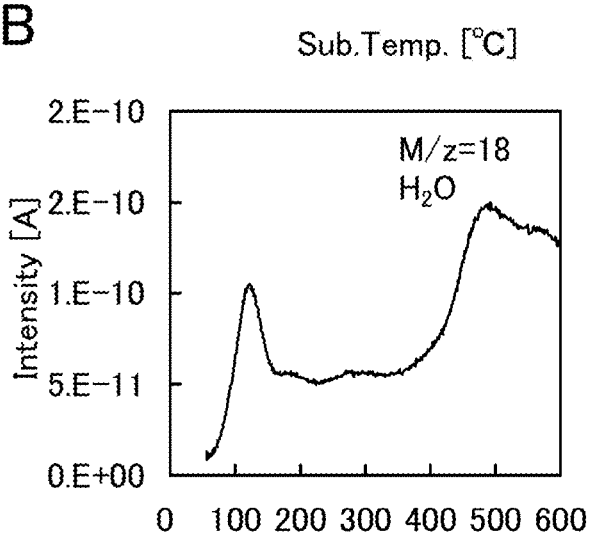
Figure 32C:
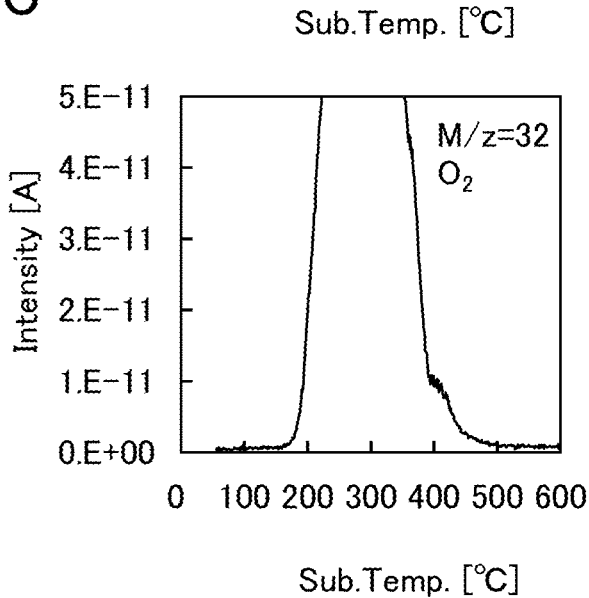

Next, Sample 6 was subjected to TDS analysis. FIG. 32A shows the number of hydrogen molecules released from Sample 6 with respect to the substrate temperature. FIG. 32B shows the number of water molecules released with respect to the substrate temperature. FIG. 32C shows the number of oxygen molecules released with respect to the substrate temperature.

The total number of oxygen molecules released to the outside was calculated. The result of Sample 6 was $9.2 \times 10^{15}$ molecules/cm$^2$.

As shown in FIGS. 32B and 32C, it is found that the number of released water molecules and the number of released oxygen molecules in Sample 6 are large as compared with those in Sample 2 to Sample 5. From the above, the oxide film formed over the silicon oxynitride film in each of Sample 2 to Sample 5 has a blocking effect of preventing a release of water molecules and oxygen molecules.

Example 3

In this example, a state where oxygen in a multilayer film diffuses after heat treatment at 350° C. or 450° C. will be described with reference to FIGS. 33A to 33C.

Samples in each of which any of films in the multilayer film was deposited with use of an $^{18}O_2$ gas were fabricated. SIMS was performed on the samples, and the distribution concentration of the $^{18}O$ in the depth direction was measured. FIGS. 33A to 33C show the measurement results.

In this case, an oxide film 801a was formed with use of a target of an In—Ga—Zn oxide (In:Ga:Zn=1:1:1 [atomic ratio]) by a sputtering method.

Further, an oxide semiconductor film 801b was formed with use of a target of an In—Ga—Zn oxide (In:Ga:Zn=3:1:2 [atomic ratio]) by a sputtering method.

Furthermore, an oxide film 801c was formed with use of a target of an In—Ga—Zn oxide (In:Ga:Zn=1:1:1 [atomic ratio]) by a sputtering method.

Figure 33A:
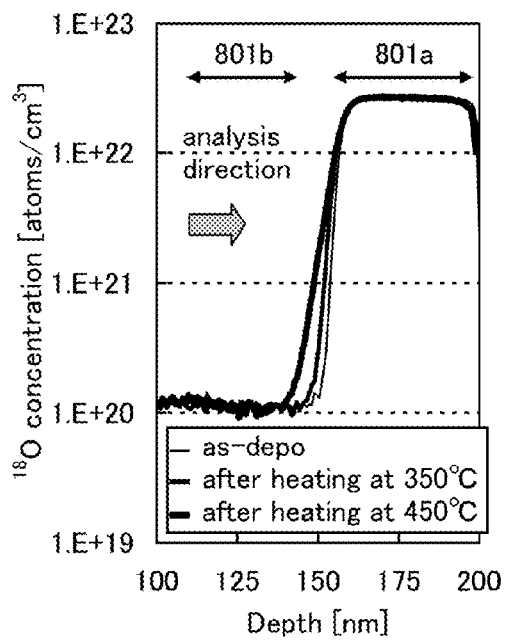
FIGS. 33A to 33C are graphs showing diffusion of oxygen in a multilayer film according to one embodiment of the present invention.

FIG. 33A shows the concentration distribution of $^{18}O$ in the depth direction, which includes an interface between the oxide film 801a and the oxide semiconductor film 801b. In the sample of FIG. 33A, an $^{18}O_2$ gas was used for formation of the oxide film 801a and the $^{18}O_2$ gas was not used for the other films. As compared with the case where heat treatment was not performed (represented as "as-depo"; thin solid line), in the case of performing heat treatment at 350° C. (represented as "after heating at 350° C."; solid line) and the case of performing heat treatment at 450° C. (represented as "after heating at 450° C."; thick solid line), the $^{18}O$ further diffuses from the oxide film 801a to the oxide semiconductor film 801b.

Figure 33B:
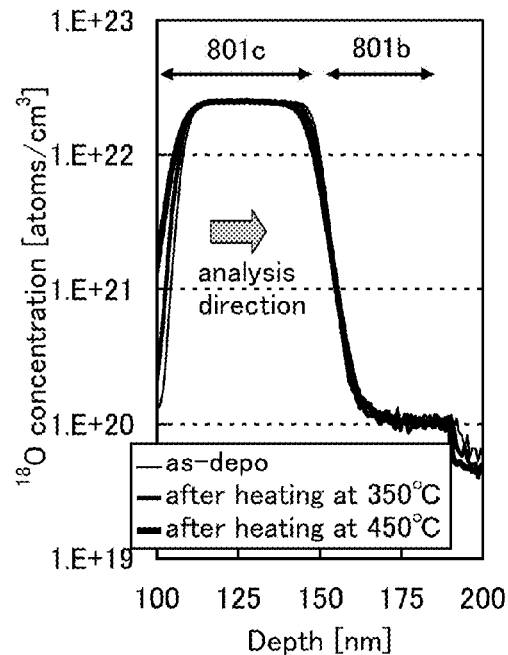

FIG. 33B shows the distribution of $^{18}O$ concentration in the depth direction, which includes an interface between the oxide semiconductor film 801b and the oxide film 801c. In the sample of FIG. 33B, an $^{18}O_2$ gas was used for formation of the oxide semiconductor film 801b, and an $^{18}O_2$ gas was not used for the other layers. As compared with the case where heat treatment was not performed (represented as "as-depo"; thin solid line), in the case of performing heat treatment at 350° C. (represented as "after heating at 350° C."; solid line) and the case of performing heat treatment at 450° C. (represented as "after heating at 450° C."; thick solid line), the $^{18}O$ further diffuses from the oxide semiconductor film 801b to the oxide film 801c.

Figure 33C:
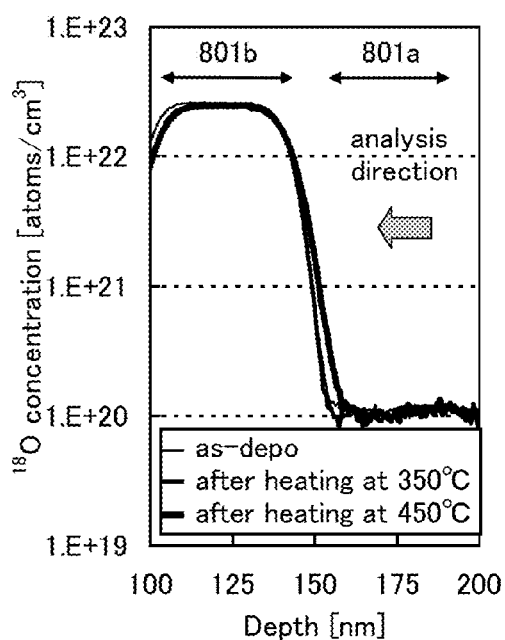

FIG. 33C shows the concentration distribution of $^{18}O$ in the depth direction, which includes an interface between the oxide film 801a and the oxide semiconductor film 801b. In the sample of FIG. 33C, an $^{18}O_2$ gas was used for formation of the oxide semiconductor film 801b, and an $^{18}O_2$ gas was not used for the other layers. As compared with the case where heat treatment was not performed (represented as "as-depo"; thin solid line) and the case of performing heat treatment at 350° C. (represented as "after heating at 350° C."; solid line), in the case of performing heat treatment at 450° C. (represented as "after heating at 450° C."; thick solid line), $^{18}O$ further diffuses from the oxide semiconductor film 801b to the oxide film 801a.

As shown in FIGS. 33A to 33C, oxygen mutually diffuses in the multilayer film.

Example 4

In this example, the concentration of silicon contained in a multilayer film in a transistor which is one embodiment of the present invention will be described. Here, results obtained by estimating the multilayer film with SIMS are described.

First, samples subjected to SIMS measurement are described.

The multilayer film was formed as follows: a 10-nm-thick oxide film 81 was formed over a silicon wafer; a 10-nm-thick oxide semiconductor film 82 was formed over the oxide film 81; and a 10-nm-thick oxide film 83 was formed over the oxide semiconductor film 82.

In this example, the oxide film 81 was an oxide film formed by a sputtering method with use of a target of an In—Ga—Zn oxide (In:Ga:Zn=1:3:2 [atomic ratio]). Note that an argon gas (flow rate: 30 sccm) and an oxygen gas (flow rate: 15 sccm) were used as a deposition gas, the pressure was set to be 0.4 Pa, the substrate temperature was set to be 200° C., and a DC power of 0.5 kW was applied.

Further, the oxide semiconductor film 82 was an oxide semiconductor film formed by a sputtering method with use of a target of an In—Ga—Zn oxide (In:Ga:Zn=1:1:1 [atomic ratio]). Note that an argon gas (flow rate: 30 sccm) and an oxygen gas (flow rate: 15 sccm) were used as a deposition gas, the pressure was set to be 0.4 Pa, the substrate temperature was set to be 300° C., and a DC power of 0.5 kW was applied.

Further, the oxide film 83 was an oxide film formed by a sputtering method with use of a target of an In—Ga—Zn oxide (In:Ga:Zn=1:3:2 [atomic ratio]). Note that an argon gas (flow rate: 30 sccm) and an oxygen gas (flow rate: 15 sccm) were used as a deposition gas, the pressure was set to be 0.4 Pa, the substrate temperature was set to be 200° C., and a DC power of 0.5 kW was applied.

A sample which was not subjected to heat treatment and a sample which was subjected to heat treatment performed at 450° C. for 2 hours after the multilayer film was formed were prepared. The sample which was not subjected to heat treatment is Sample 7, and the sample which was subjected to heat treatment is Sample 8.

Figure 34A:
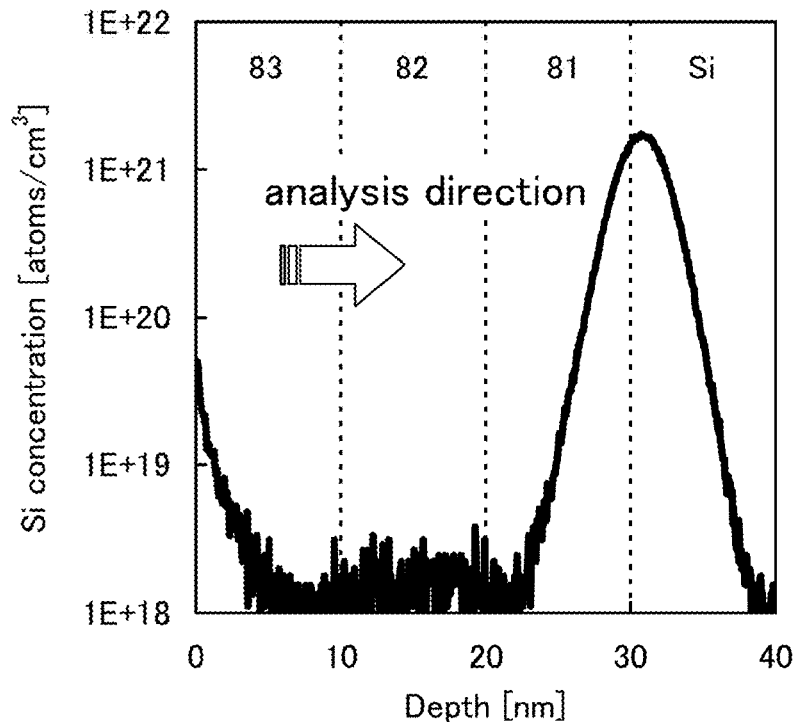
FIGS. 34A and 34B are graphs showing results of TOF-SIMS analysis of a multilayer film included in a transistor.

With respect to Sample 7 and Sample 8, time-of-flight secondary ion mass spectroscopy (TOF-SIMS) was performed, whereby the concentrations of Si [atoms/cm$^3$] in the depth direction were measured. FIG. 34A shows the concentration of Si converted from the secondary ion intensity of SiO$_3$ [atoms/cm$^3$] in the depth direction in the multilayer film in Sample 7, and FIG. 34B shows the concentration of Si converted from the secondary ion intensity of SiO$_3$ [atoms/cm$^3$] in the depth direction in the multilayer film in Sample 8.

Figure 34B:
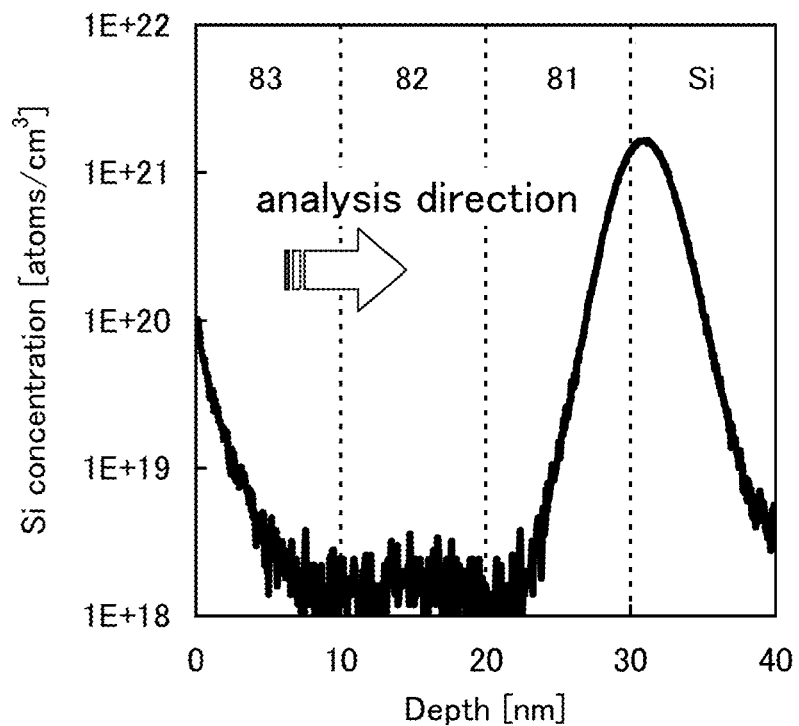

According to FIGS. 34A and 34B, the interface between the silicon wafer and the oxide film 81 and the top surface of the oxide film 83 have higher concentration of Si. The Si concentration in the oxide semiconductor film 82 was about 1×10$^{18}$ atoms/cm$^3$ which is the lower limit of detection of TOF-SIMS. This is probably because, owing to existence of the oxide film 81 and the oxide film 83, the oxide semiconductor film 82 is not influenced by silicon caused by the silicon wafer or surface contamination.

From the results shown in FIGS. 34A and 34B, it is found that silicon diffusion is less likely to occur by heat treatment, and silicon is mixed mainly at the time of film formation.

As described above, with use of the multilayer film described in this example, a transistor with stable electric characteristics can be manufactured.

This application is based on Japanese Patent Application serial no. 2012-264592 filed with Japan Patent Office on Dec. 3, 2012, the entire contents of which are hereby incorporated by reference.

What is claimed is:

1. A semiconductor device comprising:
   an oxide semiconductor layer;
   a source electrode over the oxide semiconductor layer;
   a drain electrode over the oxide semiconductor layer;
   an oxide layer over the source electrode and the drain electrode, wherein the oxide layer is in contact with a portion of the oxide semiconductor layer, the portion being between the source electrode and the drain electrode;
   a gate insulating layer over the oxide layer; and
   a gate electrode over the gate insulating layer,
   wherein the oxide semiconductor layer includes a first n-type region below the source electrode and a second n-type region below the drain electrode,
   wherein an upper surface of the oxide semiconductor layer between the source electrode and the drain electrode is etched, and
   wherein the oxide layer is in contact with the first n-type region and the second n-type region.

2. The semiconductor device according to claim 1, wherein a metal element of the source electrode and the drain electrode is contained in the first n-type region and the second n-type region.

3. The semiconductor device according to claim 1, wherein each of the source electrode and the drain electrode has a tapered shape.

4. The semiconductor device according to claim 1, wherein an end portion of the oxide layer and an end portion of the gate insulating layer are coplanar.

5. The semiconductor device according to claim 1,
   wherein the first n-type region comprises a first region and a second region, and
   wherein a thickness of the first region is smaller than a thickness of the second region.

6. The semiconductor device according to claim 1, wherein the gate electrode has a multi-layered structure.

7. A semiconductor device comprising:
   an oxide semiconductor layer;
   a source electrode over the oxide semiconductor layer;
   a drain electrode over the oxide semiconductor layer;
   an oxide layer over the source electrode and the drain electrode, wherein the oxide layer is in contact with a portion of the oxide semiconductor layer, the portion being between the source electrode and the drain electrode;
   a gate insulating layer over the oxide layer; and
   a gate electrode over the gate insulating layer,
   wherein the oxide semiconductor layer includes a first n-type region below the source electrode and a second n-type region below the drain electrode,
   wherein an upper surface of the oxide semiconductor layer between the source electrode and the drain electrode is etched,
   wherein the oxide layer is in contact with the first n-type region and the second n-type region,
   wherein each of the source electrode and the drain electrode comprises a first conductive layer and a second conductive layer,
   wherein the second conductive layer is provided on the first conductive layer, and
   wherein the second conductive layer extends beyond an inner side edge of the first conductive layer.

8. The semiconductor device according to claim 7, wherein an end portion of the oxide layer and an end portion of the gate insulating layer are coplanar.

9. The semiconductor device according to claim 7,
   wherein the first n-type region comprises a first region and a second region, and
   wherein a thickness of the first region is smaller than a thickness of the second region.

10. The semiconductor device according to claim 7, wherein the gate electrode has a multi-layered structure.

11. A semiconductor device comprising:
    an oxide semiconductor layer;
    a source electrode over the oxide semiconductor layer;
    a drain electrode over the oxide semiconductor layer;
    an oxide layer over the source electrode and the drain electrode, wherein the oxide layer is in contact with a portion of the oxide semiconductor layer, the portion being between the source electrode and the drain electrode;
    a gate insulating layer over the oxide layer; and
    a gate electrode over the gate insulating layer,
    wherein the oxide semiconductor layer includes a first n-type region below the source electrode and a second n-type region below the drain electrode, wherein an upper surface of the oxide semiconductor layer between the source electrode and the drain electrode is etched, wherein the oxide layer is in contact with the first n-type region and the second n-type region, and wherein each of the source electrode and the drain electrode comprises a metal nitride layer in contact with the oxide semiconductor layer.

12. The semiconductor device according to claim 11, wherein a metal element of the source electrode and the drain electrode is contained in the first n-type region and the second n-type region.

13. The semiconductor device according to claim 11, wherein each of the source electrode and the drain electrode has a tapered shape.

14. The semiconductor device according to claim 11, wherein an end portion of the oxide layer and an end portion of the gate insulating layer are coplanar.

15. The semiconductor device according to claim 11,
wherein the first n-type region comprises a first region and a second region, and
wherein a thickness of the first region is smaller than a thickness of the second region.

16. The semiconductor device according to claim 11, wherein the gate electrode has a multi-layered structure.

* * * * *